US 8,176,186 B2

United States Patent
McCanne et al.

(10) Patent No.: US 8,176,186 B2
(45) Date of Patent: May 8, 2012

(54) TRANSACTION ACCELERATOR FOR CLIENT-SERVER COMMUNICATIONS SYSTEMS

(75) Inventors: Steven McCanne, Berkeley, CA (US); Michael J. Demmer, San Francisco, CA (US); Arvind Jain, Santa Clara, CA (US); David Tze-Si Wu, Fremont, CA (US); Alfred Landrum, San Francisco, CA (US)

(73) Assignee: Riverbed Technology, Inc., San Francisco, CA (US)

( * ) Notice: Subject to any disclaimer, the term of this patent is extended or adjusted under 35 U.S.C. 154(b) by 628 days.

(21) Appl. No.: 12/191,514

(22) Filed: Aug. 14, 2008

(65) Prior Publication Data

US 2008/0320151 A1    Dec. 25, 2008

Related U.S. Application Data

(63) Continuation of application No. 11/508,531, filed on Aug. 22, 2006, now Pat. No. 7,477,166, and a continuation-in-part of application No. 11/229,016, filed on Sep. 15, 2005, now Pat. No. 7,428,573, and a continuation-in-part of application No. 10/640,405, filed on Aug. 12, 2003, said application No. 11/508,531 is a continuation of application No. 11/223,789, filed on Sep. 8, 2005, now Pat. No. 7,116,249, and a continuation-in-part of application No. 10/285,315, filed on Oct. 30, 2002, now Pat. No. 7,120,666, said application No. 11/223,789 is a continuation of application No. 10/968,868, filed on Oct. 18, 2004, now Pat. No. 6,961,009, which is a continuation of application No. 10/731,687, filed on Dec. 8, 2003, now Pat. No. 6,828,925, which is a continuation of application No. 10/285,330, filed on Oct. 30, 2002, now Pat. No. 6,667,700.

(60) Provisional application No. 60/462,990, filed on Apr. 14, 2003.

(51) Int. Cl.
*G06F 15/16* (2006.01)
(52) U.S. Cl. .................... 709/228; 709/233; 709/236
(58) Field of Classification Search .......... 709/200–203, 709/217–228, 233, 236
See application file for complete search history.

(56) References Cited

U.S. PATENT DOCUMENTS 4,377,803 A    3/1983    Lotspiech et al.
(Continued)

FOREIGN PATENT DOCUMENTS

EP    0813326 A2    12/1997
(Continued)

OTHER PUBLICATIONS

Knutsson Bjorn et al., "Transparent Proxy Signalling," 1999, *Department of Information Technology: Department of Computer Systems*, Journal of Communications and Networks, vol. 3, No. 2, University of Uppsala, Uppsala, Sweden, pp. 164-174.
(Continued)

*Primary Examiner* — Moustafa M Meky
(74) *Attorney, Agent, or Firm* — Kilpatrick Townsend & Stockton LLP

(57) ABSTRACT

Self-discovering transaction accelerators improve communications between a client and a server. A client directs a message to a server. A client-side transaction accelerator intercepts the message, terminates the connection with the client, and accelerates the request by replacing segments of data with references. The accelerated request is forwarded to a server-side transaction accelerator through a new connection. The server-side transaction accelerator reconstructs the message by replacing the reference with segment data in a persistent segment store accessible to the server-side transaction accelerator. The reconstructed request is then provided to the server. Accelerations may occur in any direction of communication. Persistent segment stores can be pre-populated with segment data from other transaction accelerators and anticipated transactions. The persistent segment store can store segments that are data segmented based on content of the data and can be independent of transaction protocol, application, and device.

8 Claims, 39 Drawing Sheets

U.S. PATENT DOCUMENTS

| | | |
|---|---|---|
| 4,641,274 A | 2/1987 | Swank |
| 4,988,998 A | 1/1991 | O'Brien |
| 5,371,852 A | 12/1994 | Attanasio et al. |
| 5,414,850 A | 5/1995 | Whiting |
| 5,737,594 A | 4/1998 | Williams |
| 5,754,774 A | 5/1998 | Bittinger et al. |
| 5,771,355 A | 6/1998 | Kuzma |
| 5,822,746 A | 10/1998 | Williams |
| 5,838,963 A | 11/1998 | Griffiths |
| 5,867,661 A | 2/1999 | Bittinger et al. |
| 5,903,723 A | 5/1999 | Beck et al. |
| 5,931,913 A | 8/1999 | Meriwether et al. |
| 5,977,890 A | 11/1999 | Rigoutsos et al. |
| 5,990,810 A | 11/1999 | Williams |
| 5,999,949 A | 12/1999 | Crandall |
| 6,009,462 A | 12/1999 | Birrell et al. |
| 6,076,084 A | 6/2000 | Harlan |
| 6,163,811 A | 12/2000 | Porter |
| 6,178,461 B1 | 1/2001 | Chan et al. |
| 6,219,642 B1 | 4/2001 | Asghar et al. |
| 6,233,253 B1 | 5/2001 | Settle et al. |
| 6,301,376 B1 | 10/2001 | Draganoff |
| 6,333,932 B1 | 12/2001 | Kobayasi et al. |
| 6,341,171 B1 | 1/2002 | De Lanauze |
| 6,369,723 B1 | 4/2002 | Pieterse et al. |
| 6,397,253 B1 | 5/2002 | Quinlan et al. |
| 6,415,329 B1 | 7/2002 | Gelman et al. |
| 6,449,658 B1 | 9/2002 | Lafe et al. |
| 6,452,915 B1 | 9/2002 | Jorgensen |
| 6,546,428 B2* | 4/2003 | Baber et al. ............... 709/232 |
| 6,553,141 B1 | 4/2003 | Huffman |
| 6,563,517 B1 | 5/2003 | Bhagwat et al. |
| 6,642,860 B2 | 11/2003 | Meulenbroeks |
| 6,667,700 B1 | 12/2003 | McCanne et al. |
| 6,675,214 B2 | 1/2004 | Stewart et al. |
| 6,678,828 B1 | 1/2004 | Pham et al. |
| 6,704,730 B2 | 3/2004 | Moulton et al. |
| 6,721,780 B1 | 4/2004 | Kasriel et al. |
| 6,772,193 B1 | 8/2004 | Igawa et al. |
| 6,789,255 B1 | 9/2004 | Pedrizetti et al. |
| 6,791,947 B2 | 9/2004 | Oskouy et al. |
| 6,828,925 B2 | 12/2004 | McCanne et al. |
| 6,839,682 B1 | 1/2005 | Blume et al. |
| 6,856,651 B2 | 2/2005 | Singh |
| 6,857,012 B2 | 2/2005 | Sim et al. |
| 6,874,017 B1 | 3/2005 | Inoue et al. |
| 6,877,068 B2 | 4/2005 | Blanchard |
| 6,883,035 B2 | 4/2005 | Hannu et al. |
| 6,915,302 B1 | 7/2005 | Christofferson et al. |
| 6,961,009 B2 | 11/2005 | McCanne et al. |
| 7,058,699 B1 | 6/2006 | Chiou et al. |
| 7,058,763 B2 | 6/2006 | Gabber et al. |
| 7,082,456 B2 | 7/2006 | Mani-Meitav et al. |
| 7,120,666 B2 | 10/2006 | McCanne et al. |
| 7,139,976 B2 | 11/2006 | Kausik et al. |
| 7,149,817 B2 | 12/2006 | Pettey |
| 7,159,014 B2 | 1/2007 | Kausik et al. |
| 7,181,523 B2 | 2/2007 | Sim |
| 7,224,839 B2 | 5/2007 | Zeineh |
| 7,230,949 B2 | 6/2007 | Bharali et al. |
| 7,269,689 B2 | 9/2007 | Eshghi et al. |
| 7,336,682 B2 | 2/2008 | Singh |
| 7,366,859 B2 | 4/2008 | Per et al. |
| 7,370,120 B2 | 5/2008 | Kirsch et al. |
| 7,398,283 B2 | 7/2008 | Margolus et al. |
| 7,412,462 B2 | 8/2008 | Margolus et al. |
| 7,619,545 B2* | 11/2009 | Samuels et al. ............ 341/51 |
| 7,809,818 B2* | 10/2010 | Plamondon ............... 709/223 |
| 7,827,237 B2* | 11/2010 | Plamondon ............... 709/203 |
| 7,865,585 B2* | 1/2011 | Samuels et al. ........... 709/223 |
| 7,916,047 B2* | 3/2011 | Samuels et al. ........... 341/67 |
| 5,990,810 C1 | 4/2011 | Williams |
| 2002/0003795 A1 | 1/2002 | Oskouy et al. |
| 2002/0013853 A1* | 1/2002 | Baber et al. ............... 709/232 |
| 2002/0029326 A1 | 3/2002 | Reuter et al. |
| 2002/0087547 A1 | 7/2002 | Kausik et al. |
| 2002/0107971 A1 | 8/2002 | Bailey et al. |
| 2002/0138511 A1 | 9/2002 | Psounis et al. |
| 2002/0147895 A1 | 10/2002 | Glance et al. |
| 2002/0165911 A1 | 11/2002 | Gabber et al. |
| 2002/0169818 A1 | 11/2002 | Stewart et al. |
| 2002/0169828 A1 | 11/2002 | Blanchard |
| 2002/0194382 A1 | 12/2002 | Kausik et al. |
| 2003/0046369 A1 | 3/2003 | Sim et al. |
| 2003/0105837 A1 | 6/2003 | Kamen et al. |
| 2004/0088376 A1 | 5/2004 | McCanne et al. |
| 2004/0215746 A1 | 10/2004 | McCanne et al. |
| 2007/0083571 A1 | 4/2007 | Meller et al. |
| 2007/0150891 A1 | 6/2007 | Shapiro |

FOREIGN PATENT DOCUMENTS

| | | |
|---|---|---|
| EP | 1056279 A1 | 9/2001 |
| JP | 2002-359649 | 12/2002 |
| WO | WO 95/20793 A1 | 8/1995 |
| WO | WO 96/25801 A1 | 8/1996 |
| WO | WO 98/16067 A2 | 4/1998 |
| WO | WO 01/63420 A1 | 8/2001 |
| WO | WO 01/65831 A2 | 9/2001 |
| WO | WO 01/80022 A1 | 10/2001 |
| WO | WO 01/97526 A1 | 12/2001 |

OTHER PUBLICATIONS

Factor, Michael et al., "Compression in the Presence of Shared Data," Jun. 2001, Information Sciences: An International Journal, vol. 135, Issue 1-2, pp. 29-41.

Feldmeier, D.C. et al., "Protocol Boosters," Apr. 1998, IEEE JSAC, vol. 16, Issue No. 3, pp. 437-444.

Housel, B.C. et al., "Emulator Express: A System for Optimizing EmulatorPerformance for Wireless Networks," 2000, *IBM Systems Journal*, vol. 39, No. 2, pp. 384-402.

Johnson, J.H., "Identifying Redundancy in Source Code Using Fingerprints," Oct. 25-28, 1993, *Proceedings of CAS CON '93*, Toronto, Ontario, Canada, pp. 171-183.

Manber, Udi, "Finding Similar Files in a Large File System," Oct. 1993, *Department of Computer Science*, Technical Report # 93-33, University of Arizona, Tucson, Arizona, pp. 1-10.

Muthitacharoen, Athicha et al., "A Low Bandwidth Network File System," 2001, *Proceedings of the 18th ACM Symposium on Operating System Principles*, pp. 174-187.

Spring, Neil T. et al., "A Protocol-Independent Technique for Eliminating Redundant Network Traffic," 2000, *Proceedings of ACM SIGCOMM*.

Amer, A., et al., "File Access Prediction with Adjustable Accuracy", Institute of Electrical Engineers, Proceedings of the 2002 IEEE International; Performance, Computing and Communications Conference, Phoenix, AZ, Apr. 3-5, 2002, vol. Conf. 21, pp. 131-140.

Bungum, O. W., "Transmultiplexing, Transcontrol and Transscrambling of MPEG-2/DVB Signal", International Broadcasting Convention, London, Great Britain, Sep. 12-16, 1996, pp. 288-293.

Caceres, R., et al., "Web Proxy Caching: The Devil is in the Details", Jun. 1998, Proceedings of the Workshop on Internet Server Performance, Madison, Wisconsin, pp. 111-118.

Chakrabarti, Samidy, "Low-Bandwidth Web Access with Tandem Proxies", Sep. 2002, Department of Electrical Engineering, Massachusetts Institute of Technology, pp. 1-64.

Deshpande, M., et al., "Selective Markov Models for Predicting Web-Page Accesses", May 2004, *ACM Transactions on Internet Technology*, vol. 4, Issue 2, pp. 163-184.

Fan, Li. et al., "Summary Cache: A Scalable Wide-Area Web Cache Sharing Protocol", 1998, *IEEE/ACM Transactions on Networking*, vol. 8, No. 3, pp. 281-293.

Franaszek, Peter, et al., "Parallel Compression with Cooperative Dictionary Construction", Proceedings of Data Compression Conference, DCC '96, Mar. 31-Apr. 3, 1996, pp. 200-209.

Griffioen, James et al., "Reducing File System Latency using a Predictive Approach," Jun. 1994, *Proceedings of the USENIX*, Summer 1994 Technical Conference on USENIX, Technical Conference vol. 1.

Griffioen, James et al., "Automatic Prefetching in a WAN," Oct. 1993, *Proceedings of the IEEE Workshop on Advances in Parallel and Distributed Systems*, Technical Report # CS243-93, pp. 8-12.

Lei, Hui et al., "An Analytical Approach to File Prefetching," Jan.

1997, *Proceedings of the Annual Conference on USENIX Annual Technical Conference*, Anaheim, California, pp. 1-12.

Lin, K. et al., "Code compression techniques using operand field remapping", *Computers and Digital Techniques*, IEEE Proceedings, vol. 149, Issue 1, Jan. 2002, pp. 25-31.

Manber, Udi et al., "A Text Compression Scheme that Allows Fast Searching Directly in the Compressed File", Mar. 1993, Department of Computer Science, University of Arizona, Technical Report #93-07, pp. 1-13.

Manber, Udi et al., "GLIMPSE: A Tool to Search Through Entire File Systems", Department of Computer Science University of Arizona, TR 93-34, Oct. 1993.

Mellia, M. et al., "TCP Smart-Framing: Using Smart Segments to Enhance the Performance of TCP", *Global Telecommunications Conference*, GLOBECOM '01. IEEE, vol. 3, Nov. 25-29, 2001, pp. 1708-1712.

Oly, James et al., "Markov Model Prediction of I/O Request for Scientific Applications", Jun. 2002, *Proceedings of the 16th International Conference on Supercomputing*, pp. 147-155.

Padmanabhan et al., "Using Preditive Pretetching to Improve World Wide Web Latency", *ACM SIGCOMM Computer Communication Review*, Jul. 1999, pp. 22-36, vol. 26, No. 3.

Rhea, Sean C. et al., "Value-Based Web Caching", May 20-24, 2003, *Proceedings of the 12th International Conference on World Wide Web*, Budapest, Hungary, pp. 619-628.

Sayood, Khalid et al., "Recursively Indexed Quantization of Memoryless Sources", Sep. 1992, *IEEE Transactions on Information Theory*, vol. 38, No. 5, pp. 1602-1609.

Tolia, Niraj, et al., "An Architecture for Internet Data Transfer", May 2006, Proceedings of the 3rd Symposium on Networked Systems Design and Implementation (NSDI'06), San Jose, California.

"Unleashing the True Power of Today's Networks", *A Perbit White Paper*, Aug. 2002, pp. 1-13, URL=http://www.peribit.com/products/etc/0217w02punl.htm.

Yang, Qiang et al., "Mining Web Logs for Prediction Models in WWW Caching and Prefetching", *Proceedings of the Seventh ACM SIGKDD International Conference on Knowledge Discovery and Data Mining KDD'01*, Aug. 26-29, 2001, San Francisco, California, pp. 473-478.

Office Action in U.S. Appl. No. 10/640,405 dated May 11, 2011.

Border et al. "Performance Enhancing Proxies Intended to Mitigate Link-Related Degradations," Network Working Group Request for Comments: 3135 (Jun. 2001).

Mogul et al. "Delta encoding in HTTP," Network Working Group Internet-Draft (Oct. 2001).

* cited by examiner

| REFERENCE DATA | | TIME STAMP IN | |
|---|---|---|---|
| $R_1$ | SEGMENT 1 DATA | 00/00/0000, 00:00:00 | ⋮ |
| $R_2$ | SEGMENT 2 DATA | ⋮ | ⋮ |
| $R_3$ | SEGMENT 3 DATA | ⋮ | ⋮ |
| ⋮ | ⋮ | | |

FIG. 7

TRANSACTION ACCELERATOR FOR CLIENT-SERVER COMMUNICATIONS SYSTEMS

CROSS-REFERENCES TO RELATED APPLICATIONS

The present application is a continuation-in-part of the following pending applications:

U.S. patent application Ser. No. 11/229,016 entitled "Transaction Accelerator for Client-Server Communication Systems" (hereinafter "McCanne I");

U.S. patent application Ser. No. 11/508,531 entitled "Content-Based Segmentation Scheme for Data Compression in Storage and Transmission Including Hierarchical Segment Representation" (hereinafter "McCanne II"); and U.S. patent application Ser. No. 10/640,405 entitled "Transparent Client-Server Transaction Accelerator" (hereinafter "McCanne III").

The present application is also related to the following:

U.S. Pat. No. 7,318,100 entitled "Cooperative Proxy Auto-Discovery and Connection Interception" (hereinafter "McCanne IV").

Each of these are incorporated by reference herein for all purposes.

BACKGROUND

The present invention relates generally to systems for moving data through limited channels efficiently where the channels might be limited by bandwidth and/or latency, and more particularly to having data available in response to a request for data over a limited channel faster than if the data were sent unprocessed in response to the request, possibly taking into account varying applications, systems and protocols of and for the requested data.

Local Area Network (LAN) communication is characterized by generous bandwidths, low latencies and considerable enterprise control over the network. By contrast, Wide-Area Networks (WANs) often have lower bandwidths and higher latencies than LANs and often have a measure of network control that is outside the enterprise for which the WAN is being used.

Wide-area client-server applications are a critical part of almost any large enterprise. A WAN might be used to provide access to widely used and critical infrastructure, such as file servers, mail servers and networked storage. This access most often has very poor throughput when compared to the performance across a LAN. Whether an enterprise is taking a centralized approach or a distributed approach, high performance communication across the WAN is essential in order to minimize costs and maximize productivity.

Many applications and systems that operate well over high-speed connections need to be adapted to run on slower speed connections. For example, operating a file system over a local area network (LAN) works well, but often files need to be accessed where a high-speed link, such as a LAN, is not available along the entire path from the client needing access to the file and the file server serving the file. Similar design problems exist for other network services, such as e-mail services, computational services, multimedia, video conferencing, database querying, office collaboration, etc.

In a networked file system, for example, files used by applications in one place might be stored in another place. In a typical scenario, a number of users operating at computers networked throughout an organization and/or a geographic region share a file or sets of files that are stored in a file system. The file system might be near one of the users, but typically it is remote from most of the users, but the users often expect the files to appear to be near their sites.

As used herein, "client" generally refers to a computer, computing device, peripheral, electronics, or the like, that makes a request for data or an action, while "server" generally refers to a computer, computing device, peripheral, electronics, or the like, that operates in response to requests for data or action made by one or more clients.

A request can be for operation of the computer, computing device, peripheral, electronics, or the like, and/or for an application being executed or controlled by the client. One example is a computer running a word processing program that needs a document stored externally to the computer and uses a network file system client to make a request over a network to a file server. Another example is a request for an action directed at a server that itself performs the action, such as a print server, a processing server, a control server, an equipment interface server, and I/O (input/output) server, etc.

A request is often satisfied by a response message supplying the data requested or performing the action requested, or a response message indicating an inability to service the request, such as an error message or an alert to a monitoring system of a failed or improper request. A server might also block a request, forward a request, transform a request, or the like, and then respond to the request or not respond to the request.

In some instances, an object normally thought of as a server can act as a client and make requests and an object normally thought of as a client can act as a server and respond to requests. Furthermore, a single object might be both a server and a client, for other servers/clients or for itself. For example, a desktop computer might be running a database client and a user interface for the database client. If the desktop computer user manipulated the database client to cause it to make a request for data, the database client would issue a request, presumably to a database server. If the database server were running on the same desktop computer, the desktop computer would be, in effect, making a request to itself. It should be understood that, as used herein, clients and servers are often distinct and separated by a network, physical distance, security measures and other barriers, but those are not required characteristics of clients and servers.

In some cases, clients and servers are not necessarily exclusive. For example, in a peer-to-peer network, one peer might a request of another peer but might also serve responses to that peer. Therefore, it should be understood that while the terms "client" and "server" are typically used herein as the actors making "requests" and providing "responses", respectively, those elements might take on other roles not clearly delineated by the client-server paradigm.

Generally, a request-response cycle can be referred to as a "transaction" and for a given transaction, some object (physical, logical and/or virtual) can be said to be the "client" for that transaction and some other object (physical, logical and/or virtual) can be said to be the "server" for that transaction.

As explained above, a transaction over a network involves bidirectional communication between two computing entities, where one entity is the client and initiates a transaction by opening a network channel to another entity (the server). Typically, the client sends a request or set of requests via a set of networking protocols over that network channel, and the request or requests are processed by the server, returning responses. Many protocols are connection-based, whereby the two cooperating entities (sometimes known as "hosts") negotiate a communication session to begin the information exchange. In setting up a communication session, the client and the server might each maintain state information for the session, which may include information about the capabilities of each other. At some level, the session forms what is logically (or physically, in some cases) considered a "connection" between the client and server. Once the connection is established, communication between the client and server can proceed using state from the session establishment and other information and send messages between the client and the server, wherein a message is a data set comprising a plurality of bits in a sequence, possibly packaged as one or more packets according to an underlying network protocol. Typically, once the client and the server agree that the session is over, each side disposes of the state information for that transaction, other than possibly saving log information.

To realize a networking transaction, computing hosts make use of a set of networking protocols for exchanging information between the two computing hosts. Many networking protocols have been designed and deployed, with varying characteristics and capabilities. The Internet Protocol (IP), Transmission Control Protocol (TCP), and User Datagram Protocol (UDP) are three examples of protocols that are in common use today. Various other networking protocols might also be used.

Since protocols evolve over time, a common design goal is to allow for future modifications and enhancements of the protocol to be deployed in some entities, while still allowing those entities to interoperate with hosts that are not enabled to handle the new modifications. One simple approach to accomplishing interoperability is a protocol version negotiation. In an example of a protocol version negotiation, one entity informs the other entity of the capabilities that the first entity embodies. The other entity can respond with the capabilities that the other entity embodies. Through this negotiation, each side can be made aware of the capabilities of the other, and the channel communication can proceed with this shared knowledge. To be effective, this method must ensure that if one entity advertises a capability that the other entity does not understand, the second entity should still be able to handle the connection. This method is used in both the IP and TCP protocols—each provides a mechanism by which a variable length set of options can be conveyed in a message. The specification for each protocol dictates that if one entity does not have support for a given option, it should ignore that option when processing the message. Other protocols may have a similar features that allow for messages to contain data that is understood by some receivers of the data but possibly not understood by other receivers of the data, wherein a receiver that does not understand the data will not fail in its task and will typically forward on the not understood data such that another entity in the path will receive that data.

A message from a client to a server or vice-versa traverses one or more network "paths" connecting the client and server. A basic path would be a physical cable connecting the two hosts. More typically, a path involves a number of physical communication links and a number of intermediate devices (e.g., routers) that are able to transmit a packet along a correct path to the server, and transmit the response packets from the server back to the client. These intermediate devices typically do not modify the contents of a data packet; they simply pass the packet on in a correct direction. However, it is possible that a device that is in the network path between a client and a server could modify a data packet along the way. To avoid violating the semantics of the networking protocols, any such modifications should not alter how the packet is eventually processed by the destination host.

As used herein, the terms "near", "far", "local" and "remote" might refer to physical distance, but more typically they refer to effective distance. The effective distance between two computers, computing devices, servers, clients, peripherals, etc. is, at least approximately, a measure of the difficulty of getting data between the two computers. For example, where file data is stored on a hard drive connected directly to a computer processor using that file data, and the connection is through a dedicated high-speed bus, the hard drive and the computer processor are effectively "near" each other, but where the traffic between the hard drive and the computer processor is over a slow bus, with more intervening events possible to waylay the data, the hard drive and the computer processor are said to be farther apart.

Greater and lesser physical distances need not correspond with greater and lesser effective distances. For example, a file server and a desktop computer separated by miles of high-quality and high-bandwidth fiber optics might have a smaller effective distance compared with a file server and a desktop computer separated by a few feet and coupled via a wireless connection in a noisy environment.

Causes of Poor WAN Throughput

The two primary causes of the slow throughput on WANs are well known: high delay (or latency) and limited bandwidth. The "bandwidth" of a network of channel refers to measure of the number of bits that can be transmitted over a link or path per unit of time (usually measured in number of bits per unit time). "Latency" refers to a measure of the amount of time that transpires while the bits traverse the network, e.g., the time it takes a given bit transmitted from the sender to reach the destination (usually measured in time units). "Round-trip time" refers to the sum of the "source-to-destination" latency and the "destination-to-source" latency. If the underlying paths are asymmetric, the round-trip latency might be different than twice a one-way latency. The term "throughput" is sometimes confused with bandwidth but refers to a measure of an attained transfer rate that a client-server application, protocol, etc. achieves over a network path. Throughput is typically less than the available network bandwidth.

The speed of light, a fundamental and fixed constant, implies that information transmitted across a network always incurs some nonzero latency as it travels from the source to the destination. In practical terms, this means that sending a packet from the Silicon Valley in California to New York and back takes at least 30 milliseconds (ms), the time information in an electromagnetic signal would take to travel that distance in a direct path cross-country. In reality, this cross-country round trip time is more in the range of 100 ms or so, as signals in fiber or copper do not always travel at the speed of light in a vacuum and packets incur processing delays through each switch and router. This amount of latency is quite significant as it is at least two orders of magnitude higher than typical sub-millisecond LAN latencies.

Other round-trips might have more latency. Round trips from the West Coast of the U.S. to Europe can be in the range of 100-200 ms, and some links using geo-stationary satellites into remote sites can have latencies in the 500-800 ms range. With latencies higher than about 50 ms, many client-server protocols and applications will function poorly relative to a LAN, as those protocols and applications expect very low latency.

While many employees routinely depend upon Fast Ethernet (100 Mbps) or Gigabit Ethernet (1 Gbps) within most corporate sites and headquarters facilities, the bandwidth interconnecting many corporate and industrial sites in the world is much lower. Even with DSL, Frame Relay or other broadband technologies, WAN connections are slow relative to a LAN. For example, 1 Mbps DSL service offers only $1/100^{th}$ the bandwidth of Fast Ethernet and $1/1,000^{th}$ of what is available using Gigabit Ethernet.

While some places might have high bandwidth backbone networks, such as the Metro Ethernet available in South Korea and Japan, the latency and bandwidth issues persist whenever data needs to travel outside areas with such networks. For example, a Japanese manufacturer with plants in Japan and the U.S. might need to send CAD/CAM files back and forth between plants. The latency from Japan to the East Coast of the U.S. might be as high as 200 ms and trans-Pacific bandwidth can be expensive and limited.

WAN network bandwidth limits almost always impact client-server application throughput across the WAN, but more bandwidth can be bought. With latency, lower latency cannot be bought if it would require faster than light communications. In some cases, network latency is the bottleneck on performance or throughput. This is often the case with window-based transport protocols such as TCP or a request-response protocol such as the Common Internet File System (CIFS) protocol or the Network File System (NFS) protocol. High network latency particularly slows down "chatty" applications, even if the actual amounts of data transmitted in each transaction are not large. "Chatty" applications are those in which client-server interactions involve many back-and-forth steps that might not even depend on each other. Adding bandwidth (or compressing data) does not improve the throughput of these protocols/applications when the round-trip time exceeds some critical point and once the latency reaches that critical point, throughput decays quickly.

This phenomenon can be understood intuitively: the rate of work that can be performed by a client-server application that executes serialized steps to accomplish its tasks is inversely proportional to the round-trip time between the client and the server. If the client-server application is bottlenecked in a serialized computation (i.e., it is "chatty"), then increasing the round-trip by a factor of two causes the throughput to decrease by a factor of two because it takes twice as long to perform each step (while the client waits for the server and vice versa).

More generally, the throughput of client-server applications that are not necessarily chatty but run over a window-based protocol (such as TCP) can also suffer from a similar fate. This can be modeled with a simple equation that accounts for the round-trip time (RTT) and the protocol window (W). The window defines how much data the sender can transmit before requiring receipt of an acknowledgement from the receiver. Once a window's worth of data is sent, the sender must wait until it hears from the receiver. Since it takes a round-trip time to receive the acknowledgement from the receiver, the rate at which data can be sent is simply the window size divided by the round trip time:

$$T=W/RTT$$

The optimal choice of window size depends on a number of factors. To perform well across a range of network conditions, a TCP device attempts to adapt its window to the underlying capacity of the network. So, if the underlying bottleneck bandwidth (or the TCP sender's share of the bandwidth) is roughly B bits per second, then a TCP device attempts to set its window to B×RTT, and the throughput, T, would be:

$$T=(B \times RTT)/RTT=B$$

In other words, the throughput would be equal to the available rate. Unfortunately, there are often other constraints. Many protocols, such as TCP and CIFS, have an upper bound on the window size that is built into the protocol. For example, the maximum request size in CIFS is 64 KB and in the original TCP protocol, the maximum window size was limited by the fact that the advertised window field in the protocol header is 16 bits, limiting the window also to 64 KB. While modern TCP stacks implement the window scaling method in RFC 1323 to overcome this problem, there are still many legacy TCP implementations that do not negotiate scaled windows, and there are more protocols such as CIFS that have application-level limits on top of the TCP window limit. So, in practice, the throughput is actually limited by the maximum window size (MWS)

$$T=\min(B \times RTT, MWS)/RTT <= B$$

Even worse, there is an additional constraint on throughput that is fundamental to the congestion control algorithm designed into TCP. This flaw turns out to be non-negligible in wide-area networks where bandwidth is above a few megabits and is probably the key reason why enterprises often fail to see marked performance improvements of individual applications after substantial bandwidth upgrades.

Essentially, this problem stems from conflicting goals of the TCP congestion control algorithm that are exacerbated in a high-delay environment. Namely, upon detecting packet loss, a TCP device reacts quickly and significantly to err on the side of safety (i.e., to prevent a set of TCP connections from overloading and congesting the network). Yet, to probe for available bandwidth, a TCP device will dynamically adjust its sending rate and continually push the network into momentary periods of congestion that cause packet loss to detect bandwidth limits. In short, a TCP device continually sends the network into congestion then aggressively backs off. In a high-latency environment, the slow reaction time results in throughput limitations.

An equation was derived in the late 1990's that models the behavior of a network as a function of the packet loss rate that TCP induces and that equation is:

$$CWS=1.2 \times S/sqrt(p)$$

As indicated by that equation, the average congestion window size (CWS) is roughly determined by the packet size (S) and the loss rate (p). Taking this into account, the actual throughput of a client-server application running over TCP is:

$$T=W/RTT=\min(MWS, CWS, B \times RTT)/RTT$$

With a T3 line, the TCP throughput starts out at the available line rate (45 Mb/s) at low latencies, but at higher latencies the throughput begins to decay rapidly (in fact, hyperbolically). This effect is so dramatic that at a 100 ms delay (i.e., a typical cross-country link), TCP throughput is only 4.5 Mb/s of the 45 Mb/s link.

Under such conditions, application performance does not always increase when additional bandwidth is added. If the round trip time (RTT) is greater than a critical point (just 15 ms or so in this example) then increasing the bandwidth of the link will only marginally improve throughput at higher latency and at even higher latencies, throughput is not increased at all with increases in bandwidth. In environments with relatively low loss rates and normal WAN latencies, throughput can be dramatically limited.

Existing Approaches to Overcoming WAN Throughput Problems

Given the high costs and performance challenges of WAN-based enterprise computing and communication, many approaches have been proposed for dealing with these problems.

Perhaps the simplest approach to dealing with performance is to simply upgrade the available bandwidth in the network.

Of course this is the most direct solution, but it is not always the most effective approach. First of all, contrary to popular belief, bandwidth is not free and the costs add up quickly for large enterprises that may have hundreds of offices. Second, as discussed earlier, adding bandwidth does not necessarily improve throughput. Third, in some places adding more bandwidth is not possible, especially across international sites, in remote areas, or where it is simply too expensive to justify.

Another approach is to embed intelligence in the applications themselves, e.g., to exploit that fact that data often changes in incremental ways so that the application can be designed to send just incremental updates to between clients and servers. Usually, this type of approach employs some sort of versioning system to keep track of version numbers of files (or data objects) so that differences between versioned data can be sent between application components across the network. For example, some content management systems have this capability and storage backup software generally employs this basic approach. However, these systems do not deal with scenarios where data is manipulated outside of their domain. For example, when a file is renamed and re-entered into the system the changes between the old and new versions are not captured. Likewise, when data flows between distinct applications (e.g., a file is copied out of a content management system and into a file system), versioning cannot be carried out between the different components.

This approach of managing versions and communicating updates can be viewed as one specific (and application-specific) approach to compression. More generally, data compression systems can be utilized to ameliorate network bandwidth bottlenecks. Compression is a process of representing one set of data with another set of data wherein the second set of data is, on average, a smaller number of bits than the first set of data, such that the first set of data, or at least a sufficient approximation of the first set of data, can be recovered from an inverse of the compression process in most cases. Compression allows for more efficient use of a limited bandwidth and might result in less latency, but in some cases, no latency improvement occurs. In some cases, compression might add to the latency, if time is needed to compress data after the request is made and time is needed to decompress the data after it is received. This may be able to be improved if the data can be compressed ahead of time, before the request is made, but that may not be feasible if the data is not necessarily available ahead of time for compression, or if the volume of data from which the request will be served is too large relative to the amount of data likely to be used.

One way to deploy compression is to embed it in applications. For example, a Web server can compress the HTML pages it returns before delivering them across the network to end clients. Another approach is to deploy compression in the network without having to modify the applications. For many years, network devices have included compression options as features (e.g., in routers, modems, dedicated compression devices, etc) [D. Rand, "The PPP Compression Control Protocol (CCP)", Request-for-Comments 1962, June 1996]. This is a reasonable thing to do, but the effectiveness is limited. Most methods of lossless data compression typically reduce the amount of data (i.e., bandwidth) by a factor of 1.5 to 4, depending on the inherent redundancy present. While helpful, it is not enough to dramatically change performance if the amount of data being sent is large or similar data is sent repeatedly, perhaps over longer time scales. Also, when performance is limited by network latency, compressing the underlying data will have little or no impact.

Rather than compress the data, another approach to working around WAN bottlenecks is to replicate servers and server data in local servers for quick access. This approach in particular addresses the network latency problem because a client in a remote site can now interact with a local server rather than a remote server. There are several methods available to enterprises to store redundant copies of data in replicated file systems, redundant or local storage servers, or by using any number of distributed file systems. The challenge with this kind of approach is the basic problem of managing the ever-exploding amount of data, which requires scaling up storage, application and file servers in many places, and trying to make sure that the files people need are indeed available where and when they are needed. Moreover, these approaches are generally non-transparent, meaning the clients and servers must be modified to implement and interact with the agents and/or devices that perform the replication function. For example, if a file server is replicated to a remote branch, the server must be configured to send updates to the replica and certain clients must be configured to interact with the replica while others need to be configured to interact with the original server.

Rather than replicate servers, another approach is to deploy transport-level or application-level devices called "proxies", which function as performance-enhancing intermediaries between the client and the server. In this case, a proxy is the terminus for the client connection and initiates another connection to the server on behalf of the client. Alternatively, the proxy connects to one or more other proxies that in turn connect to the server. Each proxy may forward, modify, or otherwise transform the transactions as they flow from the client to the server and vice versa. Examples of proxies include (1) Web proxies that enhance performance through caching or enhance security by controlling access to servers, (2) mail relays that forward mail from a client to another mail server, (3) DNS relays that cache DNS name resolutions, and so forth.

One problem that must be overcome when deploying proxies is that of directing client requests to the proxy instead of to the destination server. One mechanism for accomplishing this is to configure each client host or process with the network address information of the proxy. This requires that the client application have an explicit proxy capability, whereby the client can be configured to direct requests to the proxy instead of to the server. In addition, this type of deployment requires that all clients must be explicitly configured and that can be an administrative burden on a network administrator.

One way around the problems of explicit proxy configuration is to deploy a transparent proxy. The presence of the transparent proxy is not made explicitly known to the client process, so all client requests proceed along the network path towards the server as they would have if there were no transparent proxy. This might be done by placing the transparent proxy host in the network path between the client and the server. An L4 switch is then employed so the proxy host can intercept client connections and handle the requests via the proxy. For example, the L4 switch could be configured so that all Web connections (i.e., TCP connections on port 80) are routed to a local proxy process. The local proxy process can then perform operations on behalf of the server. For example, the local proxy process could respond to the request using information from its local cache. When intercepting the connection, the L4 switch performs NAT (network address translation) so the connection appears to the client as having been terminated at the origin server, even though the client communicates directly with the proxy. In this manner, the benefits of a proxy can be realized without the need for explicit client configuration.

Some benefits of a transparent proxy require that a proxy pair exist in the network path. For example, if a proxy is used to transform data in some way, a second proxy preferably untransforms the data. For example, where traffic between a client and a server is to be compressed or encrypted for transport over a portion of the network path between the client and the server, a proxy on one side of that portion would compress or encrypt data before it flows over that portion and a proxy on the other side of that portion would uncompress or decrypt the data and send it along the network path, thereby providing for transparent transformation of data flowing between the client and the server.

For actions that require a proxy pair, preferably both proxies in the proxy pair do not perform a transformation unless they can be assured of the existence and operation of the other proxy in the proxy pair. Where each proxy must be explicitly configured with indications of the pairs to which it belongs and to the identity of the other members of those pairs, the administrative burden on a network administrator might well make some operations infeasible if they require proxy pairs. Even where a proxy is interposed in a network and gets all of the traffic from a client or server, it still must discover the other member for each proxy pair the proxy needs, if the proxy is to perform actions that require proxy pairs.

With a proxy situated between the client and server, the performance impairments of network latency can be addressed by having the proxy cache data. Caching is a process of storing previously transmitted results in the hopes that the user will request the results again and receive a response more quickly from the cache than if the results had to come from the original provider. Caching also provides some help in mitigating both latency and bandwidth bottlenecks, but in some situations it does not help much. For example, where a single processor is retrieving data from memory it controls and does so in a repetitive fashion, as might be the case when reading processor instructions from memory, caching can greatly speed a processor's tasks. Similarly, file systems have employed caching mechanisms to store recently accessed disk blocks in host memory so that subsequent accesses to cached blocks are completed much faster than reading them in from disk again as in BSD Fast File System [McKusick, et al., "A Fast File System for BSD", ACM Transactions on Computer Systems, Vol. 2(3), 1984], the Log-based File System [Rosenblum and Ousterhout, "The Design and Implementation of a Log-structured File System", ACM Transactions on Computer Systems, Vol. 10(1), 1992], etc.

In a typical cache arrangement, a requester requests data from some memory, device or the like and the results are provided to the requester and stored in a cache having a faster response time than the original device supplying the data. Then, when the requester requests that data again, if it is still in the cache, the cache can return the data in response to the request before the original device could have returned it and the request is satisfied that much sooner.

Caching has its difficulties, one of which is that the data might change at the source and the cache would then be supplying "stale" data to the requester. This is the "cache consistency" problem. Because of this, caches are often "read only" requiring that changes to data be transmitted through the cache back to the source in a "write-through" fashion. Another problem with caching is that the original source of the data might want to track usage of data and would not be aware of uses that were served from the cache as opposed to from the original source. For example, where a Web server is remote from a number of computers running Web browsers that are "pointed to" that Web server, the Web browsers might cache Web pages from that site as they are viewed, to avoid delays that might occur in downloading the Web page again. While this would improve performance in many cases, and reduce the load on the Web server, the Web server operator might try to track the total number of "page views" but would be ignorant of those served by the cache. In some cases, an Internet service provider might operate the cache remote from the browsers and provide cached content for a large number of browsers, so a Web server operator might even miss unique users entirely.

Additionally, the mechanism underlying Web caching provides only a loose model for consistency between the origin data and the cached data. Generally, Web data is cached for a period of time based on heuristics or hints in the transactions independent of changes to the origin data. This means that cached Web data can occasionally become inconsistent with the origin server and such inconsistencies are simply tolerated by Web site operators, service providers, and users as a reasonable performance trade-off. Unfortunately, this model of loose consistency is entirely inappropriate for general client-server communication like networked file systems. When a client interacts with a file server, the consistency model must be wholly correct and accurate to ensure proper operation of the application using the file system.

Where loose consistency can be tolerated, caching can work remarkably well. For example, the Domain Name System (DNS), dating back to the early 1980's, employs caching extensively to provide performance and scalability across the wide area. In this context, providing only loose consistency semantics has proven adequate. In DNS, each "name server" manages a stored dataset that represents so-called "resource records" (RR). While DNS is most commonly used to store and manage the mappings from host names to host addresses in the Internet (and vice versa), the original DNS design and its specification allow resource records to contain arbitrary data. In this model, clients send queries to servers to retrieve data from the stored data set managed by a particular server. Clients can also send queries to relays, which act as proxies and cache portions of master name servers' stored datasets. A query can be "recursive", which causes the relay to recursively perform the query on behalf of the client. In turn, the relay can communicate with another relay and so forth until the master server is ultimately contacted. If any relay on the path from the client to the server has data in its cache that would satisfy the request, then it can return that data back to the requestor.

Some solutions to network responsiveness deal with the problem at the file system or at network layers. One proposed solution is the use of a low-bandwidth network file system, such as that described in Muthitacharoen, A., et al., "*A Low-Bandwidth Network File System*", in Proceedings of the 18th ACM Symposium on Operating Systems Principles (SOSP '01), pp. 174-187 (Chateau Lake Louise, Banff, Canada, October 2001) (in vol. 35, 5 of ACM SIGOPS Operating Systems Review, ACM Press). In that system, called LBFS, clients employ "whole file" caching whereby upon a file open operation, the client fetches all the data in the file from the server, then operates on the locally cached copy of the file data. If the client makes changes to the file, those changes are propagated back to the server when the client closes the file. To optimize these transfers, LBFS replaces pieces of the file with hashes, and the recipient uses the hashes in conjunction with a local file store to resolve the hashes to the original portions of the file.

Such systems have limitations in that they are tied to file systems and generally require modification of the clients and servers between which responsiveness is to be improved.

Furthermore, the hashing scheme operates over blocks of relatively large (average) size, which works poorly when files are subject to fine-grained changes over time. Finally, LBFS is by design intimately tied to a network file system protocol. It is not able to optimize or accelerate other types of client-server transactions, e.g., e-mail, Web, streaming media, and so forth. The hashes could also collide as the hashes are not provably unique.

Another proposed solution is suggested by Spring, N., et al., "A Protocol-Independent Technique for Eliminating Redundant Network Traffic", in Proceedings of ACM SIGCOMM (August 2000). As described in that reference, network packets that are similar to recently transmitted packets can be reduced in size by identifying repeated strings and replacing the repeated strings with tokens to be resolved from a shared packet cache at either end of a network link. This approach, while beneficial, has a number of shortcomings. Because it operates solely on individual packets, the performance gains that accrue are limited by the ratio of the packet payload size to the packet header (since the packet header is generally not compressible using the described technique). Also, because the mechanism is implemented at the packet level, it only applies to regions of the network where two ends of a communicating path have been configured with the device. This configuration can be difficult to achieve, and may be impractical in certain environments. Also, by caching network packets using a relatively small memory-based cache with a first-in first-out replacement policy (without the aid of, for instance, a large disk-based backing store), the efficacy of the approach is limited to detecting and exploiting communication redundancies that are fairly localized in time.

Cache consistency in the context of network file systems has been studied. The primary challenge is to provide a consistent view of a file to multiple clients when these clients read and write the file concurrently. When multiple clients access a file for reading and at least one client accesses the same file for writing, a condition called "concurrent write sharing" occurs and measures must be taken to guarantee that reading clients do not access stale data after a writing client updates the file.

In the original Network File System (NFS) [Sandberg et al., "Design and Implementation of the Sun Network Filesystem", In Proc. of the Summer 1985 USENIX Conference, 1985], caching is used to store disk blocks that were accessed across the network sometime in the past. An agent at the client maintains a cache of file system blocks and, to provide consistency, their last modification time. Whenever the client reads a block, the agent at the client checks to determine if the requested block is in its local cache. If it is and the last modification time is less than some configurable parameter (to provide a medium level of time-based consistency), then the block is returned by the agent. If the modification time is greater than the parameter, then the last-modification time for the file is fetched from the server. If that time is the same as the last modification time of the data in the cache, then the request is returned from the cache. Otherwise, the file has been modified so all blocks of that file present in the local cache are flushed and the read request is sent to the server. To provide tighter consistency semantics, NFS can employ locking via the NFS Lock Manager (NLM). Under this configuration, when the agent at the client detects the locking condition, it disables caching and thus forces all requests to be serviced at the server, thereby ensuring strong consistency.

When blocks are not present in the local cache, NFS attempts to combat latency with the well-known "read-ahead" algorithm, which dates back to at least the early 1970's as it was employed in the Multics I/O System [Feiertag and Organick, "The Multics Input/Output System", Third ACM Symposium on Operating System Principles, October 1971]. The read-ahead algorithm exploits the observation that clients often open files and sequentially read each block. That is, when a client accesses block k, it is likely in the future to access block k+1. In read-ahead, a process or agent fetches blocks ahead of the client's request and stores those blocks in the cache in anticipation of the client's forthcoming request. In this fashion, NFS can mask the latency of fetching blocks from a server when the read-ahead turns out to successfully predict the client read patterns. Read-ahead is widely deployed in modern file systems.

In the Andrew File System (AFS) [Howard, "An Overview of the Andrew File System", In Proc. of the USENIX Winter Technical Conference, February 1988], "whole-file" caching is used instead of block-based caching. Here, when a client opens a file, an agent at the client checks to see if the file is resident in its local disk cache. If it is, it checks with the server to see if the cached file is valid (i.e., that there have not been any modifications since the file was cached). If not (or if the file was not in the cache to begin with), a new version of the file is fetched from the server and stored in the cache. All client file activity is then intercepted by the agent at the client and operations are performed on the cached copy of the file. When the client closes the file, any modifications are written back to the server. This approach provides only "close-to-open" consistency because changes by multiple clients to the same file are only serialized and written back to the server on each file close operation.

Another mechanism called "opportunistic locking" was employed by the Server Message Block (SMB) Protocol, now called CIFS, to provide consistency. In this approach, when a file is opened the client (or client agent) can request an opportunistic lock or oplock associated with the file. If the server grants the oplock, then the client can assume no modifications will be made to file during the time the lock is held. If another client attempts to open the file for writing (i.e., concurrent write sharing arises), then the server breaks the oplock previously granted to the first client, then grants the second client write access to the file. Given this condition, the first client is forced to send all reads to the server for the files for which it does not hold an oplock. A similar mechanism was employed in the Sprite distributed file system, where the server would notify all relevant clients when it detected concurrent write sharing [Nelson, Welch, and Ousterhout, "Caching in the Sprite Network File System", ACM Transactions on Computer Systems, 6(1), February, 1988].

When consistency mechanisms are combined with network caching, a great deal of complexity arises. For example, if a data caching architecture such as that used by DNS or the Web were applied to file systems, it would have to include a consistency protocol that could manage concurrent write sharing conditions when they arise. In this model, each node, or network cache, in the system contains a cache of file data that can be accessed by different clients. The file data in the cache is indexed by file identification information, relating the image of data in the cache to the server and file it came from. Just like NFS, a cache could enhance performance in certain cases by using read-ahead to retrieve file data ahead of a client's request and storing said retrieved data in the cache. Upon detecting when concurrent write sharing, such a system could force all reads and writes to be synchronized at a single caching node, thereby assuring consistency. This approach is burdened by a great deal of complexity in managing consistency across all the caches in the system. Moreover, the system's concurrency model assumes that all file activity is managed by its caches; if a client modifies data directly on the server, consistency errors could arise. Also, its ability to overcome network latency for client accesses to data that is not resident in the cache is limited to performing file-based read-ahead. For example, in NFS, a client that opens a file must look up each component of the path (once per round-trip) to ultimately locate the desired file handle and file-based read-ahead does nothing eliminate these round-trips. Finally, the system must perform complex protocol conversions between the native protocols that the clients and servers speak and the systems internal caching protocols, effectively requiring that the system replicate the functionality of a server (to interoperate with a client) and a client (to interoperate with a server).

A different approach to dealing with network latency when clients access data that is not in the cache is to predict file access patterns. A number of research publications describe approaches that attempt to predict the next file (or files) a client might access based on the files it is current accessing and has accessed in the past, see [Amer. et al., "File Access Prediction with Adjustable Accuracy", In Proc. of the International Performance Conference on Computers and Communication, April 2002], [Lei and Duchamp, "An Analytical Approach to File Prefetching", In Proc. of the 1997 Annual USENIX Conference, January 1997], [Griffioen and Appleton, "Reducing File System Latency using a Predictive Approach", In Proc. of the 1994 Summer USENIX Conference, June 1994], [Kroeger and Long, "The Case for Efficient File Access Pattern Modeling", In Proc. of the Seventh Workshop on Hot Topics in Operating Systems, March 1999]. Based on these prediction models, these systems pre-fetch the predicted files by reading them into a cache. Unfortunately, this approach presumes the existence of a cache and thus entails the complexities and difficulties of cache coherency.

In the context of the World-Wide Web, other research has applied this prediction concept to Web objects [Padmanabhan and Mogul, "Using Predictive Prefetching to Improve World Wide Web Latency", ACM SIGCOMM, Computer Communication Review 26(3), July 1996]. In this approach, the server keeps track of client access patterns and passes this information as a hint to the client. The client in turn can choose to pre-fetch into its cache the URLs that correspond to the hinted objects. Again, this approach presumes the existence of a cache, and can be deployed without disrupting the semantics of the Web protocols only because the Web is generally read-only and does not require strong consistency.

Unfortunately, while many of the above techniques solve some aspects of WAN performance problems, they still have some shortcomings. In view of the above problems and the limitations with existing solutions, improvements can be made in how and when data is transported for transactions over a network, along with mechanisms for implementing such transport.

BRIEF SUMMARY OF THE INVENTION

In embodiments of methods and system for transaction acceleration according to aspects of the present invention, clients and servers participate in accelerated transactions, wherein a pair of accelerators occur between a client and server to accelerate a transaction, the accelerators use a persistent segment store to store segment data associated with segment references and transactions including segment references that replace segment data travel through the accelerators. This can be done in a manner transparent to either or both sides. Additionally, transactions can be predicted and prebuffered or at least processed such that the data of the transaction occurs in the persistent segment store. The persistent segment store can store segments that are data segmented based on content of the data and can be independent of transaction protocol, application, device and so on. The pair of accelerators might include logic for detecting each other.

Specifically, transactions can be accelerated by the transaction accelerators by storing segments of data used in the transactions in persistent segment storage accessible to the server-side transaction accelerator and in persistent segment storage accessible to the client-side transaction accelerator. When data is to be sent between the transaction accelerators, the sending transaction accelerator compares the segments of the data to be sent with segments stored in its persistent segment storage and replaces segments of data with references to entries in its persistent segment storage that match or closely match the segments of data to be replaced. The receiving transaction store then reconstructs the data sent by replacing the segment references with corresponding segment data from its persistent segment storage.

If segments are referred to but do not exist in the receiver's persistent segment store, the receiver can issue requests for the missing segments from the sender via a side channel or via the link used to send the references to the segments. Where the persistent segment storage at each end is populated with segments likely to be repeated, such replacement of segments will occur often, resulting in much less bandwidth use over the network, thus accelerating transactions. Because the segment references are globally unique, they need not be specific to any particular transaction. For example, a stored reference of a segment reference and segment data might be used in a transaction between two devices and between two other devices, each having separate locations, using different protocols, and for passing data that is from two different applications.

The segments stored in the persistent segment stores can relate to different transactions, different clients and/or different servers. For example, if a transaction accelerator encounters a segment of data and stores it in its persistent segment store in handling a given transaction, a reference to that segment of data might be used again in a different transaction, relating to a different client or the same client and a different server or the same server, or relating to an entirely different client-server application.

In some embodiments, transaction accelerators' persistent segment stores are pre-populated with segment data from other transaction accelerators, so that when a transaction occurs, more segments are available at the sender end for replacement with references and more segments are available at the receiving end for reconstruction from the references. In some embodiments, the prepopulation is derived from predicted transactions.

A transaction predictor might be in the server-side accelerator, the client-side accelerator, or both. The client-side accelerator receives indications of requests from the client, a transaction buffer for storing results of predicted transactions received from the server or the server-side accelerator ahead of receipt of a corresponding request, and a collator for collating the requests from the client with the stored results or received results, wherein a request and a response that are matched by the collator are identified and the matched response is provided to the client in response to the matched request. The server-side accelerator receives indications of transactions including requests and responses and conveys requests to the server in response to actual transactions or predicted transactions.

The network transaction accelerators might also perform segment cloning using persistent segment storage at each end. The network transaction accelerators might also comprise a transaction mapping table that maps transaction identifiers of actual requests and transaction identifiers of synthetic requests to mapped transaction identifiers, such that responses to requests are uniquely identifiable by their mapped transaction identifiers even when transaction identifiers of synthetic requests might overlap with transaction identifiers of actual requests and a transaction mapper that maps transaction to a mapped transaction identifier and replaces the transaction's identifier as received by the network transaction accelerator with the mapped transaction identifier for received requests that are forwarded toward the server and replaces the mapped transaction identifier with the replaced transaction identifier for responses that are returned toward the client.

Other features and advantages of the invention will be apparent in view of the following detailed description and preferred embodiments.

BRIEF DESCRIPTION OF THE DRAWINGS

FIG. 7 is an illustration of data organization in embodiments of a persistent segment store ("PSS") as might be used with the system shown in FIG. 1.

FIG. 25 illustrates state diagrams for Markov models used for transaction prediction;

FIG. 25A illustrates a first scheme for modeling and FIG. 25 illustrates a second scheme for modeling.

DETAILED DESCRIPTION OF THE INVENTION

Figure 1:
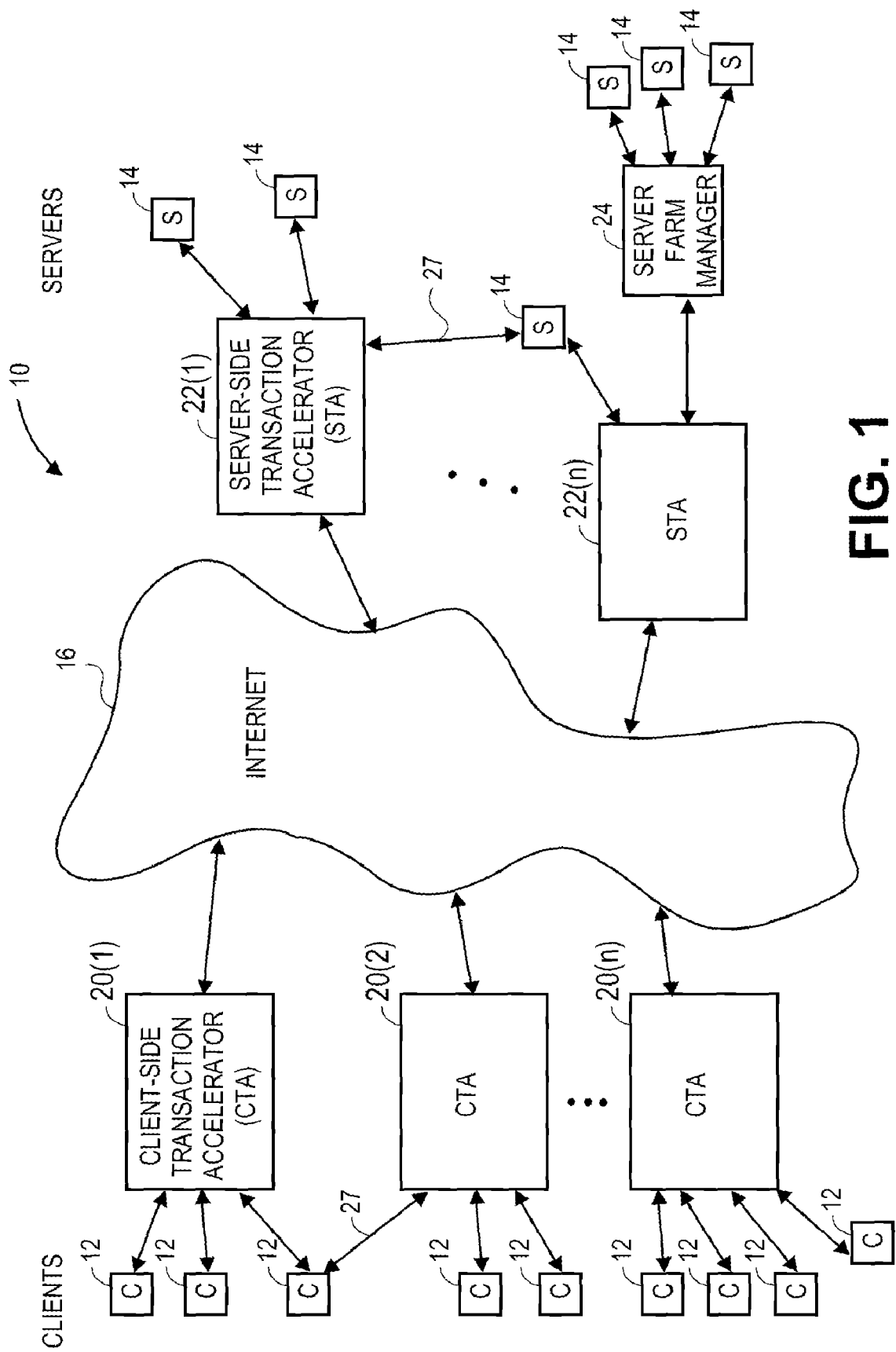
FIG. 1 is a block diagram of a networked client-server system according to embodiments of the present invention.

The present invention has many applications, as will be apparent after reading this disclosure. In describing an embodiment of a transaction acceleration system according to the present invention, only a few of the possible variations are described. Other applications and variations will be apparent to one of ordinary skill in the art, so the invention should not be construed as narrowly as the examples, but rather in accordance with the appended claims.

A transaction, as the term is used herein, is a logical set of steps that result in data moving from one place to another. In some cases, the data being moved exists at its origin independent of the transaction, such as a file read transaction where the file exists on the disk of the server. In other cases, the data is generated for the transaction at the origin, such as in response to a request for computation, lookup, etc. Typically, the computer, computer device, etc. initiating the transaction is referred to as the "client" and the computer, computer device, etc. that responds, or is expected to respond, is referred to as the "server". Data can flow in either direction. For example, a file system client might initiate a transaction by requesting a file read. The corresponding data will be returned from the server responding to the request, so in that case, the bulk of the data flows from the server to the client. However, where a client initiates a file write transaction, the bulk of the data flows from the client to the server, either as part of the initial request or as subsequent messages.

A transaction can be in multiple parts, but in a simple transaction, a client sends a request (data, a message, a signal, etc., explicitly being the request or indicative of or representing of the request) to a server and the server responds with a response (data, a message, a signal, etc., explicitly being the response or indicative of or representing of the response) to the client. More complex transactions, for example, might involve some back and forth, as might be needed for a server to clarify a request, verify the authority of the client to receive a response to the request, get additional information needed for preparing the response, etc.

Herein, the typical example of a connection between a client and a server is a packet network, but other connection means can also be used, such as a point-to-point wired or wireless channel. These elements will be generalized and referred to here as "nodes" with a channel assumed for communication between the nodes.

A transaction might begin with a client at one node making a request for file data directed to a server at another node, followed by a delivery of a response containing the requested file data. Other transactions might be a request for a specific part of a file, all the file, all or some of another data construct, or a transaction might relate to data flowing from the requester or relate to a command. Examples of transactions include "read a block", "read a file", "read a stream", "write a block with this data" (an example of data flowing from the requestor), "open a file", "perform a calculation on this data", "get an e-mail with these characteristics", "send an e-mail", "check for new emails", "list directory contents", etc.

Some transactions might involve large amounts of data flowing in one direction or both directions. Some transactions might even involve interactions having more than one requester and/or more than one receiver. For clarity of description, these many transaction types are described in terms of a typical simple transaction, where one client makes a request of one server and that one server responds to the request in a manner expected by the client. However, upon reading this disclosure, a person of ordinary skill will be able to apply these concepts to one-to-many and many-to-many transactions between client(s) and server(s) or more generally between two nodes. Where data flow is described in one direction, it should be understood that data might flow in the other direction and/or information might flow in only one direction, but data and/or signals flow in both directions to accomplish the movement of information.

Using some of the systems described herein, client access to a server (and vice versa where needed), can be "tunneled" through transaction accelerators that map transactions onto sequences of variable-length segments with content-induced segment cut points. The segments can be stored at various places, typically within high-speed access of both the clients and the servers, with the segments stored using a scalable, persistent naming system. The segments can be decoupled from file-system and other system data blocks and structures, so that a matching segment might be found in multiple contexts. Instead of caching files, blocks, or other system dependent constructs, segments can be stored and bound to references that are used to represent the segment contents.

Transaction accelerators (or "accelerators" for short) are interposed in or near a network path between one or more clients and one or more servers. In some implementations, the accelerator is implemented entirely in software, while in other implementations the accelerator might be implemented in hardware, firmware or some combination of hardware, firmware and/or software. For illustration purposes, accelerators are shown in the figures as hardware boxes, but it should be understood that the accelerator might be software running on a general-purpose computer or using the computing facilities of other devices on the network. For example, a special router or switch might be devised that runs the accelerator in software in addition to its regular function. In a specific embodiment, a dedicated accelerator appliance is deployed in the network infrastructure between client and server sites and might be based on the Linux™ operating system.

As will be described herein, the accelerators reduce bandwidth usage and reduce latency for transactions between clients and servers. Such transactions might include copying a file from a distant file server to a local storage device, backing up remote file servers to a main data center storage device, sending a very large CAD file to a colleague over a large distance, etc. As should be apparent from this description, transactions need not be limited to file related activities.

As used herein, "near" may refer to physical proximity, but can also refer to network proximity. Network proximity relates to performance attributes. As an example, two nodes of a LAN might be considered more near than two nodes separated by a slow network channel. Often is the case that large physical distances do not result in network proximity, but there are examples where two nodes can be physically close but faraway in network terms and where two nodes can be physically far away but relatively close in network terms. Preferably, accelerators are positioned to be in network proximity with the nodes that seek a benefit from the accelerators.

FIG. 1 is a block diagram of a networked client-server system 10 according to embodiments of the present invention, where such transactions might occur. FIG. 1 is described in more detail below, along with related figures.

In various embodiments, the accelerator is a transport-level proxy that conceptually operates in pair-wise configurations, with one accelerator situated near one or more servers (the "server site") and another situated near clients (the "client site"). Accelerators communicate with one another in a paired fashion, i.e., a transaction between one client and one server might be accelerated using a particular client-side accelerator and a particular server-side accelerator. Accelerators might be clustered and meshed across a WAN, possibly allowing any accelerator to communicate directly with any other accelerator. While one accelerator might be described as a client-side accelerator and another accelerator described as a server-side accelerator, it should be understood that accelerators can be symmetric, such that data could be accelerated from the client to the server or from the server to the client. In addition, a given accelerator could be a client-side accelerator for one transaction and a server-side accelerator for another transaction, possibly involving the same network devices.

Accelerators can intercept client-server connections without interfering with normal client-server interactions, file semantics, or protocols. All client requests can be passed through to the server normally, while relevant traffic is optimized to improve performance.

Accelerator Architecture

FIGS. 1 to 6 are block diagrams of transaction accelerator implementations according to embodiments of the present invention.

As shown in FIG. 1, a networked client-server system 10 includes clients 12 coupled to servers 14 over a network 16, via client-side transaction accelerators ("CTAs") 20 and server-side transaction accelerators ("STAs") 22. Where the location of a transaction accelerator is not specific, it is referred to herein as a "TA", indicating that it could be referring to a client-side transaction accelerator, a server-side transaction accelerator, a peer transaction accelerator, or possibly even a transaction accelerator that is used by clients and servers (and possibly also peers). In the figures separate instances of an object might be called out with indices, such as CTA 20(1), CTA 20(2), CTA(n), etc.

As shown, a CTA 20 might serve one or more clients and multiple CTAs 20 might be implemented on a network. As used herein and unless otherwise indicated, the index "n" refers to an indefinite integer and each distinct use of the index might refer to a different indefinite integer. For example, FIG. 1 illustrates that there can be some number of CTAs and some number of STAs and there need not be a one-to-one correspondence. In general, the number of CTAs might be based on the number of clients, number of expected clients, network layout, etc., while the number of STAs might be based on the number of servers, the number of expected servers, network layout, etc. In some implementations, each server connects to an STA dedicated to that server. In some implementations, a plurality of servers might be coupled to a server farm manager 24 and in turn coupled to Internet 16 via an STA. In some cases, a client might interact with more than one CTA, as illustrated by line 27 in FIG. 1 and a server might interact with more than one STA, as illustrated by line 29 in FIG. 1.

Although not shown in FIG. 1, additional paths between clients and servers (also possibly between clients and clients and between servers and servers) might be present and bypass the accelerators. Such additional paths could be used to carry conventional traffic, such as transactions that are not likely to benefit from transaction acceleration. By routing such transactions around the accelerators, the state of the accelerators can remain focused on the accelerated transaction, for example, by not having the persistent segment storage (described below) of a TA storing segments from transactions not likely to benefit from transaction acceleration.

Though the accelerator might appear as an infrastructure device with network interfaces and so forth, it can be embodied almost entirely in software. This software can be delivered in an appliance form-factor, pre-configured and installed on a qualified server. For example, it might be provided as hardware and software, with software pre-loaded on a microprocessor-based server with appliance hardware running the Linux™ operating system, Microsoft Windows™ operating system, etc.

Figure 2:
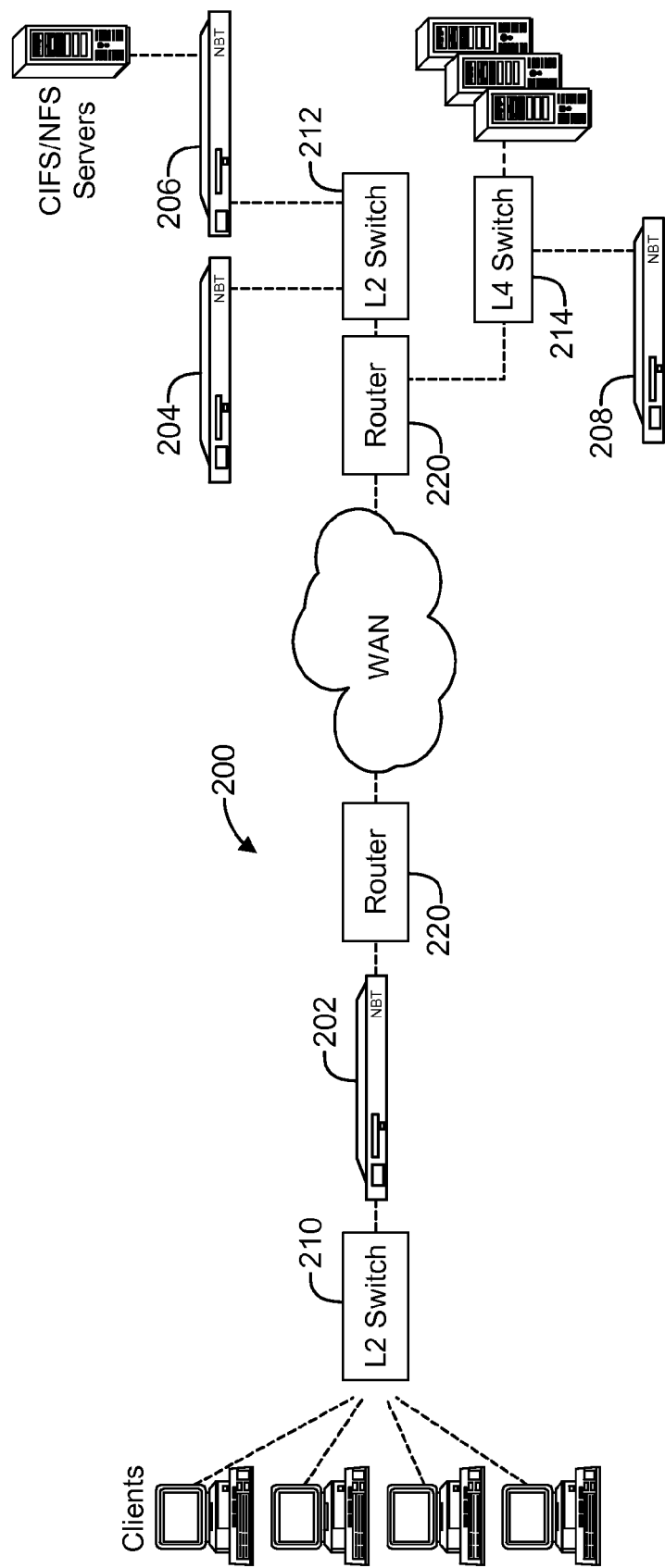
FIG. 2 is a schematic diagram of a network using transaction accelerators for accelerating transactions, possibly also for segment cloning.

FIG. 2 is a block diagram of hardware devices that might implement the blocks of FIG. 1. FIG. 2 shows a number of clients coupled to a CTA 202 via a Layer 2 switch 210 and a number of servers coupled to STAs 204-208 via Layer 2 switches or Layer 4 switches (e.g., Layer 2 switch 212 and Layer 4 switch 214). The CTA and STAs can communicate over a WAN via routers 220. Examples of servers and clients are shown, but other types of servers and/or clients could be used.

CTA 202 is typically installed in the path so that appropriate transport connections can be intercepted and processed. At the server side, however, there is more flexibility. As shown in FIG. 2, an STA may be deployed completely out of path (e.g., accelerator 204), in-path directly in front of the servers (e.g., accelerator 206), or logically in-path but adjacent to a collection of servers that are load-balanced by a Layer 4 switch (e.g., accelerator 208). Fairly generic device configuration models can be used, so that, for example, an accelerator can support other sorts of topologies and configurations and even potentially fit into unanticipated scenarios. In particular, the client-side accelerator can also be deployed out of path, whereby the accelerator is assigned its own IP address and clients communicate directly with the client-side accelerator using that IP address (much as a Web client can communicate directly with a Web proxy cache using the Web cache's IP address).

Figure 3:
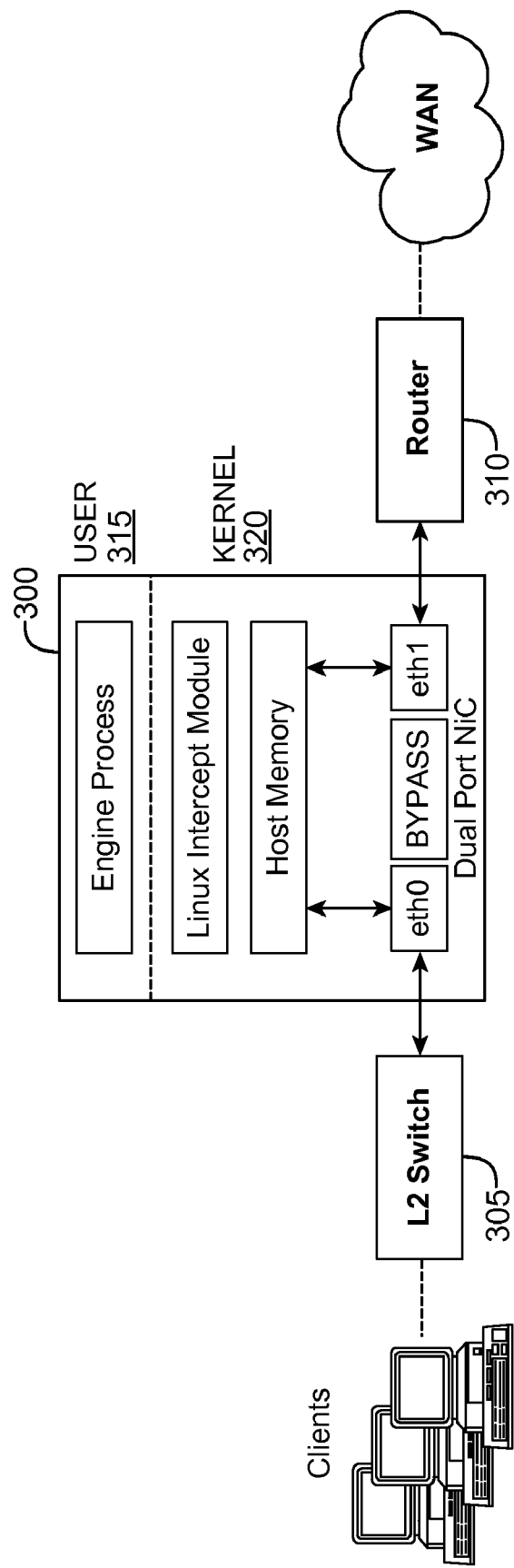
FIG. 3 is a schematic diagram of a transaction accelerator.

An accelerator may connect to a network with one or more network interfaces. When acting transparently and intercepting connections transparently, the accelerator could include two network interfaces. Alternatively, an accelerator could utilize a dual-port network interface so that the device could be inserted transparently into a network. In one such implementation, the engine process of an accelerator 300 operates above the lower network layers, as shown in FIG. 3. With such an implementation, the accelerator is between Layer 2 switch 305 and router 310 and functions as a link-layer relay or bridge between switch 305 router 310

Some dual-port network interfaces include physical bypass circuits with watchdog timers that fail-over when the device malfunctions. Using a dual-ported network interface, all traffic processed by the accelerator can thus be intercepted and delivered to a local proxy engine process running on the device, e.g., using the techniques described in McCanne IV. Likewise, any traffic that does not need to be processed by the accelerator can be simply forwarded from one interface to the other unmodified.

Variations of the accelerator might offer a range of different capabilities and hardware mixes. A low-end branch office device might be a single-CPU, 1U device with low-cost internal ATA disks. Datacenter devices might have higher-performance, multi-way CPUs with an option for external storage attachment, e.g., via FiberChannel or iSCSI. Some variants of the accelerator can be packaged as blades in a blade server or as software that could be installed on a client desktop or integrated into application server software.

In one specific implementation, a system employs an event-driven programming model that is SMP capable and is written in portable C++. The programming model is event-based with threads hidden behind the event model, providing the concurrency mechanism needed to benefit from SMP-equipped configurations.

Accelerator 300 might comprise a set of interdependent software modules: (1) a core data processing module that runs as a user-level process, handling connection processing and implementing the segment cloning and/or transaction prediction, (2) a set of user-level processes that handle administrative tasks such as on-line configuration, monitoring, watchdog capabilities, etc., and (3) a kernel module that provides the hooks to transparently intercept client-server connections. This is illustrated in FIG. 3 as user processes 315 and kernel processes 320.

Figure 4:
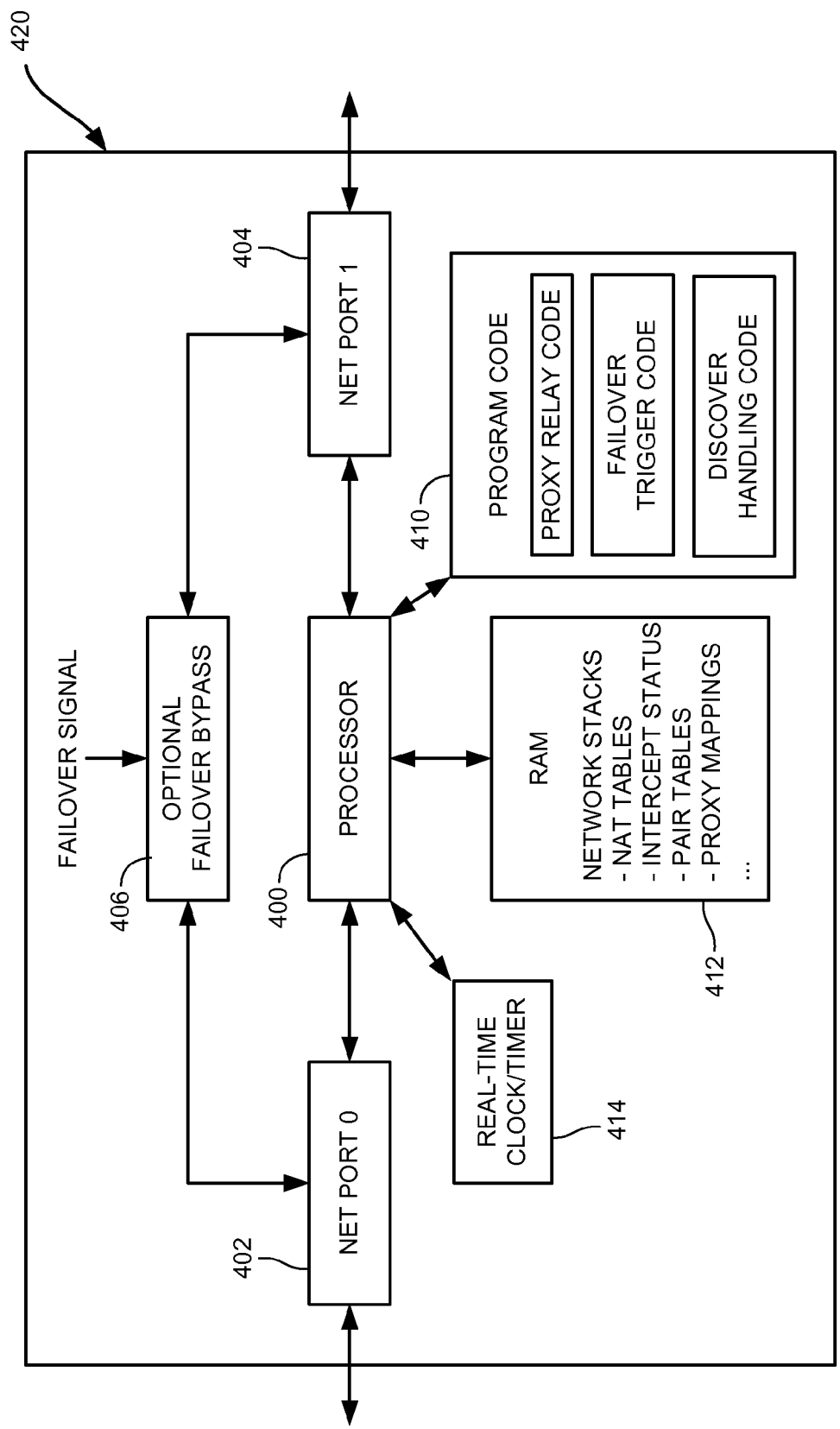
FIG. 4 is a schematic diagram of a proxy device as might be used in the networked systems shown in FIGS. 1-2.

FIG. 4 is a schematic diagram of a proxy device as might be used in the networked systems of FIGS. 1-2 and might be representative of a hardware implementation of that which is shown in FIG. 3.

FIG. 4 shows details of one example of a proxy device 420 as might be used in the systems described above. Proxy device 420 is shown comprising a processor 400 that interfaces to the network via network ports 402 (Port 0), 404 (Port 1). Also shown is an optional failover bypass module 406, program code 410 for holding code representing various functionality, random-access memory ("RAM") 412 for maintaining data structures used by processor 400, and a real-time clock/timer 414.

In a typical operation, proxy device 420 receives a packet at port 0, processor 400 might perform some processing, and the original packet or a modified packet is sent out on port 1. In response to a failover signal, such as a signal indicating that processor 400 is inoperative, optional failover bypass module 406 might receive packets at port 0 and output those packets unchanged at port 1 and receive packets at port 1 and output those packets unchanged at port 0.

Failover bypass module 406 might be a dual-port Ethernet NIC with a failover capability. The NIC allows proxy device 420 to be inserted into the path of a 100 BaseT or GigE connection, for example, and act as a transparent Ethernet relay. The proxy device can be inserted into the path between a WAN router and a LAN switch simply by unplugging the router from the switch, plugging it into one of the proxy device ports (e.g., port 0, port 1, etc.) and plugging the other NIC port into the LAN switch. In normal operation, traffic that is not intercepted by a proxy module would be simply forwarded out the adjacent interface by a kernel interrupt handler, much like an Ethernet bridge. Traffic that is processed locally is intercepted by proxy device kernel module and delivered to a local proxy handling process running in user space.

One potential limitation of this approach is that the device is now in the critical path of the network and represents a single point of failure. To address this issue, the dual-port NIC includes a failover mechanism that allows the NIC to automatically bypass the host under exceptional conditions. In particular, the NIC might include a physical bypass circuit built from mechanical relay switches that can short-circuit the two ports into a cross-over configuration in the absence of a signal (such as a heartbeat signal) indicating that the device is operative to process data. In normal operation, the relays are engaged and packets are processed by the host. If such packets are part of an optimized connection, they are diverted to the accelerator process on the local host. Packets that arrive at the host but are not part of an optimized connection are simply relayed across the NIC to the adjacent port. However, when an exceptional condition arises (software crashes, power fails, etc.), the relays become disengaged. As a result, the two Ethernet cables that are plugged into the NIC become physically interconnected in a cross-over configuration. A software crash is detected by the NIC using a hardware watchdog circuit on the board. If the watchdog circuit is not reset every second or so by the system software (i.e., because the software fails or the operating system crashes), then the NIC disengages the relays, which bypasses the device even if the power remains on.

Given the proxy device's in-path vantage point, it is able to transparently intercept any traffic that it desires. Toward this end, an operator configures the device with the TCP/UDP port numbers and/or application types that are to be intercepted and optimized. All traffic types that are not so configured are simply passed through the device unmodified. Connections that correspond to traffic types that are configured for interception are processed by elements that terminate the transport connection locally and process the client-server protocol messages using techniques described herein or their equivalent. Support for each application/protocol type can be thought of as a "software blade" that is installed in the proxy device.

A password-protected Web server might provide GUI-based administrative access to accelerator 30, including an assortment of configuration, monitoring, and logging capabilities. A command-line interface (CLI) might be accessible via ssh. The CLI can include a set of logging capabilities that can selectively enable log capture of many difference aspects of the running system. An SNMP agent might runs on an accelerator box and support a queryable MIB as well as a set of simple traps. The Web server UT, the SNMP agent, and the CLI processes can all communicate with the core accelerator process via a local RPC interface (as well as shared memory, in some cases). A device's configuration can be stored in a single XML configuration file. These configuration files can be exported from and imported into the device via the CLI, admitting a model where centralized scripts can be developed (by the customer, an integrator, or consulting services) to control and/or configure large numbers of boxes from a central location.

Variations of a Basic Implementation

Where one CTA interacts with one STA and requests are received from multiple clients connected to that CTA, the corresponding STA routes each client request to the server(s) to which the request is directed. However, the accelerators might be more closely coupled to their clients/servers, such that all, or nearly all, accelerated transactions from one client pass through that one client's CTA, and all, or nearly all, accelerated transactions to one server, pass through that one server's STA. Additionally, in some implementations, accelerators share state, so that transactions in one TA might benefit from segments stored at another TA.

Client connections can be routed to a CTA in a number of ways, similar to how other proxies function with respect to clients. For example, redirection using the Domain Name System (DNS) can be used to cause a client to resolve to the IP address of the CTA instead of the server and thereby route requests to the CTA. Alternatively, the client or the client's application could be statically configured to use a particular CTA or a set of CTAs on a per-application basis. Once the client connection arrives at a CTA, the CTA can then contact the appropriate STA via a lookup process that could work in a number of ways. For example a mapping table (maintained on a centralized and query-able database or configured into the CTA) could be used to direct the CTA to the appropriate STA; or information conveyed in the transaction could allow the CTA to discover which STA to use; or configurable policies could be programmed into the CTA indicating which transport ports should be relayed to which STAs. Likewise, the STA could use similar lookup processes to decide which server to contact for a new client connection arriving from a CTA. The STA could also use data in the transactions to infer what server to connect to (e.g., an HTTP Web request contains the server's identity, as does a connection setup request for a CIFS file server connection).

It should be understood that while network 16 shown in FIG. 1 is the Internet, a global internetwork of networks in common use today, other networks can be substituted therefor. For example, network traffic over the Internet can travel through public networks and is largely based on TCP/IP (Transmission Control Protocol/Internet Protocol) packet switching. However, the embodiments of the invention shown herein might also be used on networks that are not public, such as intranets, extranets, and virtual private networks. The embodiments might also be used with WAN's, LAN's, WAN/LAN couplings, wireless connections, mobile links, satellite links, cellular telephone networks, or any other network where responsiveness is a concern. In addition, while TCP/IP is the most common packet switched protocol today and thus serves as a good example, other network protocols might be used (Ethernet, etc.). As for overlying protocols, the clients and servers described herein (and peers, as described below) might use HTTP, FTP, SNMP, POP3, IMAP, SMTP, NFS, CIFS, RPC, or other open or proprietary protocols for transport of data.

Pairing and Pair Finding

In a number of the examples herein, a client-side accelerator interacts with a server-side accelerator where the two accelerators are assumed to know about each other and to be in network proximity with the client or server for which the accelerators are supporting a transaction. As described below, techniques that accelerators could use to find other accelerators in a path between a client and server might be techniques that are used for any accelerator to find another accelerator. Alternatively, other techniques might be used, such as explicit maintenance of a set of pointers in each accelerator by an administrator.

For example, a mapping from a destination server address to its nearest accelerator might be maintained in a table at the client-side accelerator. This table could be configured by the operator using explicit knowledge of the deployment. However, while such manual configuration provides a great deal of flexibility, it also burdens the operator not only with a fairly complicated setup process, but also requires constant maintenance of these tables as the server and network infrastructure evolve. A better approach is to discover the mapping automatically, as the system taught in McCanne IV allows.

Example Transaction Processing Flow

In a common transaction, a client sends a request for a file, data block or other unit of data to a server and the server responds with data responsive to the request, if possible. For example, where the client is a computer running a computer-aided design (CAD) program and needs a CAD file stored on a file server, the client might formulate a request for the file, encapsulate the request as a message and send that message over the network to the appropriate file server. The file server might then perform authentication, check for the existence of the file at the file server and, if the client is authorized to have the file and the file exists, the file server might create a message or a set of messages or packets containing the data of the file requested and send those messages/packets to the client that made the request.

Using accelerators might improve the responsiveness of the transaction, i.e., accelerate the transaction. In a typical environment, the links between clients and CTAs are fast links, such as local area network (LAN) links and the links over network 16 are slower in terms of latency and bandwidth. In many cases, low bandwidth might result in high latency, but those factors can be independent such that it is possible to have high bandwidth but still have high latency. Other factors might affect responsiveness and/or bandwidth cost, such as the reliability of the link and bandwidth usage.

In a typical file request transaction using the accelerators, a client initiates a transaction with a server by sending a request message. As explained above, if the transaction involves a small number of bits or other factors exist, using accelerators might not get the transaction done any faster and thus the transaction might go over a conventional packet path. However, the transaction might go through the accelerators anyway, which might be useful, as explained below, so that the accelerators have a more complete view of the traffic. As one example, if a client request passes through the CTA, the CTA can remember the request and match up the response to the request to provide additional services to the client. The CTA might also use the requests to guess at what future events might be and use those guesses to further optimize the transaction acceleration process.

When a server receives a request, it formulates a response to the request, and sends it towards the client via the STA to which it is coupled. In a basic implementation, each client is coupled to one CTA and each server is coupled to one STA, but in more complex implementations, a server might be coupled to more than one STA and use some optimization logic to determine which STA to use at which time. A client might be coupled to more than one CTA and use some optimization logic to determine which CTA to use at which time.

The CTA could send the request to the appropriate STA unchanged and/or the receiving STA could receive the response from a server and send the response to the appropriate CTA unchanged. However, where the request or the response comprises a large amount of data, significant transaction acceleration might be expected in such instances if the data is "compressed" as described herein by storing segments of data at the receiving end and replacing data at the sending end with reference to the stored segments. In some cases, such substitution does not accelerate a transaction, but might still have benefits, such as "priming the pump" with data, so that the receiving ends have segment data that can be used later in reconstructing transmitted data that references those segments. Such concepts are more clearly described with reference to FIG. 5.

Figure 5:
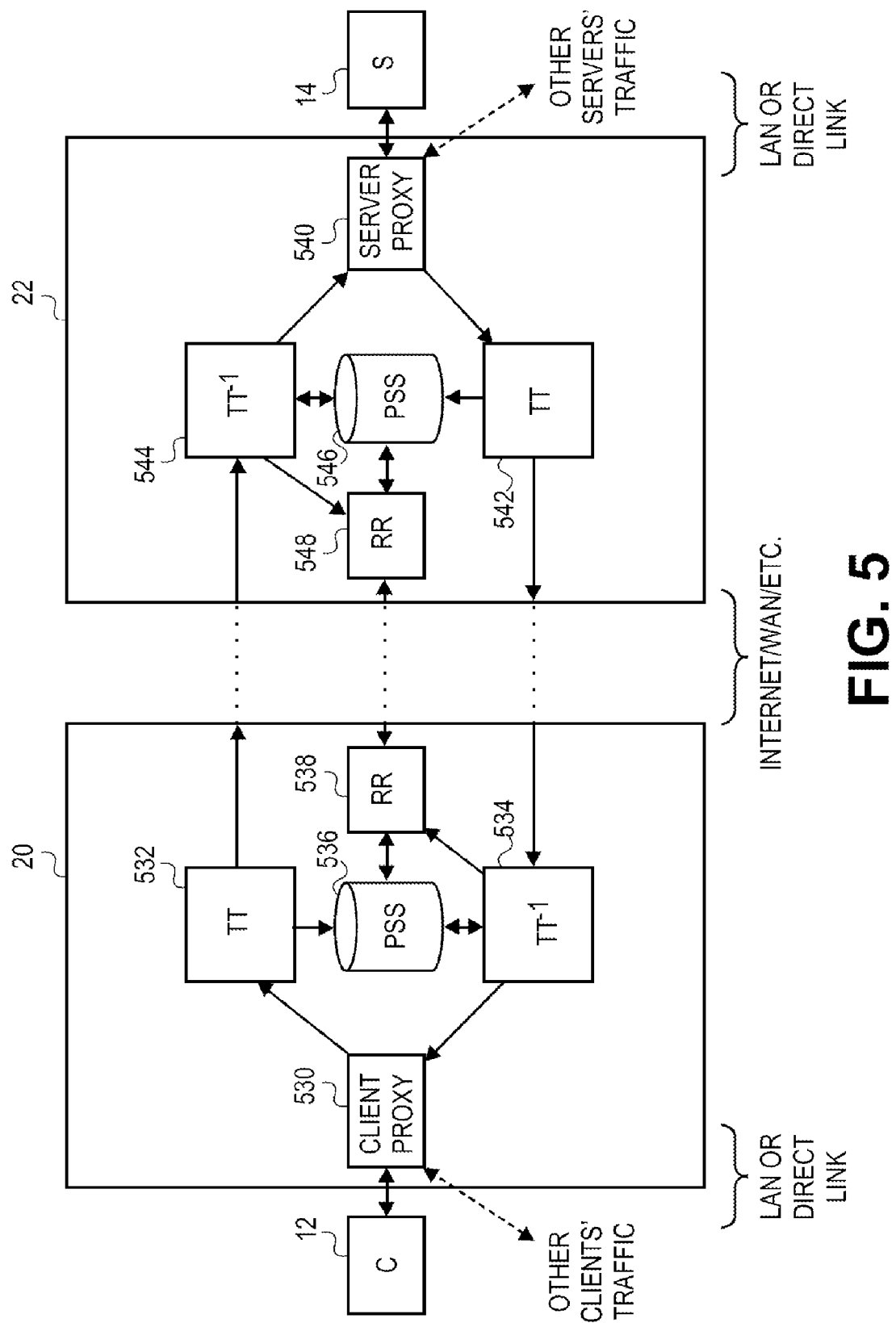
FIG. 5 is a block diagram of the system of FIG. 1, showing a client-side transaction accelerator ("CTA") and a server-side transaction accelerator ("STA") in greater detail and, for space considerations, showing less detail of the overall system.

As will be shown in FIG. 5 and other figures in more detail, transaction requests and responses are routed through accelerators instead of going directly from a client to a server. Of course, in some configurations, a CTA and client and/or an STA and server are tightly integrated such that an explicit rerouting is not required. Nonetheless, it is useful to assume that the data is routed, at least because it clarifies that traffic from a client can route through a CTA and traffic from a server can route through an STA, but traffic can also bypass the accelerators. Since the accelerators can operate at the transport network level, they can operate on transactions as the unit of work.

One configuration for easily routing traffic to be accelerated is via the use of connection proxies. Thus, a CTA would serve as a connection proxy for the server with which a client is entering into a transaction and the STA would serve as a connection proxy for the client to which the server is responding. It should be understood that a TA system could be implemented with symmetric accelerators, e.g., where a CTA and an STA are arranged to be substantially similar except possibly that the CTA is set up to expect to encounter new transactions from a client, but not from an STA and an STA is set up to not expect to encounter new transactions from a server, but to expect them from a CTA.

Elements of an Example Accelerator

FIG. 5 is a block diagram of portions of system 10, showing a CTA 20, an STA 22 and their interconnections in greater detail. While only one client and one server are shown, it should be understood that the various elements of FIGS. 1-4 might also be present, even if not shown. For example, CTA 20 might be handling transactions from more than one client and STA 22 might be handling transactions with more than one server. As illustrated there in FIG. 5, client 12 is coupled to a client proxy 530 of CTA 20. While other forms of multiplexing and de-multiplexing traffic to and from clients could be used, in this example a client proxy is used to receive data for CTA 20 from one or more clients and to send data for the CTA 20 to the one or more clients. The other elements of CTA 20 shown in FIG. 5 include a transaction transformer (TT) 532, an inverse transaction transformer (TT$^{-1}$) 534, a persistent segment store (PSS) 536 and a reference resolver (RR) 538. Server 14 is coupled to a server proxy 540 of STA 22, which is shown including elements similar to those of CTA 20, such as a transaction transformer (TT) 542, an inverse transaction transformer (TT$^{-1}$) 544, a persistent segment store (PSS) 546 and a reference resolver (RR) 548.

Client 12 is coupled to client proxy 530, which is coupled to TT 532 and TT$^{-1}$ 534. TT 532 is coupled to PSS 536 and to the network between CTA 20 and STA 22. TT$^{-1}$ 534 is coupled to PSS 536, client proxy 530, RR 538 and to the network between CTA 20 and STA 22. RR 538, as shown, is also coupled to PSS 536 and to the network between CTA 20 and STA 22.

On the other side of the figure, server 14 is coupled to server proxy 540, which is coupled to TT 542 and TT$^{-1}$ 544. TT 542 is coupled to PSS 546 and to the network between STA 22 and CTA 20. TT$^{-1}$ 544 is coupled to PSS 546, server proxy 540, RR 548 and to the network between STA 22 and CTA 20. RR 548, as shown, is also coupled to PSS 546 and to the network between STA 22 and CTA 20.

It should be understood that some or all of the elements of CTA 20 and/or STA 22 may be integrated within CTA 20 or STA 22, such that explicit connections between the elements are not needed, but a logical coupling would still exist. For example, CTA 20 might be implemented entirely as a single program with data memory, program memory and a processor, with the program memory containing instructions for implementing the client proxy, the TT, the TT$^{-1}$ and the RR, when such instructions are executed by the processor. In such an implementation, the data memory could be logically partitioned to hold variables needed for the processor execution of the instructions, state of the client proxy, TT, TT$^{-1}$ and RR, as well as the contents of the PSS. The same could be true of STA 22.

The PSS can be a disk subsystem, a memory subsystem, or portions thereof. The PSS can also be a memory subsystem with disk backing store, a database server, a database, etc.

Of the connections shown, arrows indicate the most common direction or directions of flow of information, but information could flow in additional directions and information flow in a single direction might involve data flowing in the reverse direction as well. For example, TT 532 generally sends information in the direction of TT$^{-1}$ 544, but data such as confirmations, handshakes, etc., may flow from TT$^{-1}$ 544 to TT 532.

Some of the connections are shown as dotted lines spanning between CTA 20 and STA 22 (e.g., between the TT's and TT$^{-1}$'s and the RR's). Although they are shown by separate lines, it should be understood that these lines can represent distinct network connections, or separate packet flows over a common network connection, or even shared packets among the logical connection shown. Thus, dotted line connections might be independent connections comprising more than one port number and/or more than one IP address, but they might also be three logical connections over one packet-switched connection, such as via a common path using common port numbers and common IP addresses.

The undotted lines between the client and the CTA and the server and STA are labeled as "LAN or Direct Link" to indicate that those connections are likely higher performance (latency, bandwidth, reliability, etc.) than the connections between the accelerators labeled "Internet/WAN/etc."

Examples of the former include LANs, cables, motherboards, CPU busses, etc. The system is still operable if the connections between the accelerators are higher performance connections, but some of the benefits of transaction acceleration might not be seen. For many of the examples herein, it is assumed that an accelerator has at least two network ports, one of which is coupled to a higher performance network and one of which is coupled to a lower performance network and the accelerator is used to improve transaction processing such that the transaction happens as if the lower performance network has a higher performance.

Segmenting Payloads

In operation, the CTAs and STAs examine the payloads of their transactions where warranted and store/cache strings or other sequences of data ("segments") derived from those payloads using a unique naming scheme that can be independent of the transaction. When sending the payload from one TA to another, the TA may replace the segment data with references to the segment data. One indication that this replacement should occur is when the segment data is such that the sender can expect that the receiver would have that uniquely named segment data, either because it appeared in an earlier transaction or was sent through other processes to the receiver, however other indications or no indication may be used to determine whether or not to replace the segment data with a reference. In some cases segmentation and substitution will not be performed where acceleration is not expected, such as where the amount of data involved is small. The segmented portions of the transaction can be any portion of the data sent, so long as the transaction is still identifiable at the receiving end enough to be reconstructed.

Because the segments can be uniquely named and the names can be independent of the transaction, a segment appearing in one transaction can be stored at both accelerators and used for accelerating other transactions. For example, where a client initiates a number of file request transactions, if the files have data in common, that common data might be formed as a segment and after the first such segment is transmitted, all further requests for files with the common data would have a segment reference substituted for the common data, to be replaced by the CTA before sending the reconstructed file to the client making the request. Similarly, where one CTA handles more than one client, the segments for one client can be used for another client.

Where the transactions are other than file transactions, analogous acceleration is possible. For example, where a CTA is coupled to an e-mail client and an STA is coupled to an e-mail server, an e-mail attachment that many clients are requesting via the CTA can be represented as a segment after the CTA has obtained the contents of the attachment and then each subsequent time a client requests the attachment, the responding STA will replace the attachment with the segment reference and the receiving CTA will replace the reference with the stored attachment. Since the attachment is stored as a segment independent of the transaction, the same segment data might be found in a file transaction, additional e-mail transactions or other transactions, and in each case, the sender replaces the data with the segment reference and the receiver replaces the segment reference with the segment data.

Note that there are several advantages of such an approach. Unlike caching, where a transaction result is cached and reused when that transaction is repeated and the cache is not invalidated, a segment can be used in several unrelated transactions and segments need not be bounded at arbitrary cut points. Since segment names and content can be independent of any particular bit stream or transaction, they can survive in the persistent storage for arbitrary amounts of time, even if system components crash and reboot, new components are added into the mix, the segment store is erased, etc.

The receiver can obtain the segment data for inclusion in its persistent store and/or for decoding before, during or after receiving the transmission of a sequence of references from the sender. Preferably, the segment data is obtained in ways that improve the responsiveness of the transaction, when possible. For example, if a need for a segment can be anticipated, the segment data can be sent before it is needed, so that when it is needed, it can be obtained faster. However, in some cases, such as where a receiving TA does not have any stored segments and has to obtain all of them during the transaction, transaction acceleration might not occur since the total amount of data that needs to be sent is not reduced.

Referring again to FIG. 5, assuming a request flows through the accelerators, client 12 would send the request to client proxy 530, which would then send it to TT 532, either modifying the request or merely forwarding it. TT 532 determines how to transform the request, storing segments and references thereto in PSS 536 as needed (explained in more detail below), and sends the transformed or unmodified request to $TT^{-1}$ 544, which performs any needed inverse transformations (explained in more detail below) and sends the request to server proxy 540, and in turn to server 14. An analogous path is taken for the response.

Where a message (such as a client request message or a server response message) has been transformed, the inverse transaction transformer uses the contents of its PSS to reconstruct the message. In a simple case, the TT for a sender (client or server) transforms a message by identifying segments of the message, replacing identified segments with references and storing the reference-segment pairs in the PSS. Some techniques for intelligently segmenting data based on content are described in McCanne II including hierarchical segmentation, wherein replaced segments are replaced with references and segments might be formed of sequences of references and those are in turn replaced with references. By sending references instead of segment data, the total traffic between accelerators during the transaction is reduced, or perhaps the bulk of the traffic is moved to a less critical time or less critical path.

Where the receiving TA has in its PSS the reference-segment pairs used by the sending TT, the receiving $TT^{-1}$ can regenerate the sent data by replacing the references with their corresponding segment data. The receiving TA can obtain segment data for storage in its PSS from a side channel or as part of the traffic from the sending TA. Thus, the data transmitted from the sending TA to the receiving TA may include both references to segments and also "bindings" representing the mapping from a reference to the segment data. Of course, if each time a segment is replaced with a reference and both the reference and the binding are sent, not much bandwidth will be saved, and in fact the bandwidth will be increased. However, where the sender suspects the receiver already has the binding, the sender can omit the bindings, resulting in substantially less traffic. Note that exact knowledge of what the receiver has is not required to achieve the benefits from this process.

In some cases, all of the data needed to fulfill a request is present at the client's PSS, so that if a caching scheme were used instead, with the PSS as the cache, no message would need to be sent to the server at all. However, this would require that the CTA be sufficiently intelligent enough to understand the client transaction and construct a proper response from the data that is present in the PSS. This is a difficult problem in general, especially when many different application types and client-server scenarios are proxied through the CTA and certain client-server interactions simply are not amenable to caching (e.g., file system write operations, database update transactions, file deletion, etc). Thus, it is preferable to use the accelerators described here and for the messages to be sent to the server anyway, so that the inconsistencies of caching schemes can be avoided. For example, if a file server receives all the requests for a file, even if the entire file content is present at the client, the server can track requests and the server can implement complex operations such as file locking protocols even though no substantial file data need be transmitted across the network.

In preferred embodiments, the above benefits accrue automatically. For example, the STA segments each transaction payload and replaces segments with references. For the segment data the STA suspects the CTA has, the STA uses the references that it knows the CTA has for those segments. When data changes at the server, rather than try to modify the existing segments in the PSS, the STA creates new segments representing the changed data and can assume that the CTA does not have those segments. In this case, the STA uses new references to the new segments representing the changed data. At the receiving TA (the CTA, in this example), the references to older data might be resolved from bindings stored in the receiver's PSS, but for the new, changed segments, the references are resolved from bindings included in the stream from the sender. Those bindings can then be stored by the receiver's $TT^{-1}$ into the receiver's PSS, so that they are available for later transformations by that receiver.

In addition, because references are globally unique (as described below), they can be used by any TA in the network, not just the STA and CTA pair as described in this example. For example, the CTA might communicate with a different STA and use a reference allocated by the former STA. If the two STAs communicate in the future, they immediately enjoy the benefit of the segment binding that has been disseminated to both devices.

Several schemes are usable to ensure that each named segment has a unique name throughout the system at any given time (i.e., that no two segments with different data are erroneously assigned the same name). In one approach, every segment reference is generated as a large random number, where the number of unique references is much lower than the space of all possible large random numbers. This scheme is less than desirable because a small possibility exists that two segments will have the same segment reference but different segment data, which would cause a receiving TA to erroneously reconstruct a message with the wrong data.

Another scheme is to generate hashes from the segment data so that each segment reference is a hash of the segment data and different segment data will result in different hashes, except in very rare cases. Yet again, the rare cases will always be problematic, as long as two degenerate segments with the same reference but different segment data exist in the system. Unlike the random number case, this problem will recur every time that particular data pattern exists in the data stream.

One simple approach that avoids the above problems is for each sending TA to generate a segment reference from the combination of a unique ID (such as the host IP address, when globally unique IP addresses are used throughout the network, the host MAC address, an assigned unique identifier, or other means) and a sequential number. In most implementations, the maximum number of unique sequential numbers is bounded, and thus will eventually need to be reused. However, a name space can be made effectively unbounded by using a large enough label number space that the supply could last millions of years and no special handling would be needed. The large labels could be compressed to provide for small footprints for the labels.

Since labels will be allocated sequentially and because the corresponding segments will often appear in the same sequence, very good compression of the labels can be achieved in practice (not just across the network but also in the data structures that represent strings of labels that are invariably employed throughout the system). Additional compression is also possible on the sending accelerators output stream. For example, where the receiving TA can identify the sending TA and the sending accelerators references include the sending accelerators unique ID, that ID need not appear in the sent data, as the receiving TA would know what ID to use in forming the references (although, in general, extra information must be communicated when a sending TA references not just its own bindings but bindings and labels that originate from other accelerators). One other advantage of this approach is that a TA can identify the source of each of the segments in its PSS from the ID component of the segment reference, for use in statistical analysis, diagnostics, and the like.

In a system where the labels are intended to be reused during the expected lifetime of the system, the system preferably includes a mechanism to "expire" a reference binding, with this expiration being propagated to all accelerators in a network. One approach is to timestamp each segment, so that it has a fixed lifetime that can easily be inferred by each component in the system that uses the segment. If time stamps are assigned to labels in a coarse-grained fashion (e.g., the timestamp changes just once a day), then label compression eliminates most of the protocol header associated with assigning and communicating timestamps. A TA can thereby infer when it is safe to reuse a particular set of labels.

Yet another alternative for managing the segment name space is to have central allocation of unique references. In such cases, a sending TA would request a reference, or a block of references, from a source that guarantees that the references are unique. In addition, each allocation could be assigned a maximum time-to-live so that the allocation of references, or blocks of references, could be implicitly reused.

Reference Resolution

It may happen that a sending TA assumes a certain binding is present at a receiving TA when it is not. This might occur where the receiving TA has a PSS overflow, corruption, loss of power, etc., or the receiving TA intentionally removed the binding. In such cases, the receiving TA can obtain the segment data without aborting or having to report the transaction as a failure. This allows the system to gracefully deal with missing data due to a disk getting full, disk failure, network failure, system crash, etc. If a sending TA assumes that a receiving TA has a binding, the sending TA will send a message using that binding's reference, but will not include the segment data of the binding. When the receiving $TT^{-1}$ tries to resolve the reference, it will fail. In those cases, the receiving $TT^{-1}$ sends a resolution request to its RR, which then makes a request to the sender's RR. The $TT^{-1}$ can just block and restart when the needed data is received, perhaps due to an event trigger signaling that the data is available; this process could be transparent to the $TT^{-1}$ (other than a delay in getting a response). Once the segment data is received at the receiver, the receiver's RR can either provide the data to the receiver's $TT^{-1}$ or just put it in the receiver's PSS, where it can be accessed by the receiver's $TT^{-1}$. As the sender's TT adds bindings to its PSS as appropriate, it maintains those bindings for a guaranteed minimum amount of time; as such when it is replacing segment data with references, it can be guaranteed that when the receiver's RR makes a request of the sender's RR for that segment data, it will be present in the sender's PSS, provided the guaranteed "lifetime" of a segment at the sender is greater than the maximum amount of time the receiver might require to make a segment request.

Session Flow and Multiplexing

Figure 6:
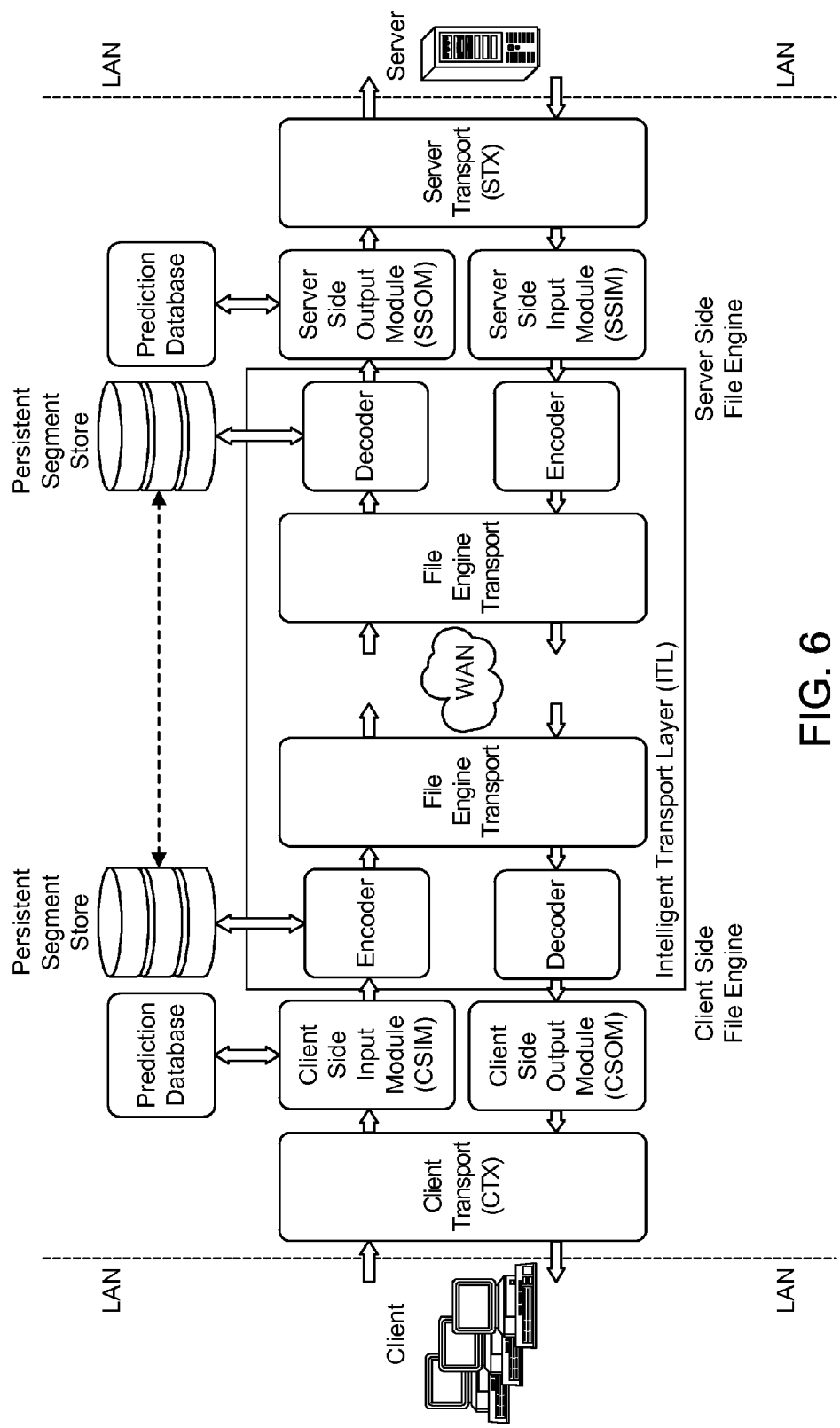
FIG. 6 is a schematic diagram of a network path between a client and a server including a pair of transaction accelerators separated by a network with WAN-like characteristics, wherein the transaction accelerators include transaction prediction and segment cloning.

Once an accelerator or pair of accelerators intercepts a client-server connection using the techniques described in McCanne IV (or any other technique), various modules in the accelerator are engaged to manage the flow of data to and from the clients and servers and into and out of the optimization stages within the accelerator. FIG. 6 illustrates a processing pipeline whereby a client and server connection has been successfully intercepted. Once intercepted, the client communicates directly with a client transport module (CTX) in the client-side accelerator and the server communicates directly with the server transport module (STX) in the server-side accelerator. Presuming the accelerator utilizes network address translation (NAT) as described in McCanne IV, then even though the client is communicating with the accelerator over a TCP connection terminated at the CTX, it instead believes it is communicating directly with the server. Similarly, the server believes it is communicating directly with the client.

It is also possible for the server to connect to the server-side accelerator IP address rather than the NAT'd client address when the server-side accelerator is not directly in path, but this discussion assumes transparent operation at both the client and server sites. The CTX and STX modules can handle all communication with outside clients and servers including connection management, flow control, buffering, and so forth.

For each incoming stream (of TCP segments or UDP datagrams or variations thereof), the Client-Side Input Module (CSIM) performs protocol-specific processing, e.g., performing transaction prediction and providing certain key hints to the segment cloning layer to improve overall performance. Once the CSIM decides that a client request (either synthetic or actual) should be forwarded toward the server, it passes it on to the Intelligent Transport Layer (ITL), which employs segment cloning to transform the request into a thin transaction envelope (described below). Of course, where transaction prediction is used but segment cloning is not used, that transformation would not occur. The Encoder and Decoder modules implement the segment cloning scheme by processing their input against the persistent segment store and implementing the necessary protocol machinery to ensure that segments are properly transmitted and distributed.

The transaction envelope is in turn handed to the accelerator Transport Multiplexer (TMUX), which transmits the message to the appropriate server-side accelerator. Once there, the server-side TMUX delivers the request to the Server-Side Output Module (SSOM), which processes the request and relays it, perhaps after modification. The STX, in turn, handles communication with the origin server. The data flow in the opposite direction, from server to client, is analogous.

In many possible embodiments, the TMUX implements a virtual connection layer wherein multiple transport connections are multiplexed over a single physical transport connection between pairs of accelerators. This layer provides a set of services analogous to the UNIX™ socket interface: connection setup and teardown, multiplexing of channels, reliable transport, etc. It also provides the foundation for implementing bandwidth policies so that the device may be configured with an aggregate rate limit by the operator.

In these embodiments, the TMUX transport multiplexes all traffic (between a given pair of accelerators) over a single transport connection. As such, this connection, while typically based on TCP, could be instead based on other types of reliable transport protocols where customer environments would benefit. For example, the TMUX TCP transport could be modified with extensions to support high-speed TCP for Large Congestion Windows (as described in Internet Draft draft-floyd-tcp-highspeed-02.txt, February 2003). This would allow customers who have purchased high-speed WAN links (e.g., OC-3's) to fully utilize them even with legacy applications that deploy legacy TCP implementations. As described above, just doing this could have a dramatic impact on wide-area network performance. By leveraging accelerators as an intermediary between existing clients and servers, no forklift upgrade is required to touch every end-host's legacy TCP stack.

In other embodiments, the TMUX transport distributes network data across multiple, parallel transport connections. For example, large amounts of data from a single client-server connection could be striped across multiple TCP connections to provide increased throughput compared to using a single TCP connection.

One approach for implementing the TMUX module is to add a virtual connection header to each message that flows from a CSIM to an SSIM and vice versa. The virtual connection header contains a connection identifier that uniquely determines the CSIM/SSIM pair on both ends of the multiplexed communication channel. This abstraction allows multiple CSIMs to send messages to their respective SSIMs and in turn relay the messages to/from the appropriate servers (and vice versa).

The client/server-side input/output modules can perform needed protocol specific optimizations. In particular, the client-side modules and server-side modules work in concert to implement transaction prediction, as some predictions are more appropriately carried out at the client end while others are more suited to the server end. In addition, the modules can communicate with one another out of band and coordinate their actions in a way that optimizes the overall performance outcome.

Example Structure of a Persistent Segment Store

FIG. 7 contains an illustration of data organization of a bindings table of a simple PSS. As shown there, the bindings table stores a plurality of bindings, such as ($R_1$, $S_1$), ($R_2$, $S_2$), etc., where $R_i$ is the reference label for the i-th binding and $S_i$ is the segment data for the i-th binding. A timestamp for each binding might be used for aging the bindings. The binding records might include other fields not shown in FIG. 7, such as those listed in Table 1 and/or similar or additional fields, possibly in addition to other tables, data structures, objects and/or code.

TABLE 1 number of times accessed
last access time
last modify time
lifetime
encoding method identifier (e.g., unencoded raw data, run-length encoded, MD5 encoded, encrypted)
fingerprint
error correction data (if not interspersed with segment data)
indication of the sender that created the binding (the binding "owner")
creation time (useful for timing out segments, such as by using the lifetime field) other fields Some additional data structures might include an index of references, an index of other fields, an index of segments, etc., for searching or otherwise processing the contents of the PSS. Segments could be indexed in many ways that could be useful for the encoding process, but one embodiment builds an index of segments where a well-known hash, computed over all of the data that comprises the segment, is used as the key. If the encoding method identifier is used, segment data can be encoded for error correction, encryption, etc.

For some segment data, it might be suitable to compress the segment data to reduce the storage needs of the PSS and the transmission overhead needed to pass bindings around. In some cases, the encoding method is fixed and known, so the encoding method identifier is not needed. For example, rather than transmitting and caching verbatim segments (i.e., segments that literally represent substrings or subsequences of the transaction data), the sending TA can transmit invertible functions of the segments, e.g., forward error correction encoded blocks of segments, encryptions of segments, signatures of segments, or the like. This would allow the receiving TA to decode different segments from a common pool of properly-encoded data, where if certain portions of the encoded data were lost or corrupted, the original segments can still be reconstructed, thus adding error-correction to the link without requiring changes at the clients or servers.

Other fields might be present in the PSS for tracking which segments might be known by which recipients. In some implementations, the sender just segments data and creates references independent of what the receiver might be able to do with the results, but in other implementations, a sender maintains information usable to determine whether a receiver might have a particular binding, such as by tracking which receivers previously received which segments. Storage for such information could be optimized by recording which receiver(s) have which segment(s) in a Bloom filter (i.e., a bit vector indexed by the hash of the destination into the vector giving a rare false positive but never giving a false negative).

Some implementations might use a heuristic such that a server proxy includes a segment binding only when it creates a new entry and other client proxies that need the segment will have to request it, as only the first client proxy will get the binding for the new segment automatically.

A TA might include routines for PSS housecleaning, such as a heuristic that says to delete all segments in a client-side PSS related to a particular file on a particular server when the client closes the file. The server-side PSS might also delete the corresponding segments, or defer the housecleaning for those segments until all clients close the file. Other housecleaning might involve deleting segment entries that have exceeded their lifetimes or have not been used for a while. Other heuristics might indicate when a particular segment binding is to be used and discarded. Yet other heuristics can use a first-in first-out (FIFO) method, which would discard the oldest segments. Another heuristic would discard segments that are the lest recently used (LRU).

The arrangement of the PSS has a number of benefits, some of which should be apparent upon reading this disclosure. Because segmentation can occur at varying cut points and the segments can be independent of the transactions, the segments might survive in the PSS for arbitrary lengths of time and be used for transactions entirely unrelated to the transaction in which the segment was created and stored. Because the segment references are unique for unique segment data, a recipient can always identify correctly the segment data for a segment reference (if the recipient has the segment). This is better than merely caching results. It is also an improvement over compression with localized signal statistics, such as building adaptive codebooks and the like. Segment names and content are independent of any particular bit stream, even if system components crash and reboot, new components are added into the mix, the persistent segment store is erased, etc. It should be understood that "persistent" as used to describe the PSS does not mean that the segments are permanently stored and can therefore never be purged; just that at least some of the segments persist at least beyond one transaction.

Encoding and Decoding

Figure 8:
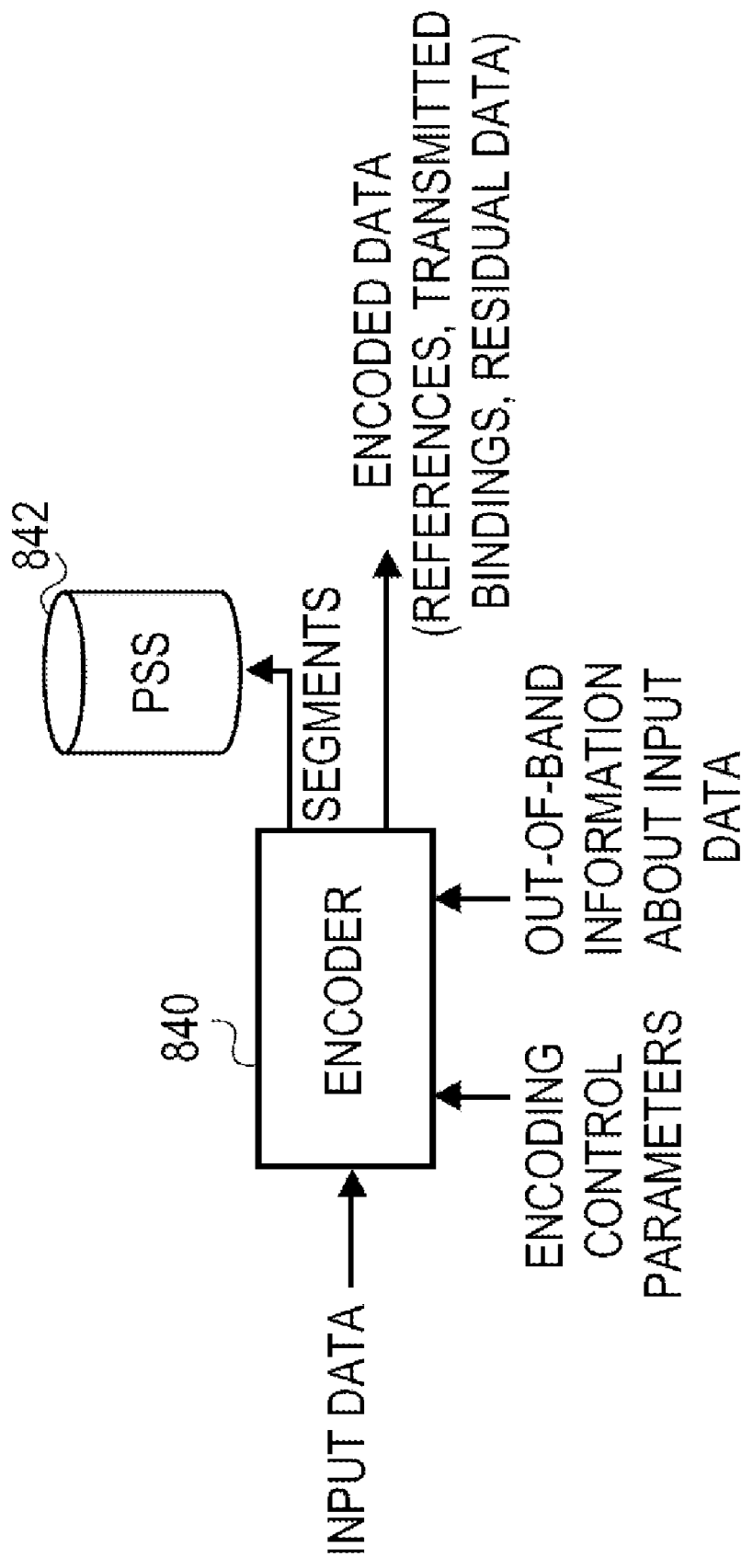
FIG. 8 is a block diagram of an encoder as might be used in the transaction transformers ("TT") of FIG. 5.

FIG. 8 illustrates an encoder 840 and a PSS 842. The TT for a TA might be just encoder 840, but the TT might also include other functionality or elements. As shown, encoder 840 has an input for data to be encoded, and control inputs for encoding control parameters and out-of-band information about the input data. Encoder 840 is shown with outputs for encoded data and segment bindings for storage in PSS 842. In operation, encoder 840 would process input data, identify segments of data, replace the segment's data with a reference, provide the segment data and a segment reference to PSS 842 in the form of a binding, and output the encoded data. As shown in FIG. 8, the resulting encoded data might comprise references, bindings and residual data (such as data that could not be efficiently represented with references). Herein, a piece of residual data is also referred to as an "unreferenced segment". In some embodiments, a distinction exists between data that is segmented but not referenced and data which is not segmented. In the former, there is a defined segment beginning and end, but the segment contents are not replaced with a segment reference, whereas in the latter, there might not be a segment beginning or end, as such. For simplicity of the following description, the distinction is ignored.

Another output of encoder 840 is the segment bindings, for PSS 842 for use in decoding incoming data (or for supplying to other accelerators on request). Control inputs to encoder 840 might include a target segment size and out-of-band information might include parameters indicating such things as the default lifetime of segments, information about the data source, etc. The target segment size is a parameter that controls the average size of segments generated by the segmentation process. In general, segments vary in length with a certain distribution of sizes, and the target segment size controls the average such size generated by the segmentation process. While segment size could be fixed, it is preferable that the segment size be allowed to vary, so that segments match up more often than if the data handled by the system is segmented into arbitrary fixed segments.

The TT puts the bindings it creates in its own PSS for use in decoding, but also so that the "owner" of the binding (i.e., the TA that created the binding) can keep track of it, supply it to others and also refer to it when later data is encoded (so that segment references might be reused where the segment data repeats).

The $TT^{-1}$ of the owner of a binding will often re-use those bindings, such as when a sequence of segment data goes round trip, i.e., flows from the STA to the CTA and back, or vice versa. This might happen, for example, where a user edits a file. The user's file client will request file data, the server will serve the file and while the user edits the file, the bindings for the file data will be present in both the CTAs PSS and the STAs PSS. If the user writes back the file data, the portions that did not change may be fully represented by reference labels created when the file data was first sent to the user's client. In this case, rather than create new bindings when sending data back to the STA, the CTA simply references the old bindings that were created by that same STA. Other examples include e-mail, where a client might request an e-mail (via one protocol like IMAP or POP) and then forward it back over the network (via another protocol like SMTP), in which case the STAs $TT^{-1}$ can use bindings created by the STAs TT when the e-mail was first sent to the client, presuming both SMTP transactions and IMAP or POP transactions flow through the STA/CTA pair. Another example is where a user copies information from a Web site (via HTTP) to a file system via CIFS, presuming both HTTP transactions and CIFS transaction flow through the STA/CTA pair.

Because of this characteristic of the PSS, a client and a server can effectively send large blocks of data back and forth, using very little bandwidth and without changing the client or the server. This is particularly useful where large files are moved around and only changed slightly, such as where two or more users are collaborating on a large CAD file. Using the systems shown here, network performance could be sufficient to cause users to abandon other workarounds to network bottlenecks, such as remote access, storing local copies of files, pushing out read-only copies of the files, etc.

If the input data is segmented according to content, the same sequence of bits would likely result in the same segment, regardless of where the sequence of bits occurred. This has advantages, as repeated bit sequences are effectively noticed and referenced. However, where there is a compelling need or improved performance, external factors might come into play. For example, some parameters about the transactions could be used, possibly resulting in more than one segment being created for one sequence of bits, if there were an offsetting benefit. In one approach, an external factor is what segments exist in the PSS, and segments boundaries are decided on based on what segments are already present in the PSS. While this is not as scalable as the more basic approach described above, it might result in more reuse of segments and therefore have some benefits.

This can be illustrated by an example. If a payload were normally cut one way, but a different set of cuts would more closely match segments that are already in the PSS, greater compression would result. However, to be able to keep the gains, the sending TA would have to have some idea which segments the receiving TA probably has, so that the sending TA does not make its cuts based on the sender's PSS if the sender knows that most of the sender's PSS segments are not present at the receiver's PSS.

Figure 9:
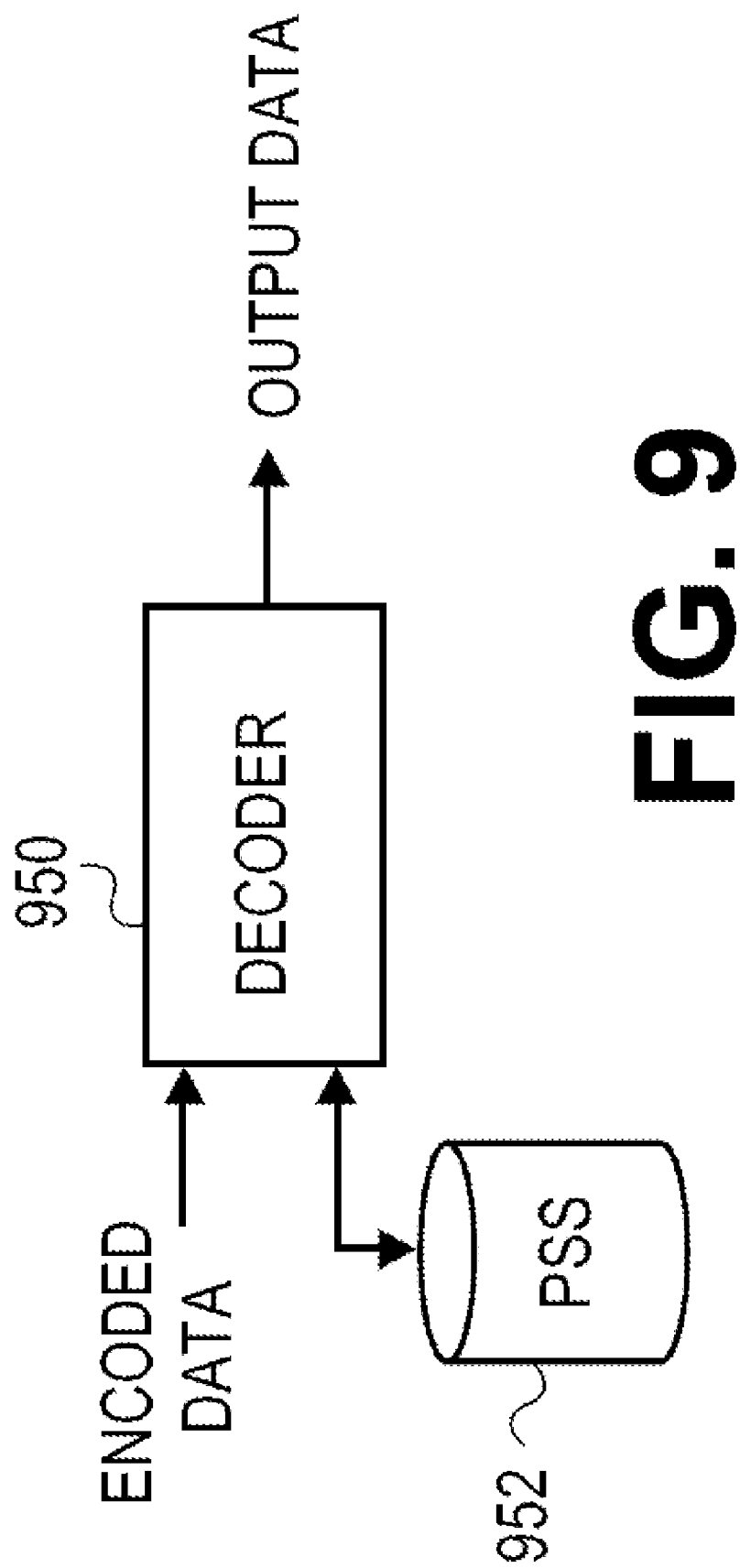
FIG. 9 is a block diagram of a decoder as might be used in the inverse transaction transformers ("TT-1") of FIG. 5.

FIG. 9 illustrates a decoder 950 and a PSS 952. The $TT^{-1}$ for a TA might be just decoder 950, but the $TT^{-1}$ might also include other functionality or elements. Decoder 950 receives encoded data, as might have been output by decoder 840 shown in FIG. 8. As described above, the encoded data might comprise references, bindings and residual data. When decoder 950 encounters a binding in data it receives, it can use the segment data in that binding to reconstruct the original data and it can also store the binding in its PSS. When decoder 950 encounters a reference without a binding, it can use the reference to obtain segment data from PSS 952 to reconstruct the segment. If the segment reference is not found in PSS 952, decoder 950 can send a request for the segment data.

Figure 10:
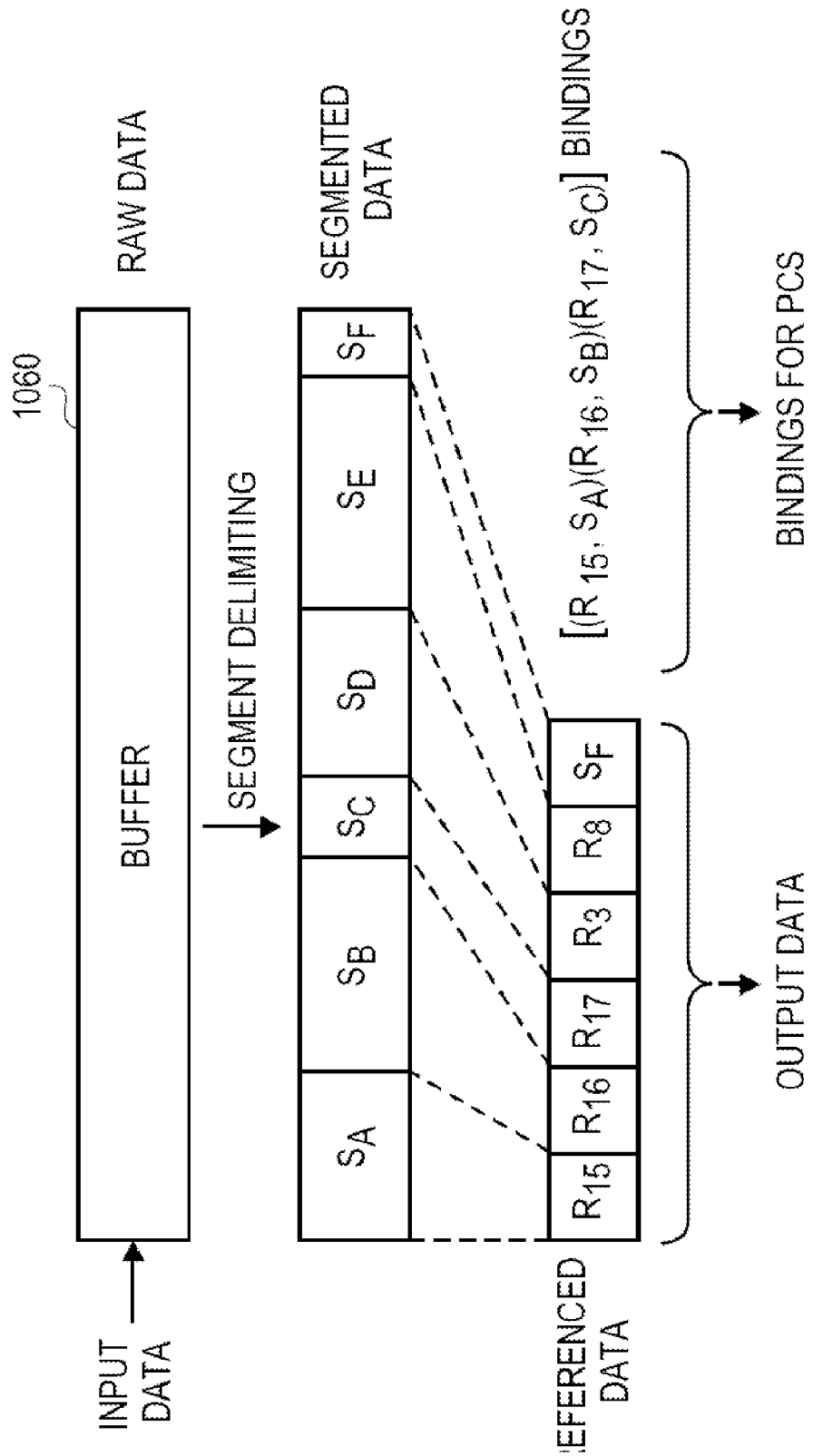
FIG. 10 is an illustration of an encoding process wherein input data is segmented and represented by references to data segments.

FIG. 10 is an illustration of an encoding process wherein input data is segmented and represented by references to data segments. As shown there, the raw input data is loaded into a buffer 1060 (although this can be done without buffering, if necessary). The raw input data is then segmented into segments. Several techniques are available for determining where to define the "cut lines" that separate each segment from its adjacent neighbors. Some approaches to segmentation as described in McCanne II. Other approaches that might be used are a simple approach of putting cut lines at regular intervals, or in some relation to a fixed sequence of data found in the raw input data, such as end-of-line marks, though such approaches might not lead to the best performing segmentation scheme.

However the cut lines are determined, in the example of FIG. 10, the raw input data in buffer 1060 is segmented into segments $S_A$, $S_B$, $S_C$, $S_D$, $S_E$ and $S_F$. In this example, the first five segments are to be replaced with references and the references happen to be $R_{15}$, $R_{16}$, $R_{17}$, $R_3$ and $R_8$. Note that the references are not necessarily in order, and this example illustrates that some references (e.g., $R_3$ and $R_8$.) might be to segment data that was already encountered, in which case a new segment is not used, but the reference is to the preexisting segment. Also illustrated here is that a segment (e.g., $S_F$) need not be replaced with a reference.

The raw input data can be fully represented by the output data and the bindings, which can be generated from the raw input data. The bindings are provided to the PSS for the TA that generated the bindings, as well as others and some or all of the bindings might be sent as part of the output data. In this example, the new bindings are ($R_{15}$, $S_A$), ($R_{16}$, $S_B$) and ($R_{17}$, $S_C$). In this example, the bindings ($R_3$, $S_D$) and ($R_8$, $S_E$) are not needed because the segment data for segments $S_D$ and $S_E$ are already known and were stored with references to $R_3$ and $R_8$.

Figure 11:
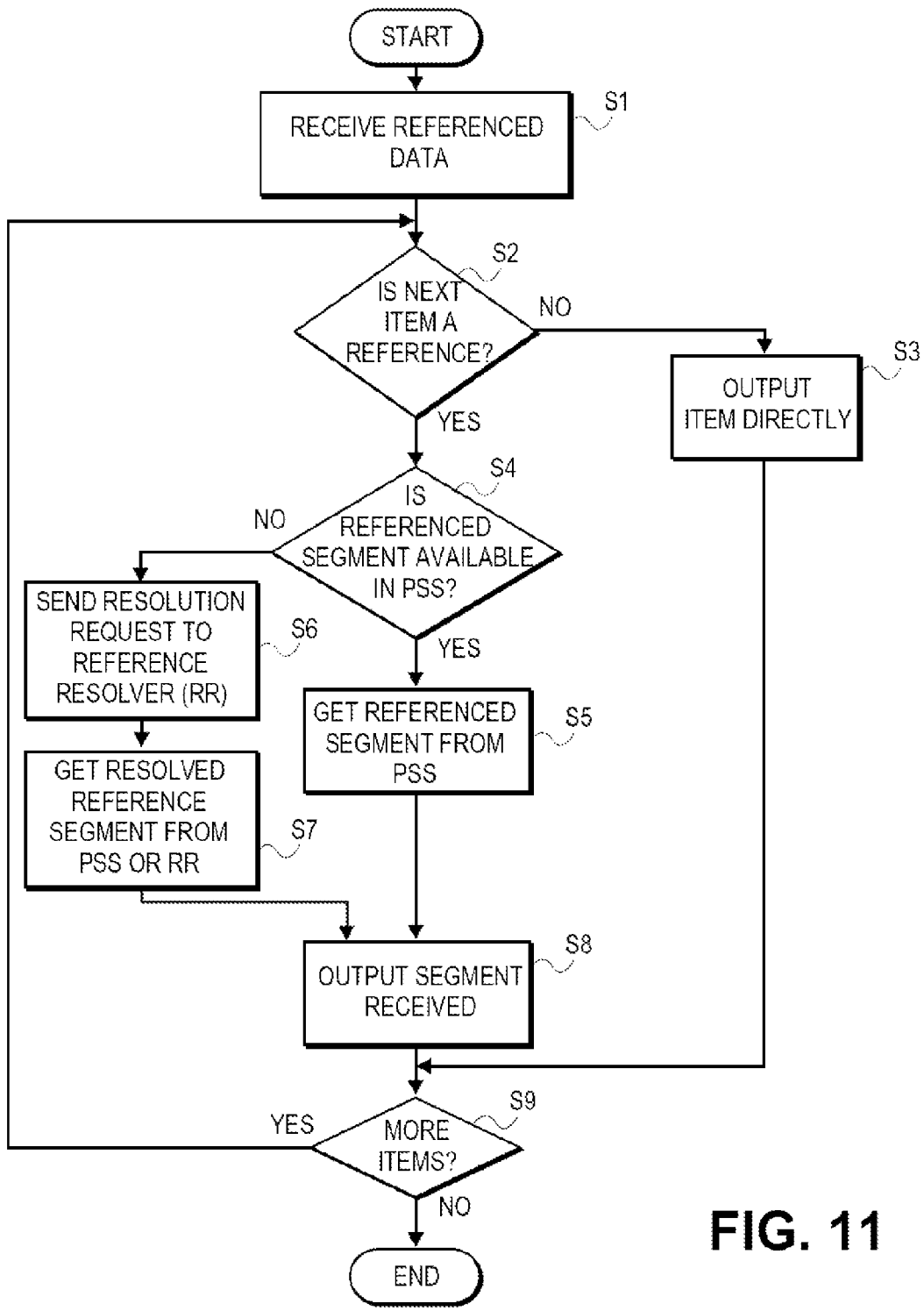
FIG. 11 is a flowchart illustrating a process for decoding data as might be output by the encoder of FIG. 8.

FIG. 11 is a flowchart illustrating a process for decoding data as might be output by the encoder of FIG. 8 and decoded by the decoder of FIG. 9. The steps of the process are labeled "S1", "S2", etc., with the steps generally proceeding in order unless otherwise indicated. In the first step (S1) referenced data (e.g., data encoded with references) is received and parsed into tokens. If the token is checked (S2) and it is not a reference, it must be an unreferenced segment and so the token is output directly (S3). However, if the token is a reference, the decoder checks (S4) if the reference exists in the PSS supporting the decoder. If yes, the decoder gets the referenced segment from the PSS (S5). If no, the decoder sends a resolution request (S6) to the reference resolver supporting the decoder and receives the resolved referenced segment back from the reference resolver (S7). Where the reference label encodes the source of the segment data, that label may be used by the reference resolver to aid in finding the referenced segment.

Once the decoder has access to the referenced segment's segment data (either following step S3 or step S7), it outputs the segment data (S8). The decoder then checks for additional tokens (S9). If there are more tokens, the process repeats at step S2 with the next token, otherwise the process completes.

The above description represents just one particular embodiment for encoding and decoding segment bindings and references using a PSS. Other approaches are possible that involve more sophisticated representations of the relationships between labels and data, such as those shown in McCanne II.

Figure 12:
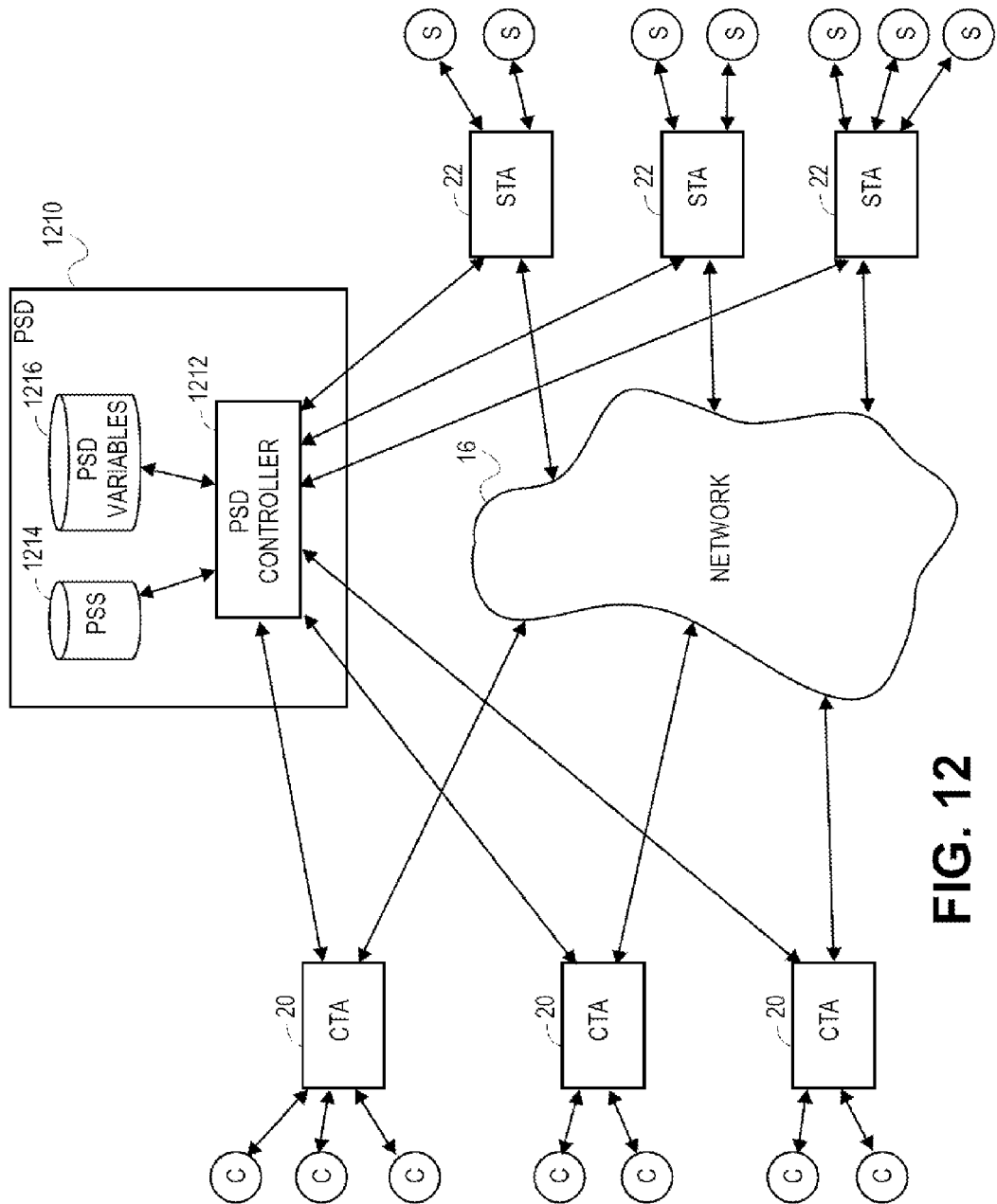
FIG. 12 is a block diagram of a networked system wherein transaction acceleration is implemented and uses a proactive segment distributor ("PSD").

FIG. 12 is a block diagram of a networked system wherein transaction acceleration is implemented and uses a proactive segment distributor ("PSD"). As shown there, a PSD 1210 includes a PSD controller 1212, its own PSS 1214 and other storage 1216 for PSD variables. In some implementations, multiple PSDs are used, although only one is shown in the figure.

By the operation of PSD 1210, segments are more likely to be present when they are needed and therefore fewer segment resolution requests are needed. Where the segments need to be moved from PSS to PSS, PSD 1210 can trigger this process in advance of the actual need for the segment, so that a transaction will return more quickly, as the receiving TA does not have to block for the receiving TA to issue a request for a segment to the sending TA as the payload is being received. PSD 1210 can do the distributing itself or just direct the owner (or other holder) of segments to pass them around. In some instances, PSD 1210 might maintain its own PSS 1214, but in some implementations, the PSD just directs the flow of bindings among PSS's and does not maintain its own PSS.

PSD 1210 might monitor transaction flow from the CTAs 20 and STAs 22 and from that, determine which segments are likely to be needed and where. When PSD 1210 determines that a segment might be needed, it can send a message to the sending TA, such as an STA serving a file system or e-mail system. The message would direct the sending TA to perform segmentation, store bindings in its own PSS and even propagate the bindings to other PSS's, so that the segmentation is done when the sending TA receives a message that would result in the sending TA sending a payload. When done well, a receiving TA will obtain the binding it needs for when the receiving TA receives a payload with references therein and those bindings can be sent when the bandwidth is not so critical. More typically, the sending TA is an STA, but the PSD might also direct CTAs to "pre-load" bindings into the system.

In some cases, server agents are added to servers to identify candidates for preloading. For example, a mail server such as a Microsoft Exchange™ server might be coupled to a network and operate with an STA and an associated server agent. The server agent would detect when e-mails and attachments arrive and, based on past observations or operator policies, pre-load a particular CTA with the relevant segment data. This might be done by tracking which users read their emails from which locations, either through static configuration or preferably with measurements. Then, when a remote user goes to read e-mail, the bulk of the email data is already at the user's remote site, but the transactions still go back the Exchange mail server to ensure protocol correctness.

In addition to proactively triggering segment generation, PSD 1210 might also assist with "pre-populating" various TA PSS's with bindings that already exist so that those accelerators have segment data ready when a reference is received. In one implementation, PSD 1210 operates on a propagation model, as is done with USENET news items, where new bindings are noticed to PSD 1210 and PSD 1210 then propagates the new bindings from the noticing TA to all or some of the other accelerators, which might in turn propagate bindings. In lieu of, or in addition to the pre-populating triggered by the PSD, a sending TA might anticipate which segments need to be transmitted to a receiving TA and send them either ahead of time or "out-of-band") such that the receiving TA need not issue additional requests to resolve unknown segments.

Where indiscriminate propagation would likely lead to network overload or increased bandwidth usage relative to just sending complete, raw data for each transaction, more sophisticated approaches might be used. In an example of a more efficient approach, the PSD uses heuristics to determine which accelerators might need which segments. In another approach, servers include server agents that provide the PSD with information at a high level that allows the PSD to determine which CTAs will need which segments from the "agented" server. In some embodiments, combinations of the above approaches are used.

Another embodiment of a PSD with a server agent involves a type of file system mirroring. Here, the server agent monitors file system activity and whenever new data is written to the file system, the agent instructs the PSD to replicate the appropriate segment bindings to one or more CTAs. User- or operator-defined policies could dictate whether the entire file system's data is replicated or just configured portions are replicated. Moreover, these policies could be augmented by measurements of access patterns, so that segment data from the most frequently accessed portions of the file system are replicated (and these measurements could be performed on a per-CTA basis). As a result, each such CTA effectively contains a mirror of all (or portions) of the file system data. Then, when clients interact with the CTA via network file-system protocols (like CIFS or NFS), the transactions flow all the way back to the origin file server, yet these transactions are wholly compressed into pure strings of references. This approach ensures that the original file system semantics are preserved as if all clients were sharing a single file server, yet the performance of the client-server communication behaves as if all data were in local per-client file servers.

While the segmentation scheme outlined above can significantly reduce the bandwidth requirements of client-server communication, the transactions are still subject to the inherent latency of communications across the wide area. These latency bottlenecks can adversely impact performance and can be dealt with using complementary techniques like file read-ahead and write-behind. Because of the compression and staging of data, however, read-ahead and write-behind techniques become extremely effective as they incur very little overhead on the network since all the data is already present at the CTA.

All of these approaches can be complemented with a scheme to employ bandwidth policies to the various sorts of CTA/STA communication. For example, a certain bandwidth limit could be imposed on the PSD to limit the aggressiveness of the staging algorithms. In another example, bandwidth priorities could be applied to different classes of staged data (e.g., file system segment replication could have priority over email attachment segment replication).

Figure 13:
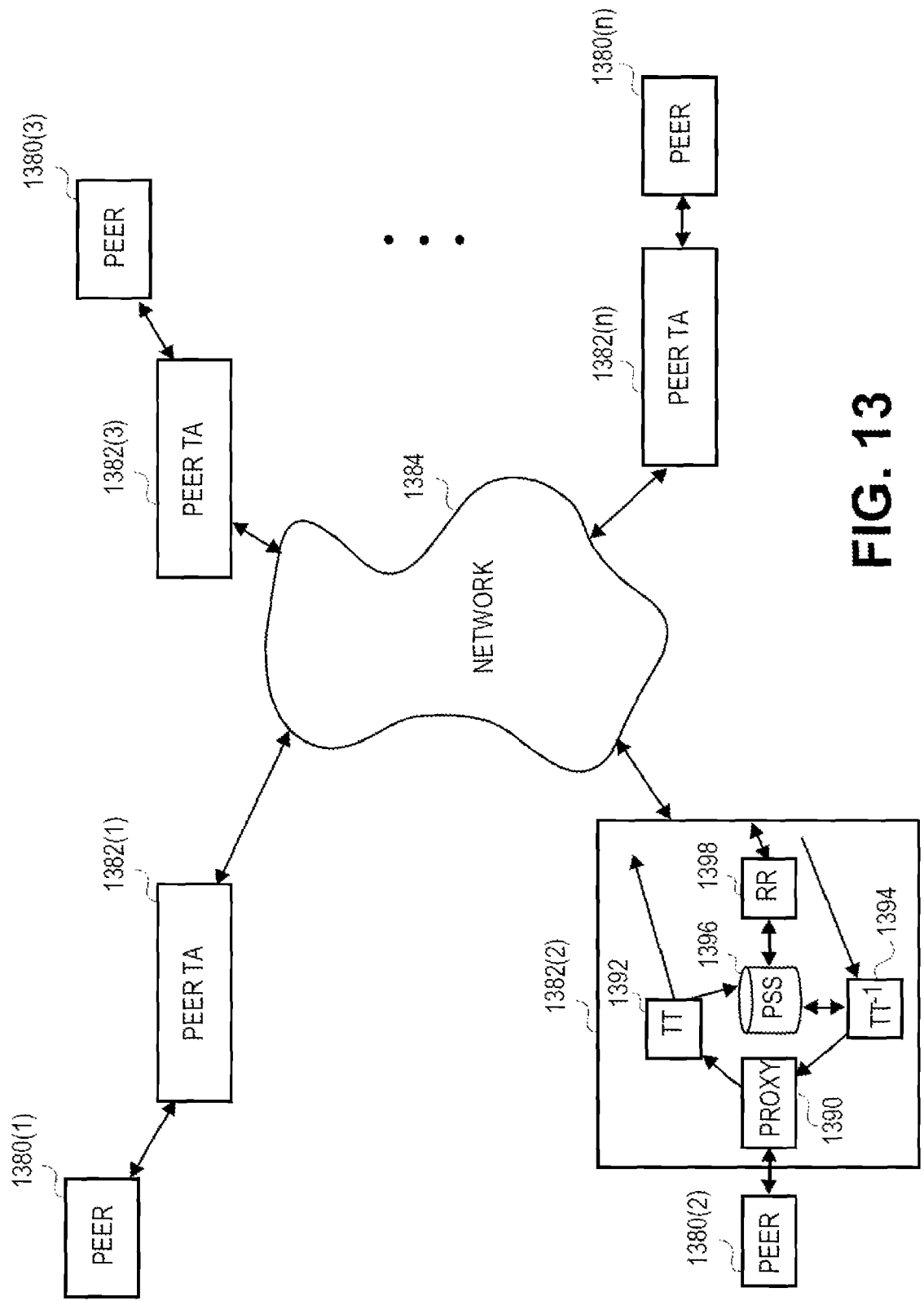
FIG. 13 is a block diagram of a networked peer-to-peer system according to embodiments of the present invention.

FIG. 13 is a block diagram of a networked peer-to-peer system according to embodiments of the present invention. As shown there, various peers 1380 interact with each other via peer transaction accelerators (Paccelerators) 1382. Peers 1380 might interact directly, although such connections are not shown. In operation, one peer 1380 might request data from another peer, via each peer's PTA 1382 and network 1384. As shown, each PTA 1382 might comprise a peer proxy 1390, a TT 1392, a $TT^{-1}$ 1394, a PSS 1396 and an RR 1398. In a peer to peer system, a peer is essentially functioning as a client for some transactions and a server for other transactions, and so the transaction acceleration scheme would function in an analogous manner.

Figure 14:
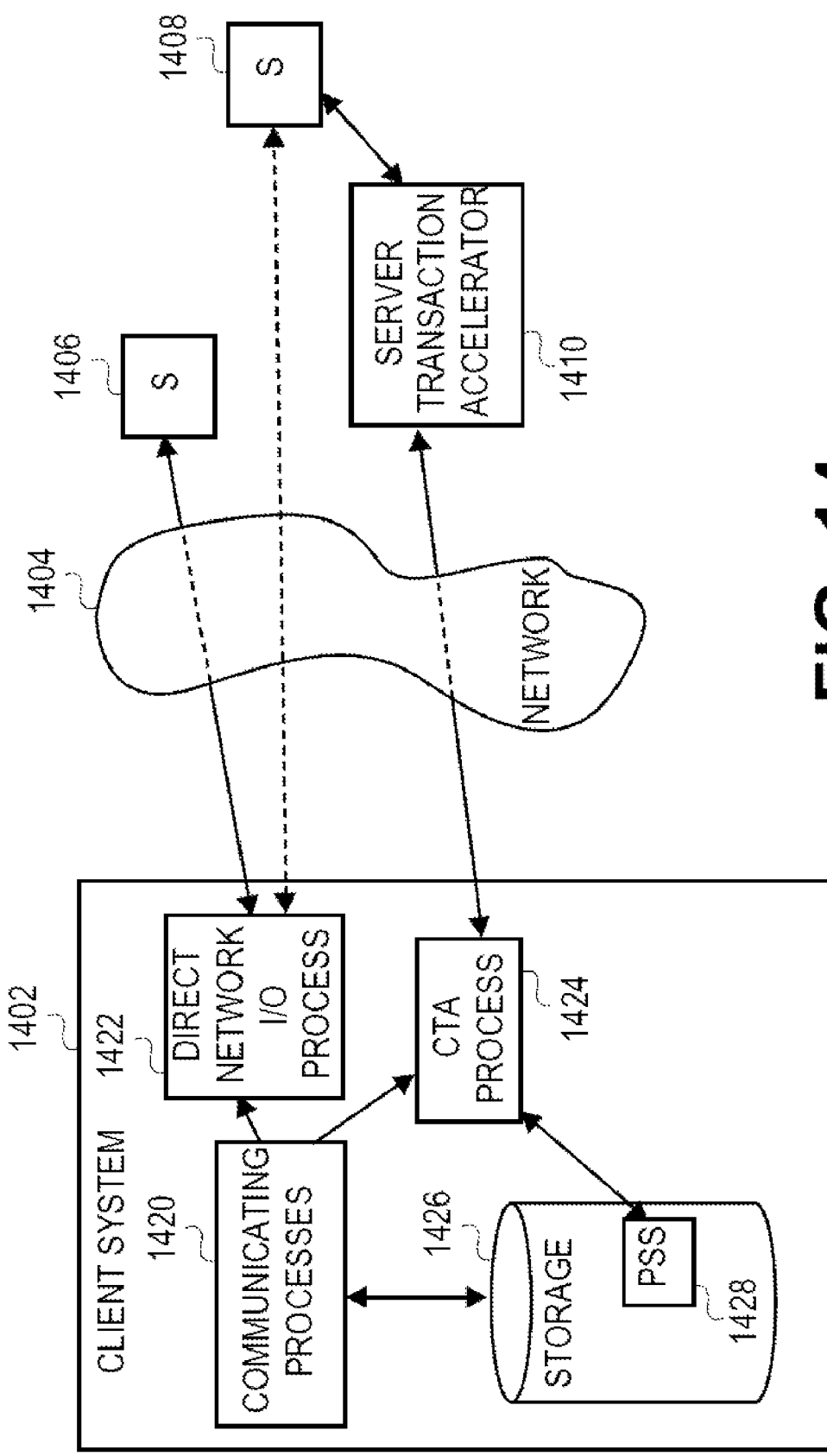
FIG. 14 is a block diagram of a networked system wherein transaction acceleration is implemented and the client-side transaction accelerator is integrated in with the client.

FIG. 14 is a block diagram of a networked system wherein transaction acceleration is implemented and the client-side transaction accelerator is integrated in with the client as opposed to being a separate entity. As shown, a client system 1402 is coupled through a network 1404 to a server 1406 directly and a server 1408 via a server transaction accelerator STA 1410. Client system 1402 is shown including communicating processes 1420, a direct network I/O process 1422, a CTA process 1424, and storage 1426 including a persistent segment store 1428. Communicating processes 1420 are coupled with direct network I/O process 1422, CTA process 1424 and storage 1426. CTA process 1424 is coupled to PSS 1428.

In operation, communicating processes 1420 perform functions, typically at the application layer, that require interaction with servers outside client system 1402. For example, communicating processes might comprise a web browser, an e-mail client, a Java program, and interactive network program, a chat program, an FTP program, etc. Where a communicating process is to interact with a server directly, the communicating process will interact with direct network I/O process 1422 to interact with a server, but where the transaction is to be accelerated, the communicating process would interact with CTA 1424. In some embodiments, a communicating process 1420 and a CTA 1424 may be components of a single application program, while in other embodiments they may be separate application processes. CTA process 1424 can accelerate transactions much like the various stand-alone CTAs do as described above, using a portion of storage 1426 as the PSS. In some variations, PSS 1428 is distinct memory from storage 1426, which is used for other processes in client system 1402, such as the needs of the communicating processes 1420.

Direct network I/O process 1422 satisfies the network I/O needs of communicating processes 1402 by interacting with servers over network 1404. In some cases, direct network I/O process 1422 interacts with the same servers as CTA 1424, illustrated by the dotted line to server 1408. Client system 1402 might include other processes not shown, including processes related to transaction acceleration. For example, communicating processes 1420 might rely on a separate process that determines when to send a transaction directly to a server and when to attempt to accelerate it.

Figure 15:
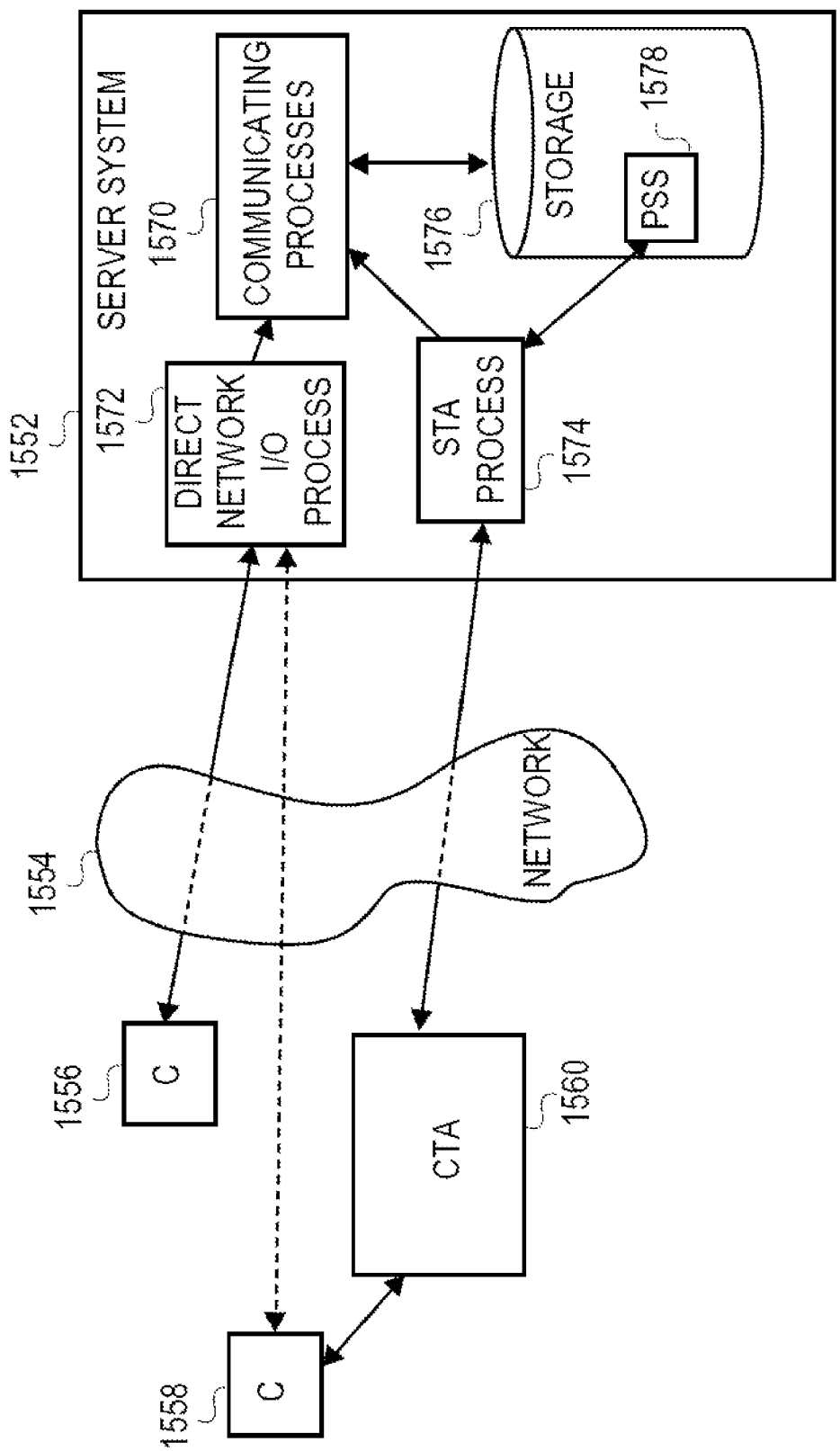
FIG. 15 is a block diagram of a networked system wherein transaction acceleration is implemented and the server-side transaction accelerator is integrated in with the server.

FIG. 15 is a block diagram of a networked system wherein transaction acceleration is implemented and the server-side transaction accelerator is integrated in with the server. That figures shows a server system 1552, a network 1554, a client 1556, a client 1558 and a client transaction accelerator (CTA) 1560. Server system 1552 is shown including communicating processes 1570, a direct network I/O process 1572, an STA process 1574, and storage 1576 including a persistent segment store 1578. Communicating processes 1570 are coupled with direct network I/O process 1572, STA process 1574 and storage 1576. STA process 1574 is coupled to PSS 1578. Client 1556 couples to a server system 1552 directly as illustrated by the line from client 1556 to direct network I/O process 1572, which handles transactions that do not go through STA process 1574. Client 358 couples to server system 1552 via CTA 1560 and STA process 1574, but might also connect directly to direct network I/O process 1574 for other transactions.

In operation, communicating processes 1570 perform functions such as server processes that respond to requests from clients. Where server system 1552 and a client are interacting directly, the transaction would flow between the communicating process and the client via direct network I/O process 1572. Where server system 1552 and a client are interacting via the accelerators, the transaction would flow between the communicating process and the client via STA process 1574. STA process 374 can accelerate transactions much like the various stand-alone STAs described above, using a portion of storage 1576 as the PSS. In some variations, PSS 1578 is distinct memory from storage 1576, which is used for other processes in server system 1552, such as the needs of the communicating processes 1570.

Direct network I/O process 1572 satisfies the network I/O needs of communicating processes 1552 by interacting with servers over network 1554. In some cases, direct network I/O process 1572 interacts with the same servers as STA 1574, illustrated by the dotted line to client 1558. Server system 352 might include other processes not shown, including processes related to transaction acceleration. For example, communicating processes 1570 might rely on a separate process that determines when to send a transaction directly to a server and when to attempt to accelerate it.

It should be understood that the elements of FIGS. 14 and 15 could be combined, such that client systems with internal CTAs can communicate with server systems with internal STAs. It should also be understood that where single arrowed lines are used, bi-directional information or data flows might also be present.

One disadvantage of embedding the TA in the client and/or server devices is that each device ends up with its own PSS and the benefits of caching the same segment data on behalf of a large number of clients (or servers) at a given location are diminished. This problem, however, can be overcome in another embodiment that allows the PSS to logically span multiple accelerators, preferably situated on a common LAN segment (or a common network area that is interconnected with high-speed links, e.g., a high-speed campus-area network that interconnects multiple floors in a building or multiple buildings in close proximity). In this case, the logical shared PSS can either be another device attached to the network or it can be several PSS's embedded in each CTA such that through cooperative protocols (e.g., over IP Multicast) these PSS's behave as a single, logical entity.

Figure 16:
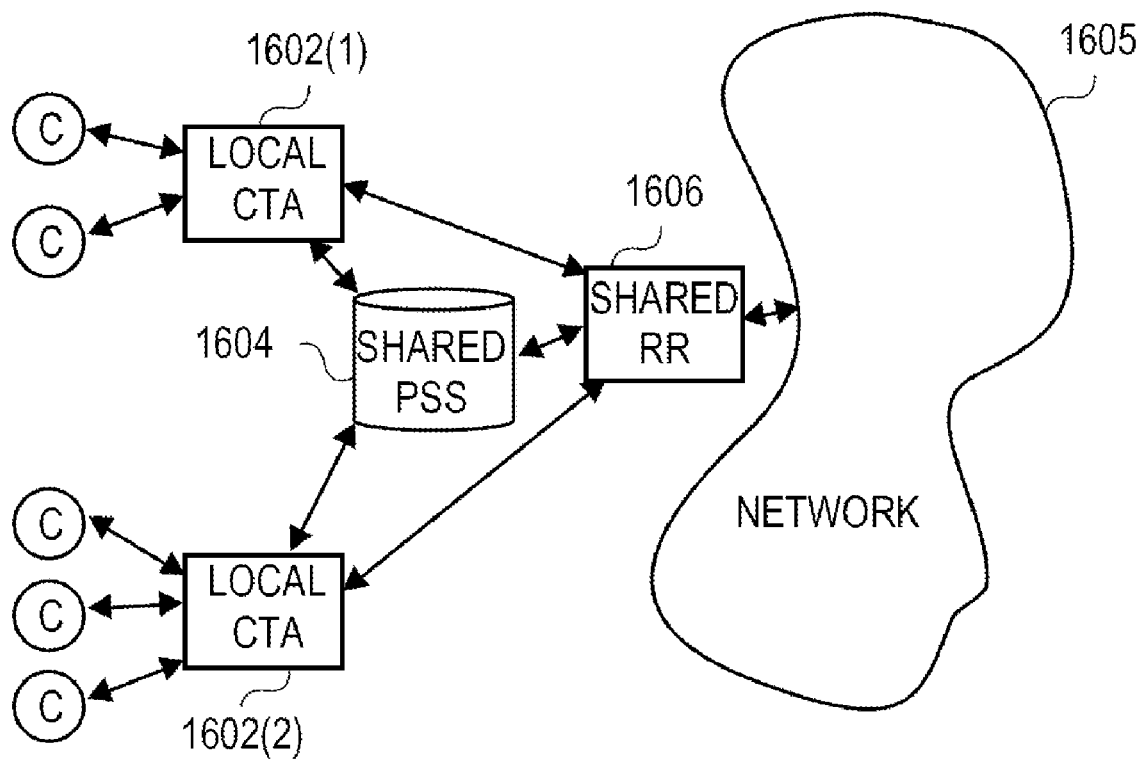
FIG. 16 is a block diagram of a networked system wherein transaction acceleration is implemented and a PSS is shared among a plurality of transaction accelerators.

FIG. 16 is a block diagram of a networked system wherein transaction acceleration is implemented and a PSS is shared among a plurality of transaction accelerators. As shown there, clients couple to a local CTA 1602 for transaction acceleration. Instead of maintaining a separate PSS, the local CTAs 1602 are coupled to a shared PSS 1604. Preferably, the connection between the local CTAs and the shared PSS are higher performance connections relative to the connections via network 1605 that would exist between the client and the server. A shared reference resolver 1606 might also be present and coupled to the shared PSS 1604 and the local CTAs sharing that PSS.

When each local CTA 1602 initiates a transaction with a request message or receives a response message, that local CTA 1602 would use shared PSS 1604 for storage and retrieval of segment data. This has an advantage over a system using separate PSS's for each local CTA, in that a segment that is stored as a result of a transaction for one local CTA could be used in a transaction for another local CTA. For example, if local CTA 1602(1) recently handled a transaction for a client that involved getting a data from server S, the segments that server S created for that transaction would likely exist in shared PSS 1604. If local CTA 1602(2) were to then handle a transaction for a different client (or the same client in some configurations, such as a round-robin local CTA sharing scheme) directed at server S, local CTA 1602(2) would send the request to the STA for server S. If the segments for the second transaction match those of the earlier transaction with local CTA 1602(1), whether they represent in fact the same request or an unrelated request where the resulting payload data has some data in common, local CTA 1602(2) would receive references to those segments instead of the segment data itself.

When a local CTA receives references to segments that cannot be resolved from shared PSS 1604, the local CTA can send a request for resolution to shared reference resolver 1606. In some embodiments, each local CTA has its own shared reference resolver that communicates its reference resolutions to the shared PSS 1604 as well as to other components of the local CTA of which it is a component. Other embodiments may employ a single shared reference resolver used by all clients.

While a shared PSS is described in FIG. 16 as being on the client side, a similar arrangement can be made at the server side, either with shared or individual PSS's on the client sides. Also, accelerators with shared PSS's might exist on the same networks as accelerators with individual PSS's. Although FIG. 16 shows shared PSS 404 as being distinct from the local CTAs, it may be that the shared PSS is contained within one of the local CTAs, although it is external to other CTAs which share that PSS.

The PSS might be connected among the local CTAs it serves using localized network multicast communication. In this approach, each transaction accelerator subscribes to a well-known and locally scoped multicast group. By using localized scoping, the system can guarantee that only transaction accelerators that are connected by a local high-speed network coordinate with one another through this mechanism. Each host can generate periodic session message packets sent to this group (or another configured group for exchanging session packets), allowing the computation of a round-trip time estimation to other transaction accelerators subscribing to that group. Well-known techniques could be used for this process, such as those shown in Floyd, S., et al., "*A Reliable Multicast Framework for Light-weight Sessions and Application Level Framing*", in IEEE/ACM Transactions on Networking, December 1997, Volume 5, Number 6, pp. 784-803 (hereinafter "Floyd et al."). The session protocol allows all the members in the group to learn of each other's existence and can also infer the size of the group from the sum of members.

Using this multicast configuration, the system for caching segment data can be enhanced in a number of ways. In one approach, whenever a transaction accelerator receives a new segment binding, it can multicast that segment binding to all other transaction accelerators in the locally scoped group. This can mitigate the problems outlined above with each client having a separate PSS, as each PSS in the local set of transaction accelerators would be replicas of each other and any given data segment would thus be sent just once over the WAN connection.

To ensure the reliability of transmission over the network multicast connection, a number of well-known schemes for reliable multicast transport can be employed as in Floyd et al. and papers cited there-in on reliable multicast protocols. Given that this multicast communication is conducted in a homogenous, high-speed local-area or campus-area network, the difficult problems of congestion control and WAN multicast are altogether avoided.

Figure 17:
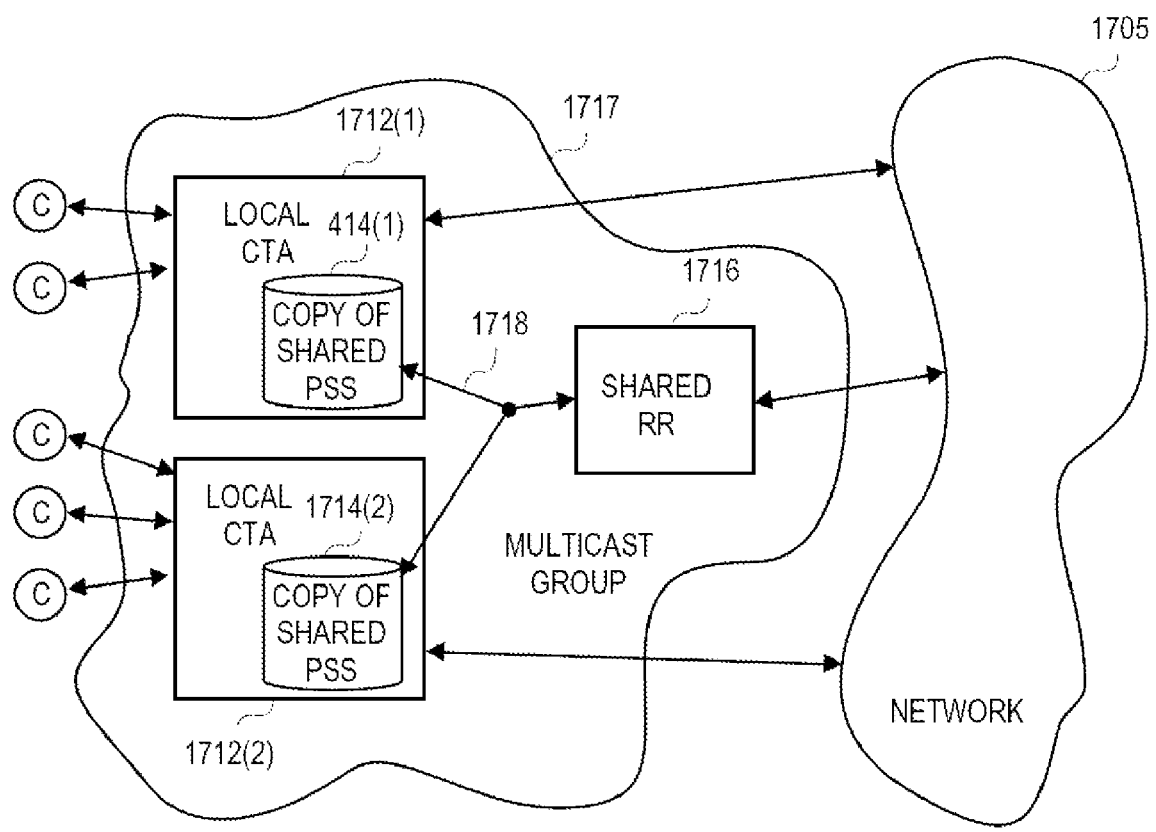
FIG. 17 is a block diagram showing a multicast implementation of the system of FIG. 16, wherein multicast communications are used for updating and reading a shared PSS.

FIG. 17 is a block diagram showing a multicast implementation of the system of FIG. 16, wherein multicast communications are used for updating and reading a shared PSS. As with the arrangement shown in FIG. 16, local CTAs 1712 connect to clients and to network 1705 and share a shared PSS 1714 with other local CTAs. A shared RR 1716 is configured to be on the same multicast group 1717 as each instance of shared PSS 1714 (indicated as 1714(1), 1714(2), . . . ). Logically, it might be said that the multicast group contains shared RR 1716 and the local CTAs, if the local CTAs handle the I/O needed to read and write the shared PSS. The multicast traffic is illustrated by the lines 1718 in the figure.

In another approach, the PSS is not pro-actively replicated as described above, but rather a transaction accelerator can issue local requests to resolve unknown segments. That is, when a transaction accelerator receives a reference for data that it is not in its PSS, it transmits a resolution request message over the locally-scoped multicast group. All of the other local transaction accelerators will thus receive the request message, unless errors occur. A receiver that has the requested data in its PSS can then respond with the data. By using well-known slotting and damping techniques (as in Floyd et al.), just one response message typically will be transmitted over the network while incurring little delay.

If no response is received by the requestor (after some deliberate delay computed from the session message round-trip times), the requester assumes that the data is not present in the local environment and transmits the resolution request over the WAN to the transaction accelerator that originally generated the data reference in question. Note that since the local round-trip time is comparatively small (typically less than 1 ms) compared to the WAN round-trip time (typically tens of milliseconds or more), the extra delay incurred by this initial check is negligible (i.e., typically under a few percent), while the benefit is substantial due to the higher local network performance.

In yet another approach, a hybrid between the two approaches described above eliminates the delay associated with the local resolution request. In this hybrid approach, whenever a transaction accelerator receives a new segment binding, instead of multicasting the entire segment, it simply multicasts the name of the segment. This way, all the local transaction accelerators learn about what segments are present without necessarily having to hold a copy of all the segment data. Then, when a reference is received for a segment that is not in the PSS but whose name is recorded as locally known, the transaction accelerator can send a local request for the data and that local request can go directly to the transaction accelerator that sent out the new segment binding if the sender can be identified. Otherwise, the accelerator can assume the data is not locally present and immediately send a request across the WAN. Even when the segment is inferred to be locally present, it is possible that it has been flushed from all the other local accelerators' PSS's. In this case, the requesting accelerator will still time out and revert to transmitting its resolution request across the WAN.

In yet another approach, the segment data stored across the PSS's of the local accelerator group need not be fully replicated. Here, each accelerator is responsible for a portion of the segment cache using cooperative caching techniques. As described above, when a reference for segment data managed by another accelerator needs to be resolved, the request can be sent either directly to that device or indirectly over the multicast group. Once the data has been reassembled and delivered to the client (or server), it can be discarded and need not be entered into the local PSS (since that segment data is being actively managed by the other transaction accelerator).

Figure 18:
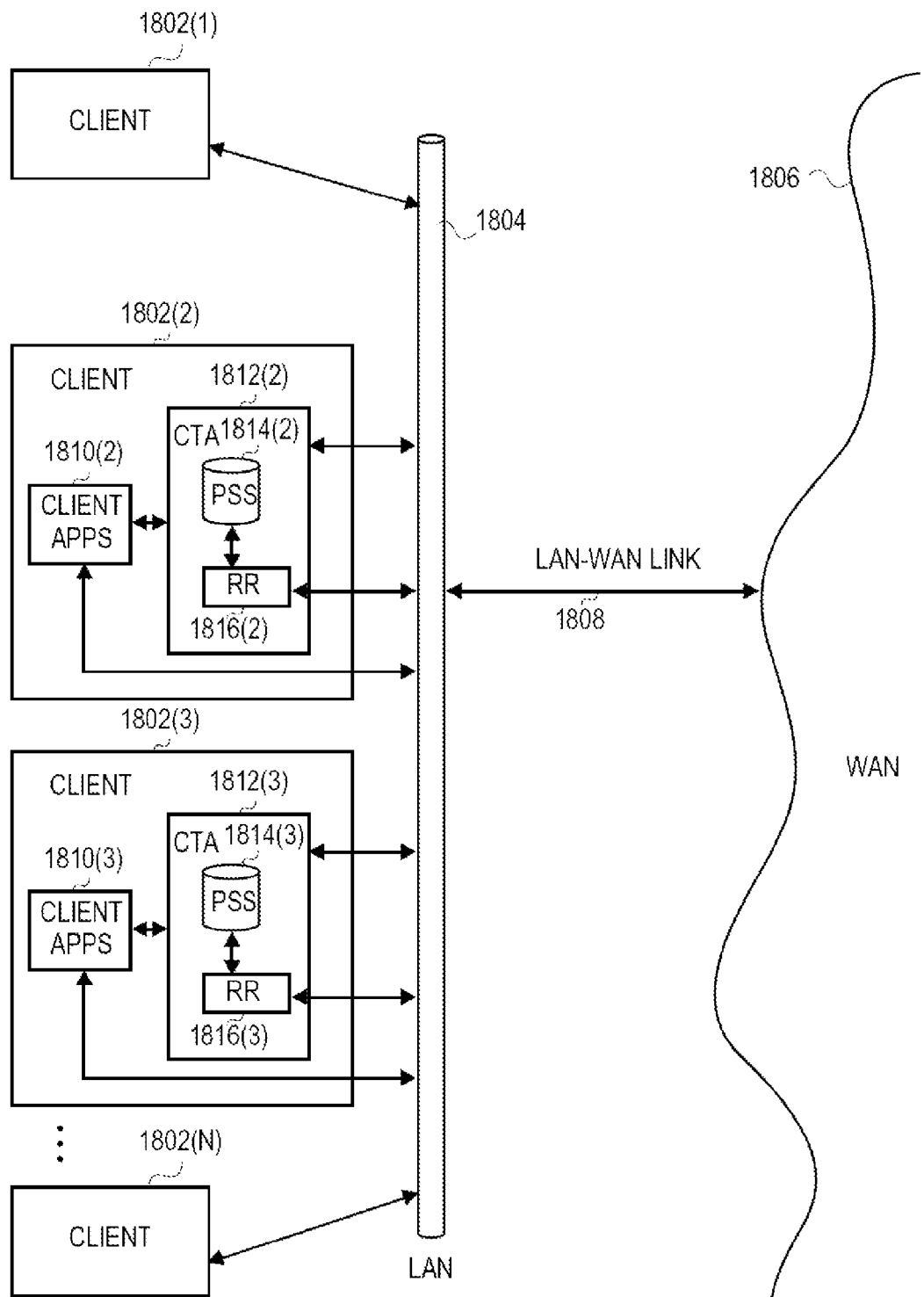
FIG. 18 is a block diagram showing a multicast implementation of a plurality of clients coupled locally through a LAN and to a WAN.

FIG. 18 shows a plurality of clients 1802, with integrated CTAs. Clients 1802 are coupled to a LAN 1804, which in turn couples clients 1802 to a WAN 1806 via a LAN-WAN link 1808. Not all clients on LAN 1804 need include a CTA 1812, but at least two clients are shown including integrated CTAs 1812. Each CTA is shown including a PSS 1814 and an RR 1814. With this implementation, all of the functionality of the CTA can be implemented as software running on the client.

A client's CTA 1812 handles the acceleration of transactions requested by the client applications 1810 running on that client. For example, where an application running on client 1802(2) initiates a transaction with a server that is to be accelerated, the connection would be to CTA 1812(2). CTA 1812(2) would then open a connection with a corresponding STA, much as described above, over LAN 1804 and WAN 1806. When CTA 1812(2) receives a response message including a payload that has been accelerated, CTA 1812(2) will use the contents of PSS 1814(2) to deference the reference labels in the accelerated payload.

To achieve the benefit of segments that might have been between servers and other clients on LAN 1804, the PSS's 1814 can be cooperative PSS's. By cooperating, each CTA is able to use the segment bindings from its own PSS as well as the PSS's of other CTAs on LAN 1804. Then, if a segment binding cannot be found locally, a CTAs RR can send a request for the binding over the WAN to the STA.

In some cases, when an RR receives a new binding (or its CTA creates one), it distributes the new binding to each of the other RR's on the LAN, so that each client's PSS is populated with the available bindings created on the LAN and a CTA will already have a copy of each of the bindings that are available on the LAN when the CTA is deferencing payloads. This is referred to herein as "prescriptive cooperation".

In other cases, the bindings are not distributed ahead of time, but are sent upon request. Thus, when an RR needs a binding it does not have, it makes a request of the other RR's on the LAN for the binding. This is referred to herein as "on-demand cooperation".

In a hybrid of these approaches, when an RR receives a new binding or its CTA creates one, it distributes a "binding notice" indicating the new segment's reference and the originating CTA to other CTAs on the LAN. When another CTA determines that it does not have a needed binding in its own PSS, that CTAs RR checks a list of previously received binding notices. If the needed binding is on the list, the requesting RR messages the originator CTA to obtain the binding. If the RR determines that it does not have the binding and does not have a binding notice from another CTA on the LAN, the RR sends a request for the binding over the WAN. This is referred to herein as "notice cooperation".

It should be understood that a given LAN can implement more than one of the above-described cooperation schemes. The messaging among RR's for cooperation can be done using multicasting. For example, each of the cooperating clients (or their CTAs or RR's) can be a member of a multicast group. For prescriptive cooperation, each originating CTA multicasts the new bindings it receives or creates. For on-demand cooperation, the requesting RR can multicast the request and the responding CTA(s) can unicast or multicast their answers. Multicasting their answers allows the other CTA that did not request the binding to receive it and possibly store it in that other CTAs PSS. For notice cooperation, the notices can be multicast, but for requests, those can be unicast because the requester will know which CTA has the requested binding. Of course, a notice cooperation system could be implemented where the binding notices do not indicate the origination CTA, or that information is not stored, in which case the binding request might be multicast, but the preferred approach when using notice cooperation is to keep track of which CTA sends which notice.

Figure 19:
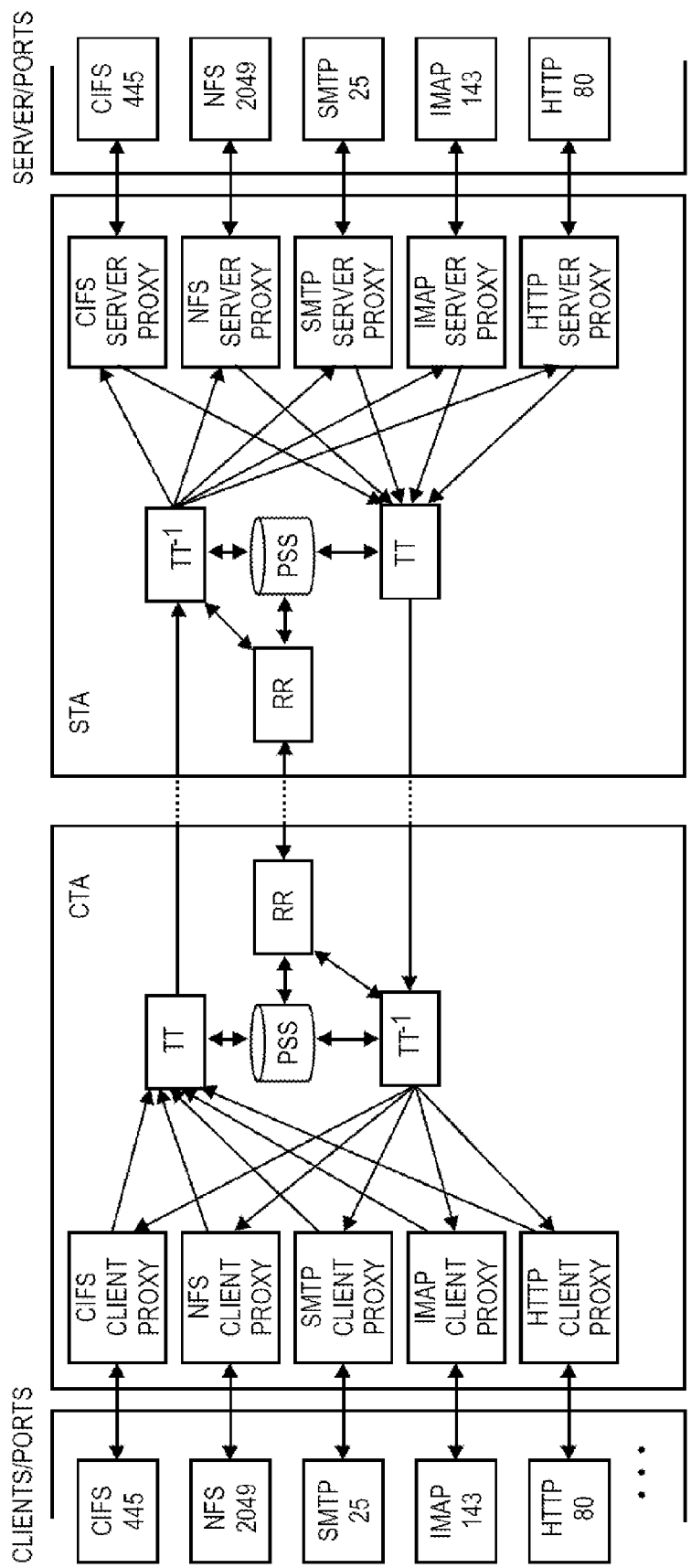
FIG. 19 is a block diagram of a networked system wherein transaction acceleration is implemented and the network handles a variety of protocols and services.

FIG. 19 is a block diagram of a networked system wherein transaction acceleration is implemented and the network handles a variety of protocols and services. The CTA and STA are shown coupled to accelerate CIFS, NFS, SMTP, IMAP and HTTP transactions. In other arrangements, the servers are at varied locations and the clients are at varied locations. In each case, the transactions for the accelerated protocols pass through the CTA and the STA and can be accelerated as described above and be transparent to the clients and servers engaging in the transactions. In addition to the open protocols illustrated in the figure, the CTAs and STAs can accelerate transactions for proprietary protocols such as Microsoft Exchange™, Lotus Notes™, etc. As with other variations described herein, the accelerators might be integrated in with the clients and servers. For example, some software vendors might include transaction acceleration as part of their client-server software suite.

Transaction Prediction Optimizations

In addition to possibly other functions, accelerators perform two core optimizations: the bandwidth-reducing technique described above herein also called "segment cloning" and a latency reduction and avoidance technique referred to herein as "transaction prediction". Some accelerators might perform just one of the two optimizations, and some accelerators might perform other operations as well. The two optimizations can work independently or in conjunction with one another depending on characteristics and workload of the data being sent across the network.

Segment cloning replicates data within and across the network as described above. This protocol-independent format reduces transmissions of data patterns that appear subsequently in the system. Rather than attempt to replicate data blocks from a disk volume, or files from a file system, or even e-mail messages or Web content from application servers and maintain the necessary consistency, accelerators represent and store data in a protocol- and application-independent format that represents data in variable-length, compressed data units called "segments". A working set of segments is maintained in persistent storage within each accelerator and cloned into other accelerators on demand as data flows through the accelerators or is proactively moved ahead of demand based on intelligent replication policies. The elegance of the approach is that quite surprisingly there are no consistency issues to be tackled even in the presence of replicated data.

Accelerators also address latency problems using transaction prediction. By anticipating client behavior (based on past observations of client-server dialogues), accelerators speculatively inject transactions on behalf of a client based on a model of its past behavior. The result of the predicted transaction is buffered for a small window of time, normally at the client-side accelerator. When and if the client actually issues the predicted transaction, the result can be immediately returned, thereby hiding the effects of the wide-area round-trip. If the prediction fails because the client does not issue the predicted transaction within the window of time allotted for the predicted event, then the results are simply discarded. The amount of time predicted results are held before being discarded can be determined by a configurable parameter and in some embodiments the time is in the range of a few seconds.

The segment cloning and transaction prediction optimizations are synergistic, but it should be understood that they provide benefits even when used alone. By exploiting information known to the segment cloning stage, the transaction prediction logic can modulate its behavior and adjust its aggressiveness to limit its overall impact on the network. For example, if the server-side accelerator decides that it should perform a certain set of predictions on behalf of the client, it first passes the predicted results through a segmenter, e.g., as described in McCanne I. If these results are represented in a sufficiently small envelope of information (perhaps guided by the bandwidth policies described below), they can be shipped across the network to the client-side to potentially short-circuit the predicted client activity. If the results are too large, the prediction can simply be aborted, or the depth and/or scope of prediction can be reduced to adhere to prescribed bandwidth policies.

The combination of the two optimizations provides several important and attractive benefits to WAN client-server communication. Examples include:

Transparency. An accelerator can pass all transaction requests through to the server, just as if it were not deployed at all, so that applications and protocols can work normally without modification, just faster.

Efficiency. A segment cloning process is much more efficient than a file-based process or even block-based process in many instances. Even if a change is made in a file that affects every block of data in the file, the segment cloning system can still recognize commonality across segments and optimize for them. A caching algorithm based on blocks or files would not retain its optimization under those conditions.

Robustness. As files are edited and written to disk, new segments can be created and incorporated into the existing tree without disrupting the existing data structure.

Simplicity. Accelerators can be deployed in an application-independent manner. Complex cache coherency protocols are not required, and accelerators do not have to keep track of every file in every location on the network. Furthermore, because of the shared nature of the data in the segment store, the optimizations are much more broadly realized than alternate approaches.

Application Independent. Since the segments are created through a process that relies on the bit patterns themselves, with no knowledge required of the application in question, the segmentation and cloning process would be independent of the files and applications being used. If there are segments that are common across different filenames, or even across different applications, then the optimizations will still be useful.

Transaction Prediction Versus Caching

Even with segment cloning and other techniques to reduce bandwidth usage, network links still would have an inherent latency imposed by the speed of light, which can have a dramatic impact on overall client-server throughput and performance as described above. This latency can be addressed by transaction prediction using the accelerators described herein.

In most of these examples, a pair of accelerators is assumed. However, as explained the later below, it is possible to perform the transaction prediction described herein using a single accelerator, if paired segment cloning is not done.

An accelerator attempts to anticipate client behaviors before they occur and execute predicted transactions ahead of client activity. Once the client actually issues the predicted transaction, the transaction results can be immediately produced without incurring a wide-area round trip.

Predicting transactions is quite different than caching. With caching, a cache maintains a store of data that represents data objects such as files, file blocks, Web pages, email messages, etc. where the cached data is a copy of all or part of the data object being cached. Those copies must be exact, i.e., a cache must be able to detect when its data no longer matches the official copy of the object (cache consistency) and determine how long to keep what data copies. A cache needs to maintain its store and implement server-like protocol machinery to serve client requests for the cached data objects. Likewise, a cache must implement client-like protocol machinery to issue requests to the server for data that is missing from its cache. While building a store of such objects is straightforward, keeping that store coherent with the original copy in the midst of multiple clients accessing and modifying the objects, with security protocols, locking mechanisms, and so forth all create a complex, difficult to manage architecture.

Transaction prediction, on the other hand, avoids the complexities of coherency by logically sending transactions back to the server.

Unlike a cache, an accelerator that does transaction prediction only needs partial protocol knowledge to know when and if it is safe to perform various optimizations and does not require server or client mechanisms embedded in the system. Another distinction is that caches generally need to maintain their data stores much longer than a predicted transaction's results are maintained, making consistency control much simpler while providing benefits that a caching system might provide.

Figure 20:
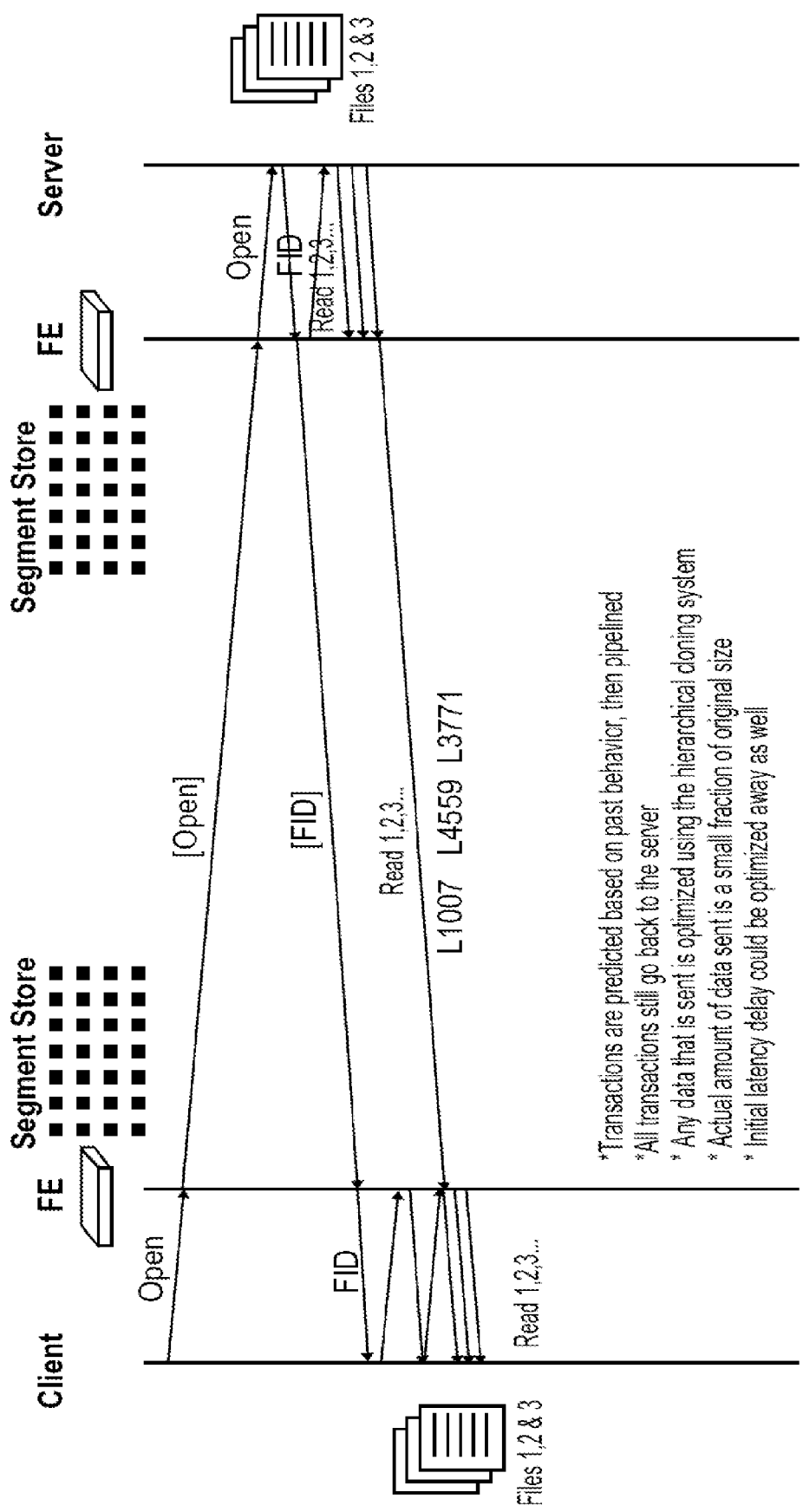
FIG. 20 is a swim diagram illustrating a transaction acceleration process including predicted transactions.

FIG. 20 illustrates, by a simple example, transaction prediction. The swim diagram in FIG. 20 represents the interactions for one instance of a client opening a file and sequentially reading all the blocks of that file. In this example, the "open" request flows across the network through the accelerators (client-side accelerator and server-side accelerator) and ultimately to the origin file server. The server responds with an "open" response. Upon receiving the "open" response from the server, the server-side accelerator is in a position to consult its database of past client behaviors and decide, for example, that the file being opened (perhaps in the context defined by earlier transactions) is always sequentially read and closed. Thus, the server-side accelerator can predict that the next transactions will be requests from the client for blocks of the file, requested sequentially. Once the server-side accelerator that makes that prediction, it can inject synthetically produced read requests into the client's session such that the server would receive those requests as if the client sent them and respond accordingly. The server-side accelerator might further note that once the blocks have been retrieved and passed through the segment cloning subsystem, the resulting transmission to the client-side accelerator would require less than a hundred bytes to convey more than a megabyte of data (as an example) and use that observation to schedule transmission of the results of the synthetic read requests to the client-side accelerator with awareness that the transmission would have virtually no impact on the network.

Figure 21:
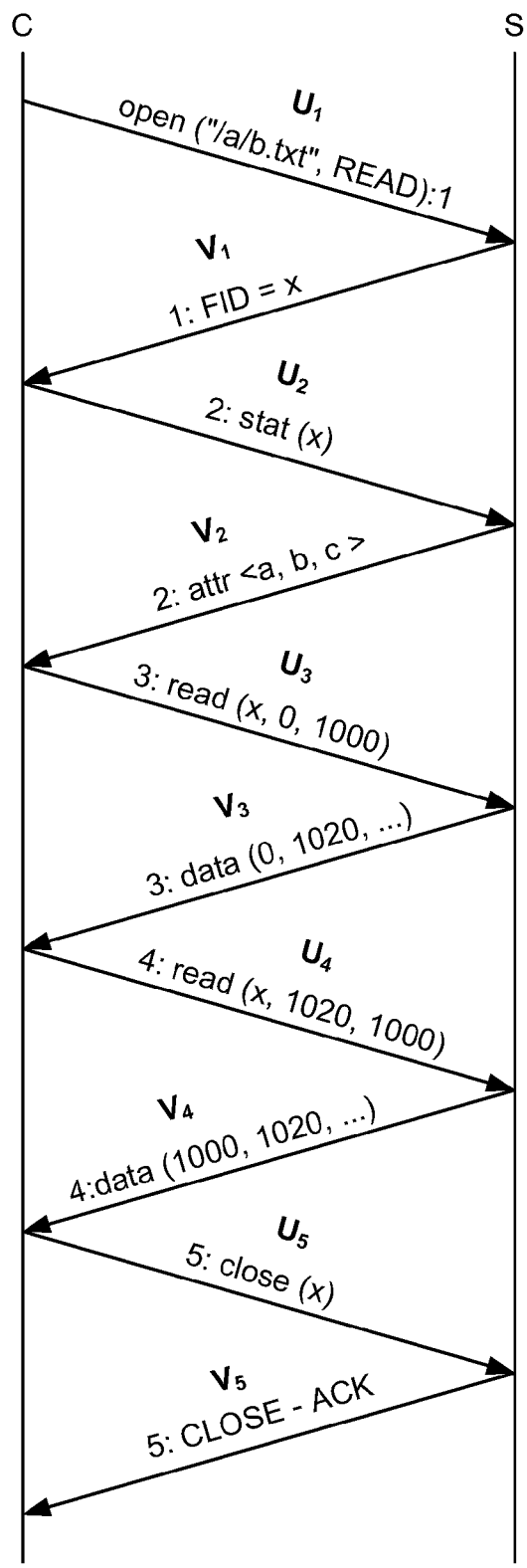
FIG. 21 is a swim diagram of a conventional set of transactions, including a file open, followed by a stat request, read requests and close requests.

FIG. 21 is a swim diagram illustrating a conventional set of transactions, with time running from top to bottom, for an open, a series of reads, and a close.

Unlike this very simple minded read-ahead model, transaction prediction can be done with many other types of client-server based software operating over a WAN. For example, referring to the example sequence shown in FIG. 21, even though the read-ahead is very effective at eliminating wide-area round trips, there is still a round-trip associated with the initial open. In fact, this initial round-trip can also be eliminated by the accelerator when an access to one particular file can predict an access to another file. For example, there may be some earlier transaction that causes the accelerator to send a synthetic open for the file in question (perhaps doing the read-ahead as well) so that all round-trips are completely eliminated. This results in LAN-like performance even though every transaction is served remotely.

With a cache, the operating system at a client (or an agent in a network cache) would pre-fetch file data into a cache and serve that cached data to local clients from the cache thereby avoiding a round-trip to the origin server for each such read from the cache. This approach creates a difficulty in interfacing the cache with access control and security mechanisms in a file system. When a client opens a file for data that has been cached, the cache must invoke all the mechanisms that a server would invoke to ensure that the client has permission to read the data from the cache. With transaction prediction, however, this complexity can be avoided because client requests are not served from a cache but instead, client requests are predicted and injected into the client's active session so interaction between the client and the server can have precisely the same access semantics as if the client were communicating directly with the server.

Accelerators doing transaction prediction can make fairly deep predictions about the set of future transactions that are likely to occur by computing the maximum likelihood path through the Markov chain described later, or using one of many other methods for predicting client behavior. With caching, savings does not come until the cache is filled or partially filled with copies of data objects that can be served up, so first requests to a cache are always slow. With transaction prediction, requests might be anticipated at any time.

However, aggressive pre-fetching can end up wasting precious bandwidth resources on data that the client never uses, so pre-fetching ends up reducing rather than improving the client's performance and as a result, many predictive pre-fetching schemes are very conservative. However, using transaction prediction in combination with a bandwidth saving technique such as segment cloning, predictions can be fairly aggressive, as a little bandwidth is needed to respond to predictions.

As described above, predicted transactions can be used to inject synthetic requests for a data ahead of the actual transaction. Additional examples of how an accelerator might predict a transaction will now be described below.

Prediction System

As transactions are executed between the client and server, intervening accelerators intercept a transaction, use a transaction predictor that compares the intercepted transaction to a database of past transaction behaviors to make decisions about the probability of future events. A learning algorithm can be implemented to summarize past transactions into state that is maintained and updated in the database. This "prediction data base" (PDB) could be stored in accelerator itself, in the accelerator's RAM, on its disk, or across both the RAM and disk. In other embodiments, the PDB could be stored external to the accelerator, e.g., on a database server, whereby the accelerator would communicate with said database via query and update protocols.

A transaction predictor might be integrated with an accelerator, such that each accelerator has its own transaction predictor, but other implementations might have transaction predictors that are separate from the accelerators and not require one-to-one correspondence. In one embodiment of a transaction predictor, the transaction predictor maintains a database of transaction patterns that are patterned using a Markov chain model.

Certain sentinel transactions (such as "file open") represent a state in a low-order Markov model and estimates of the state transition probabilities are maintained by keeping track of the number of times each edge in the Markov chain is traversed. Over time, as more transactions are observed, transition probabilities are improved and the confidence levels increase. For transactions that are not amenable to prediction, confidence levels never increase, which informs the transaction predictor to be less aggressive in such cases.

Different types of information can be attached to each state (e.g., to remember that in a certain state a file is read sequentially). By computing maximum likelihood path through the Markov chain given the current state, fairly deep predictions can be made about the set of future transactions that are likely to occur, allowing the transaction predictor to anticipate client activity several transactions before it actually occurs.

Based on this Markov model, if a transaction predictor determines that there is a very high likelihood of a future transaction occurring, it may decide to go ahead and perform that transaction rather than wait for the response from the server to propagate back to the client and then back to the server. The performance improvement in this scenario comes from the time saved by not waiting for each serial transaction to arrive prior to making the next request. Instead, the transactions can be pipelined one right after the other.

Predicted transactions are preferably only executed ahead of the client's actual transaction when it is safe to do so. To this end, transaction predictors might be designed with enough knowledge of the underlying protocols (e.g., CIFS oplocks, etc) to know precisely when and if it is safe to do so. In cases where such predictions are unsafe, the transactions are simply relayed back to the origin server and the benefit of transaction is lost in these rare cases. Fortunately, a wide range of important applications turn out to have very predictable behaviors and, as a consequence, transaction prediction can enhance performance significantly.

Transaction Predictor Components

Figure 22:
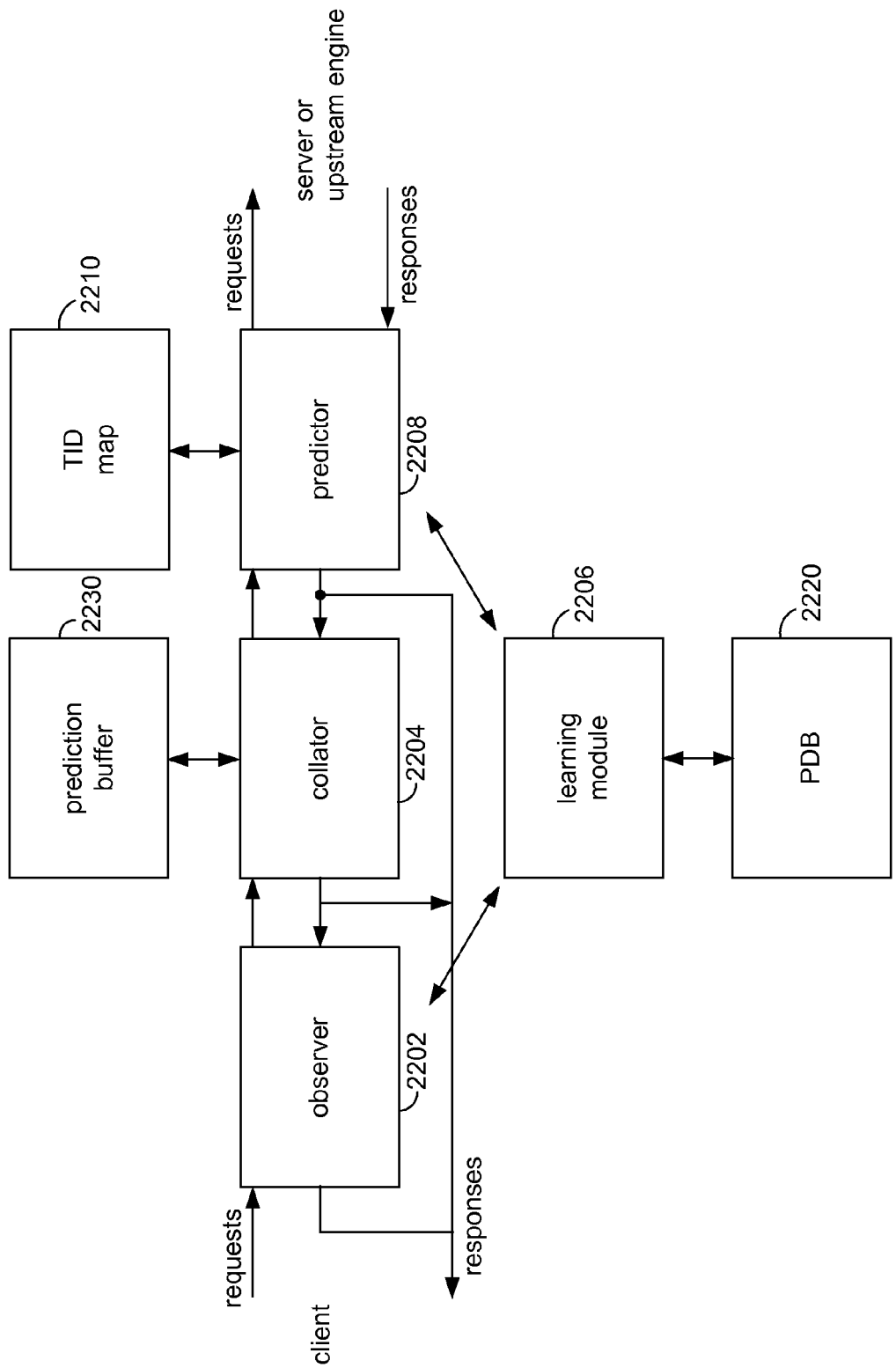
FIG. 22 is a block diagram of one possible arrangement of a transaction predictor.

FIG. 22 illustrates one possible arrangement of components in a transaction predictor 2200. These components represent modules that comprise the higher-level CSIM and SSIM entities illustrated in FIG. 6. As shown in FIG. 22 transaction predictor 2200 comprises an observer module 2202, a collator module 2204, a learning module 2206, a predictor module 2208, and a transaction ID mapping table 2210. A persistent prediction database 2220 is also shown. In this example, persistent prediction database 2220 is part of learning module 2206 and prediction buffer 2230 is part of collator module 2204.

In one variation of the transaction predictor, one instance of each of the modules is invoked for client-server session or transaction stream, except that learning module 2206 (and prediction database 2220) operates over all sessions and streams for a global view. When a new client-server session is established, the per-session modules are allocated to manage the data flow and perform transaction predictions. When a client-server session terminates, the per-session modules are simply freed up and all data in any predicted requests that remains is discarded. The knowledge inferred from observations of transactions patterns is stored persistently in the global learning module 2206, which persists across sessions.

A collection of modules situated in an accelerator near the server may cooperate with another collection of modules situated in an accelerator near the client to perform cooperative transaction prediction. For example, the transaction predictor at the server-side accelerator may execute predicted transactions and transmit the predicted result over the network to the transaction predictor at the client-side accelerator. In another variation, the client-side accelerator may compute the set of predicted transactions that should be performed, communicate this information to the server-side accelerator to execute the predicted transactions and return the results with optional modifications or based on certain conditions.

These interdependent components of a transaction predictor take one approach to transaction prediction by monitoring client transaction patterns, injecting predicted transactions into the client-server communication stream, and collating predicted results with future client requests. In other embodiments, fewer modules might be present or additional modules might be present.

Request-response protocols typically use transaction identifiers (TIDs) and those are useful in transaction prediction. TIDs provide clients with an easy way to match responses with requests, and request-response protocols typically include some form of a TID in the header of each request and response message. When responding to a request, the server may copy the TID into the response message. The use of TIDs allows messages to be processed out of order and/or in parallel while simultaneously allowing the client to relate each response back the request it had originally issued.

When performing transaction prediction, the transaction predictor generates a TID to attach to each predicted transaction that is preferably distinct from any TID from any actual client-generated transaction TID. If the transaction predictor chooses a TID that conflicts with a TID for a client-generated transaction that is pending, the accelerator might erroneously match the response for the client-generated transaction with the request from the predicted transaction. Likewise, if the client chooses a TID that happens to have been used by a predicted transaction that is pending, then the responses can likewise be confused. To avoid these problems, the transaction predictor preferably tracks the TIDs of client-generated requests and ensures that conflicts do not arise. One method for accomplishing this is to map all requests onto new TIDs that are guaranteed not to collide. This mapping can be maintained in a table so that when the corresponding response arrives from the server, the TID can be mapped back to its original value. Each entry in the table could store an indication of whether the request was originally generated by the client or was synthetically generated by the transaction predictor as part of transaction prediction.

Observer module 2202 monitors the stream of transactions and attempts to "learn" the patterns of transactions by storing certain modeling information in the persistent prediction database 2220. To this end, when a client transmits a request, observer module 802 receives the request and updates learning module 2206 with whatever information is required for the particular learning algorithm that is in effect. Many different approaches for the learning algorithms are possible. Some of these approaches are described herein in later sections.

Collator module 2204 receives the request from observer module 2202 once server module 2202 finishes its processing. Collator module 2204 consults the prediction buffer 2230 tied to the client session associated with the request portion of the transaction currently being handled to see if the transaction has been predicted. The result may or may not be present, as the request might still be in transit between the client and the server. If the transaction had been predicted, then it is not sent to the server. Instead, if the response is present in the prediction buffer, then that result is returned. If the result is not present, then the request is stored in collator module 2204 to wait for the response that is in transit.

When a response arrives, predictor module 2208 intercepts the response and queries transaction ID mapping table 2210 using the transaction ID from the response to determine if the response was the result of a predicted transaction or of a normal client request. In the latter case, the response is simply forwarded to the client. In the former case, the response is stored in the prediction buffer for that transaction ID in anticipation of the corresponding request from the client. When the result is stored in this fashion, the transaction predictor also checks for a waiting request in collator module 2204. If a corresponding waiting request is present in collator module 2204, then the response is matched against that waiting request and sent on the client (after modifying the TID to match the TID used by the client in the successfully predicted transaction).

If a request for the predicted response does not occur within a prescribed amount of time, the response may be dropped from the prediction buffer. If such a request does arrive for the predicted response, then the predicted result is returned to the client (after modifying the TID to match the TID used by the client) and the response is removed from the prediction buffer.

To further enhance the benefits of prediction, predictor module 808 may decide, based on measurements or inherent knowledge of the underlying protocol and/or application, that the predicted transaction might be used again later. In this case, rather than delete the predicted response from the prediction buffer altogether, it can predict that the same response may be needed and transmit an identical synthetic request to the server. Based on inherent knowledge of the underlying protocol and/or application, if the predictor can further deduce that the result will be the same, then the value could be immediately re-saved into the prediction buffer rather than waiting for the response from the server.

While the description of a transaction predictor describes how predicted transactions can be synthetically injected into a client-server session and how responses can be collated with actual client requests, these operations are described independently of how particular transactions might be predicted. The particular decisions about which transactions can be predicted and the particular predicted transactions can be determined in a modularized fashion. Different prediction mechanisms can be employed within such a module to provide different tradeoffs in terms of implementation overheads (storage, computation, etc.) versus the overall efficacy of the process.

Several approaches to predicting transactions are described herein. One approach involves the use of a static model based on configured logic. Another approach involves the use of a dynamic model based a learning algorithm that observes past client-server transaction patterns to anticipate and predict future transactions. There are many such approaches and only a few are disclosed herein. It should be clear to one skilled in the art, provided the disclosure herein, how to integrate other learning models into the transaction predictors and/or transaction accelerators described herein.

Static Prediction: Protocol-Specific Rules

One approach to transaction prediction is to encode static logic into the transaction predictor that recognizes common transaction patterns and performs prediction accordingly. This approach can be thought of as programming the transaction predictor with a set of "recipes". Each recipe represents a pattern or set of patterns that are to be recognized along with a set of predicted actions that can be taken on behalf of the recognized pattern. These recipes would typically be protocol and/or application dependent. For example, in the context of a file system, one recipe could be to recognize open-file requests that include "read access" to cause certain file reads to be performed. Similarly, an open request could cause a certain type of "stat" operation to always be predicted since a stat is an inexpensive operation compared to the large round-trip associated with performing the operation across a WAN.

Alternatively, a recipe could be more complex. For example, certain specific patterns of file-system behavior could be matched against a database of static patterns that identify certain applications. Put another way, when a certain pattern is encountered, the transaction predictor can conclude with high probability that a certain application is in fact the client program (otherwise, at the network file system level there is no knowledge of what application is invoking the file system protocol). Once the transaction predictor knows what application is running, then it can perform various optimizations that have been statically configured into the system that will benefit the particular application that is running.

Dynamic Prediction: A Markovian Learning Module

While static prediction can be very effective at anticipating client protocol behaviors, and even more powerful approach is to rely on dynamic prediction logic, which employs a learning algorithm to leverage past client behaviors to predict present and future transactions.

One approach to the learning algorithm is to adopt a "literal" model, where every transaction is recorded in a data structure that models pair-wise relationships between subsequent transactions. Transaction prediction works by modeling client-server transactions as a sequence of requests from one or more clients and attempts to predict future requests from the present and past observed requests (and optionally responses). In one embodiment of the literal model, each request is explicitly represented by a state in an Nth-order Markov model. As requests are observed, states are added to the Markov model and transition problems updated between the states. For the purposes of discussion, let the sequence of observed client requests be denoted as $\{U_1, U_2, \ldots\}$ and the sequence of observed server responses be denoted as $\{V_1, V_2, \ldots\}$.

Each particular request Uk comprises an operation code ("opcode") and one or more parameters, i.e., Uk=(opcode, p1, p2, ... pM). The corresponding server response typically comprises one or more values (often including an error status that can also be viewed as a special type of value), i.e., Vk=(v1, v2, ... vN). Note that a value can be any of a number of common data types, e.g., from a simple integer result to a large buffer of data. As described above, in many client-server protocols, the request includes a TID, which is copied into the server response so the client can collate the responses to pending requests to allow for multiple outstanding requests and/or message reordering.

For example, a file open request might comprise an opcode for "file open", a file name, and an access mode (e.g., read, write, etc), e.g., Uk=(OPEN, "/a/b/c.txt", RD_ONLY).

FIG. 21 depicts a set of transactions between a client and server that would be modeled by the prediction system. This example is illustrative of a network file system protocol such as CIFS or NFS. Each transaction request and response is labeled $U_1$, $V_1$, etc. using the terminology defined above. Similarly, a TID is prepended to each request and response. In this example, the client opens a file for read access ($U_1$), and the server responds with a file handle to be used in subsequent operations on the file ($V_1$). Then, the client issues a "stat" call to retrieve various attributes about the file ($U_2$), which the server returns ($V_2$). Then, the client reads the first 1000 bytes of the file ($U_3$), which the server returns ($V_3$). Likewise, it reads the next 1000 bytes ($U_3$, $V_3$). Finally, the client closes the file ($U_4$), and the server acknowledges the operation ($V_4$).

Figure 23:
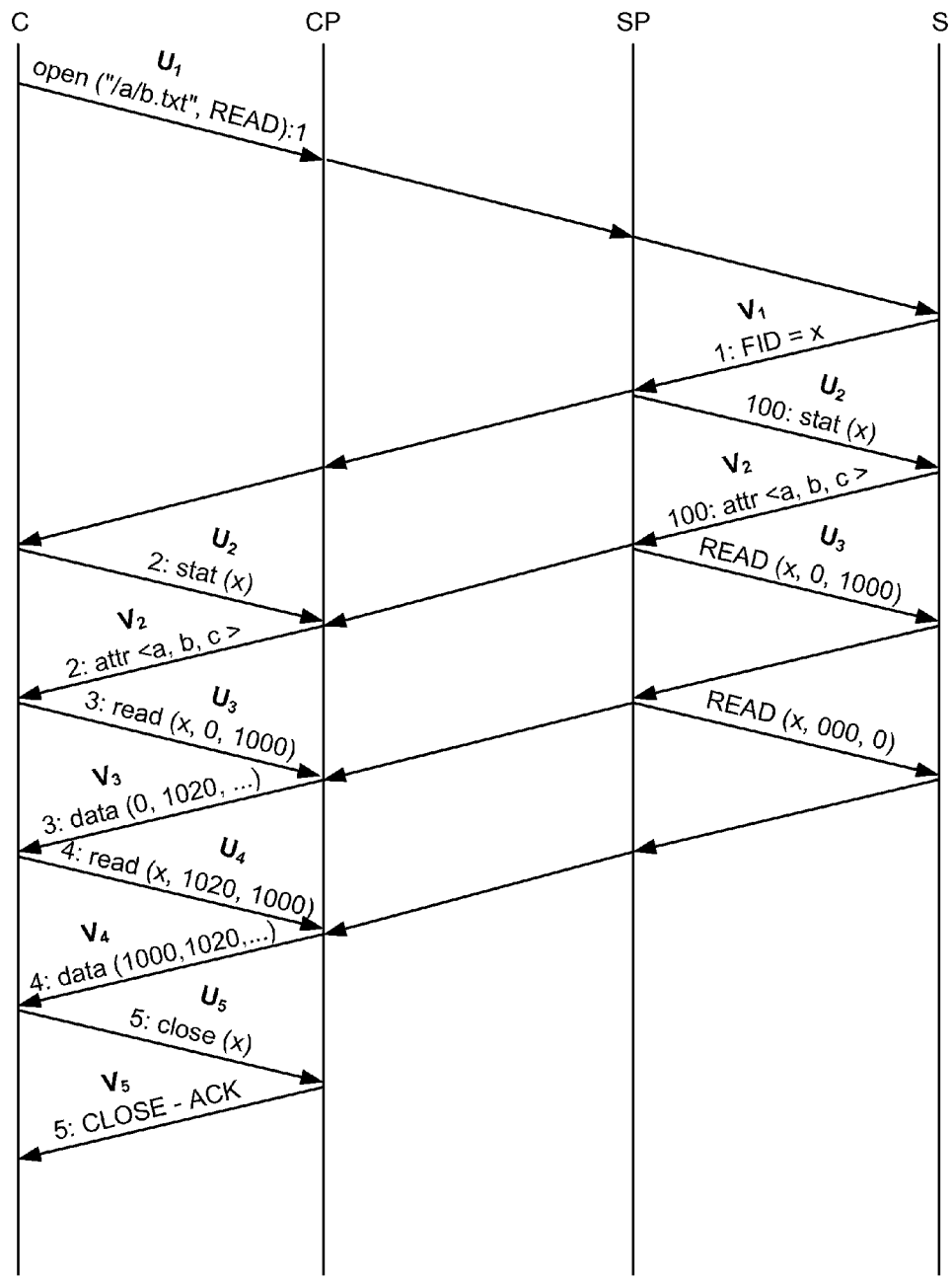
FIG. 23 is a swim diagram of the requests shown in FIG. 21, with transaction prediction used to accelerate the requests.

FIG. 23 shows how the example transaction sequence of FIG. 21 might be optimized across a WAN using transaction prediction. Here, the transactions flow through two accelerators, one near the client and one near the server. When the open response arrives at the server-side accelerator (V1), prediction can occur because the file is opened and the file handle is available. Presuming the learning algorithm has gathered sufficient information, predicted requests can be executed against the open file. In this example, the predictor at the server-side accelerator generates requests $U_2$, $U_3$, etc. and relays the predicted results $V_2$, $V_3$, etc. across the network to the client-side predictor module. When the client issues the actual requests ($U_{10}$, $U_{11}$, etc.), the client-side accelerator maps the TIDs of the predicted results to the TIDs that the client used and returns the result, thereby eliminating many wide-area round trips.

Figure 24:
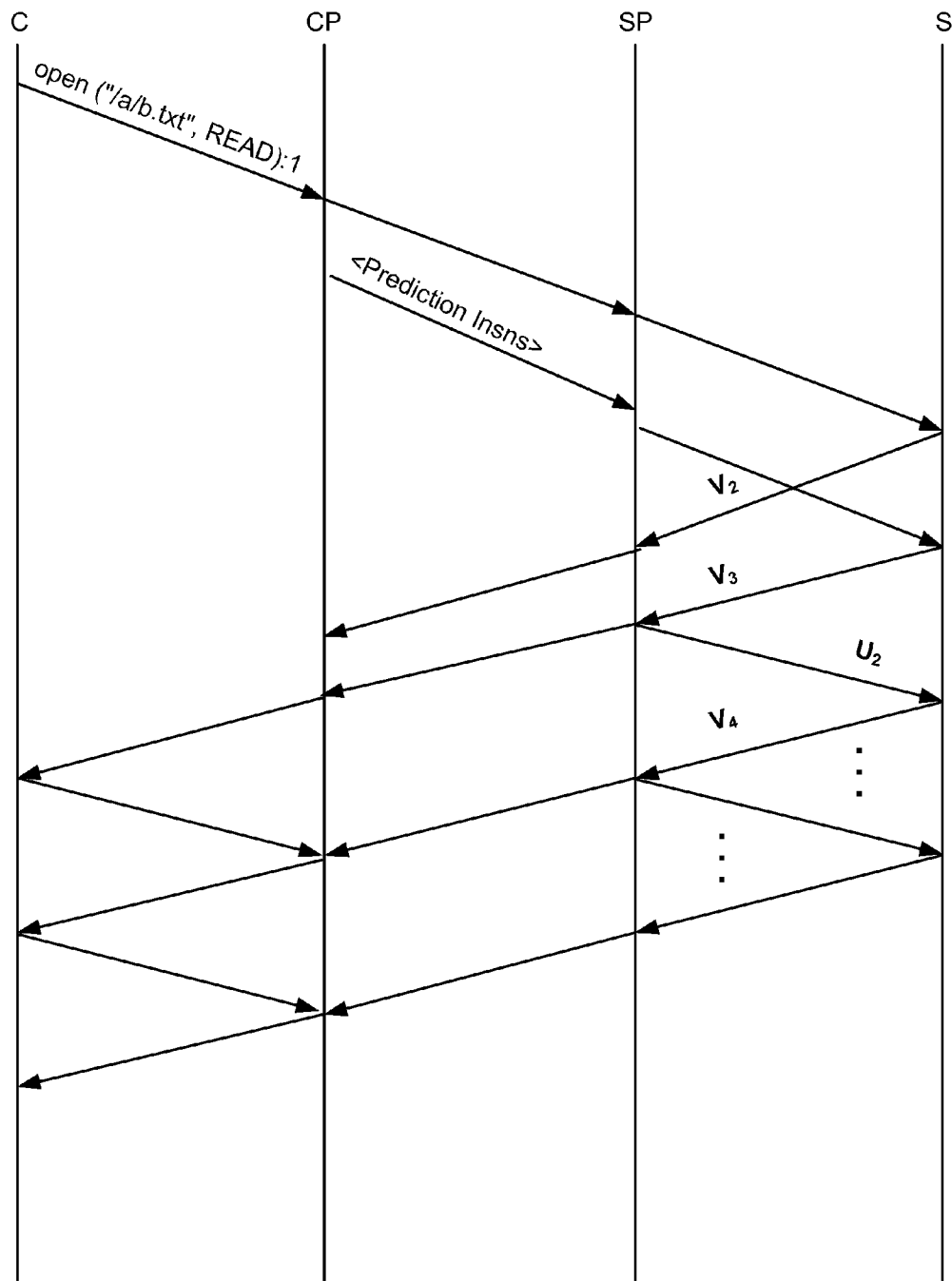
FIG. 24 is a swim diagram illustrating transaction prediction performed at the client side of an accelerator pair.

FIG. 24 illustrates another approach. There, the client-side accelerator determines what predictions are to be carried out and sends a message summarizing those predictions to the server-side accelerator. At this point, because the client-side accelerator does not have the file handle corresponding to the open file, it cannot send the actual predicted transactions verbatim, but instead sends a template of the predicted transactions that the server-side accelerator executes against. This template can be implemented in a number of ways including a scripting language, a byte code program for a virtual machine, or a template definition that defines a data structure that can be interpreted by the server-side accelerator.

Building the PDB

In one embodiment of the present invention, the Markov model managed by learning module 2206 is stored the persistent prediction database (PDB). PDB 2220 contains a set of "states" and a set of "edges". Each state represents a single request (i.e., an opcode and literal parameters), or in higher-order Markov models, could actually represent a fixed-length sequence of requests. An "edge" represents a predictive relationship between states. In different embodiments of transaction predictors, an edge may represent different aspects of correlation between subsequent transactions. To develop the model, suppose Si and Sj are two states representing requests Ui and Uj. Then, some example schemes for mapping transaction sequences onto states and edges in the Markov model are as follows:

Scheme 1. Whenever a request Uj follows Ui in exact sequence in one or more observed client-server transaction streams, then there is an edge (Si, Sj) in the PDB.

Scheme 2. Whenever a request Uj follows Ui with at most W intervening transactions then there is an edge (Si, Sj) in the PDB. With this scheme, one transaction may predict another even if intervening transactions exist.

Scheme 3. Each state has a limited number of edges, say N, originating from it. Whenever a request Uj follows Ui in exact sequence in one or more observed client-server transaction streams, then an edge (Si, Sj) is added to the PDB. If the number of edges emanating from Si exceeds N, then the least recently referenced such edge is removed from the PDB. This not only limits the amount of storage required for the PDB, but it can also improve the system's speed of adaptation.

Figure 25A:
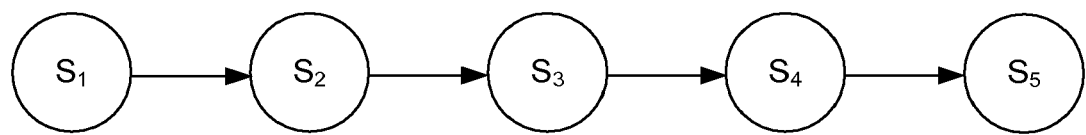
Figure 25B:
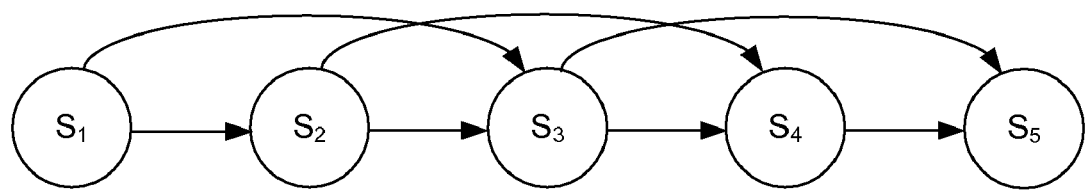

FIGS. 25A and 25B respectively illustrate Markov models representing Scheme 1 and Scheme 2, where W=2. In this example, if the transaction predictor happens to see $U_3$ (represented by $S_3$), then it can conclude with high probability that $U_4$ (represented by $S_4$) will occur next.

Each edge represents the Markov relationships between two states, and as such, is tagged with an estimate of the transition probability between those two states. That is if the sequence of states is defined as the random process $S(0), S(1), \ldots$ and the current state $S(k)=u$, then the transition probability that the next state $S(k+1)$ is some other state v, is $P(S(k+1)=v|S(k)=u)$, which for a first-order Markov model is equal to $P(S(k+1)=s|S(k), S(k-1), \ldots S(0))$. This important property allows for the modeling of predictions by keeping just one state per possible transaction. There is a tradeoff here, however, in that the underlying transaction patterns are not necessarily well-modeled with a first-order Markov model (which says the transition probabilities depend only on the current transaction and not on past transactions). Thus, in exchange for a higher degree of implementation complexity, the present invention embodies higher order Markov chains. For example, in a second-order model, each state would represent two adjacent transactions so that the transition probability would be dependent on the current transaction and previous transaction (yet remain independent of all prior transactions).

To compute the Markov chain transition probabilities, learning module 806 observes a stream of client requests and might maintain PDB 2220 as follows. In this explanation, a first-order Markov model is assumed but it would be obvious to one skilled in the art from this description how to extend this to higher-order Markov models. Associated with each edge is a count of how many times it has been logically traversed (i.e., how many times the two transactions represented by the head and tail of the edge have been encountered adjacent to each other). For each new transaction encountered, the set of edges that are logically traversed by the observation are computed and the edge counts are updated according to the definition of the edge (as outlined in the various schemes defined above). Then the probability of each edge emanating from a particular state can be computed as that edge's count divided by sum of all the edges' counts emanating from that state.

Figure 26:
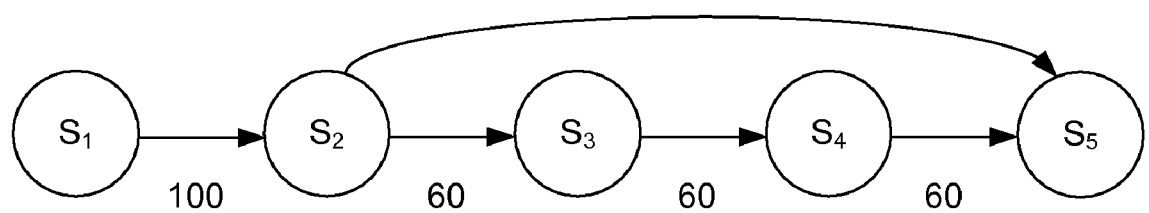
FIG. 26 illustrates a state diagram for a Markov model used for transaction prediction including edge counts.

FIG. 26 illustrates how edge counts can be used to make predictions. Given the example of FIG. 21, assume 100 accesses to the file in question, wherein the transaction sequence from FIG. 21 occurred in 60 of those accesses, while in the other 40 accesses, a different sequence occurred, such as $U_1, V_1, U_2, V_2, U_5, V_5$, i.e., the client opened and performed a "stat" operation on the file but did not read any data. This situation is modeled by the Markov chain with edge counts as depicted in FIG. 26 Thus, when the transaction predictor observes transaction $U_1$ (corresponding to $S_1$), then it knows with very high likelihood that $U_2$ will occur but is only 60% certain that $U_3$ will occur. Given this information, the transaction predictor may choose to perform requests $U_3$ and $U_4$ or not depending on the level of aggressiveness desired. Alternatively, the transaction predictor could allocate a certain bandwidth budget to predictions and perform them only if there is available bandwidth to ship the resulting data across the network. Moreover, the decision to execute predicted transactions could be tied to the segment cloning system described above. For example, if the result of $U_3$ and $U_4$ after passing through the segmentation scheme are represented in just a few bytes, the cost for sending the results across the network are virtually free so the transaction predictor can afford to be aggressive. As a result, the transaction predictor can explore multiple paths through the Markov model simultaneously in a way that controls the impact on the underlying network.

Since transaction patterns evolve and change with time, a single monotonically-increasing edge count can become problematic because over time it will give too much weight to past observations relative to recent observations. An alternative approach is to apply an exponentially weighted moving average to the edge counts. At fixed intervals, all the edge counts are updated by multiplying them by some fixed constant K<1. Yet another approach, which requires less computational overhead, is to limit the sum of edge counts emanating from a node. When the sum reaches or exceeds this limit, the count on each edge emanating from that node is reduced, again by multiplying by K.

Since the number of states and edges can grow over time without bound, learning module 806 may impose a limit on the amount of state that is maintained. Different algorithms may be used to decide which entries to remove from PDB 2220 as they become old or infrequently used. For example, a node that corresponds to an operation on a file that has been removed from the file system would eventually be deleted. Because PDB 2220 provides a predictive optimization and it is not relied upon for correct operation of the protocol, PDB 2220 can maintain a fixed number of entries that are aged and replaced as necessary.

Sentinel-Based Model

One challenge with the literal model described above is the large amount of state that is required to represent every conceivable transaction pattern. While this approach can work well in many environments, it can be improved upon by introducing a mechanism that allows the system to trade off performance for state, while improving performance by providing context-dependent signaling mechanisms. In this approach, certain "sentinel" transactions are used to anchor the transaction stream. Each sentinel transaction represents a state in the Markov chain, and then dynamic prediction state (as well as static logic) is tied to that sentinel state. For example, in the context of a file system protocol, sentinel transactions might correspond to all "file-open" requests.

Given this, each state essentially represents the transaction activity associated with the particular file opened in the request at hand. Attached to this state, then, could be dynamically collected information such as how frequently this file is opened and read in its entirety, whether this file is always read sequentially or randomly, how often this file is written to, how and when "stat" operations are applied to this file, how often is this file opened in error, etc.

Given a collection of such information, when a predictor sees (or predicts) an open for a particular file, it can perform a set of predicted transactions that are synthesized using a combination of logic and the dynamic information collected. For example, if the predictor knows that 99% of the time the file is written to and never read, then no predictions might be carried out (because the writes cannot be normally predicted by the predictor). However, if the predictor knows that 99% of the time the file is opened, a few blocks are read, then the file is closed, then usually all of the requests can be effectively predicted and transmitted across the network ahead of the actual requests.

Moreover, information can be maintained about files that do not exist to optimize the case that an application checks for the existence of a file by attempting to open it. This, somewhat surprisingly, can be quite common. To accelerate this case, the predictor can again predict that an open for such a file is forthcoming and issue it ahead of time, moving the error result (i.e., the knowledge that the file does not exist) into the prediction buffer near the client. Again, performance is enhanced in this case because round-trips are shielded from the end-client by working ahead of the client request behavior.

Transformable Transaction Prediction

In certain cases, it is possible to predict the nature of a transaction but not a detailed format that the client request will embody. Often in these cases, there is enough information to make an educated guess about what the client will do, and if the client transaction varies a bit from the predicted transaction, it is possible to convert the predicted result into a result that will satisfy the actual client request. This process is called transformable transaction prediction.

For example, suppose the predictor guessed that the client would issue two 8 kilobyte (KB) reads, but in fact the client issued one 16 KB read. Given the fact that the two 8 KB reads can be easily transformed to a single 16 KB read, the predictor at the client site is free to perform such transformations. Likewise, if the predictor predicted that a file would be opened for both read and write access, but the client opened the file for read-only access, then the predictor is free to use the result of the predicted operation and ensure that no writes are executed by the client (and if locking is present that the write-sharing lock could be preemptively broken so as to not disrupt other client accesses to the file).

Proactive Segment Distribution (PSD) Interfaces

As described above and also in McCanne I, segment cloning can be driven either by client activity or by a server-side process that proactively distributes segments from a server-side accelerator to one or more client-side accelerators. Rather than including the complexity of proactive segment distribution (PSD), an accelerator might simply expose a protocol interface for PSD so that external agents can be built that perform such functions, e.g., for content distribution, file system replication, e-mail delivery, and so forth.

One interface is a simple mechanism that allows an external process to "post" normal data into the system, using HTTP post, for example. For this use, the HTTP message's header is extended (as the protocol allows) to include the destination IP addresses of the client-side accelerators as well as authentication information. The HTTP post message's body contains raw data. Upon receiving a PSD request, the server-side accelerator simply pushes the data through the segment-cloning system to the desired client sites. Each client-side accelerator receives the corresponding segments, updates its segment store, and otherwise discards the original data buffer. In this fashion, the segment store can be pre-populated with data that an external site might know will be of use at that location.

With this interface, the accelerator architecture effects an important separation of policy and mechanism, i.e., the mechanism for performing PSD is factored out from the myriad of agents that could be built to implement various sorts of replication logic.

This approach is powerful for at least two reasons. First, it allows interesting integration opportunities to be implemented in customer environments either by the customer itself or by consultants. For example, a customer might have an existing business application that could benefit from the ability to move data proactively out of an application server and into client-side accelerators. With the PSD interface, this could be carried out quite easily in many cases.

Secondly, this approach allows accelerators to integrate easily with existing server systems. For example, an agent could be placed inside a file server that monitored file system activity and based on configured policies, performed segment distribution in response to file changes. This approach is quite elegant because it achieves most all the benefits of file system mirroring without actually having to mirror the file system. Additionally, unlike point-in-time systems, which are continually out of date with respect to the master file server, in the present approach, the client site can remain 100% synchronized with the master file server because accelerators logically send all transactions back to the server (even though the data might be actually mirrored and not sent over the network when a client accesses it).

Variations

With knowledge of the underlying client-server protocol, transaction accelerators can inject transactions toward the server in anticipation of client needs and provide the response to the client with less latency. In some cases, the accelerators can short-circuit a client transaction and not forward it on to the server if the accelerators can ensure the semantics of the underlying protocol are preserved. However, in other cases accelerators need not have complete information about the underlying protocol and just match up requests and responses, while the server (or other element) ensures that an accelerator is not given data in a manner that a client would get data that is incorrect. When combined with segment cloning or other transformations, transactions can be injected aggressively toward the server with little resulting impact on the network, thereby providing greater transaction performance to the end client.

In some cases, protocol specific enhancements might be used. For example, where a protocol includes response packets, a client might initiate a file open transaction by sending a file open request. One of a pair of accelerators (client-side, server-side) might predict a transaction and generate a synthetic request to the server, such as a request to read the first block of the file that is being opened. The server-side accelerator might then receive the response to the read request and include that data in a response message send back to the client acknowledging the file open request. The client-side accelerator could then store that read data and use it to make up a response for the client request for a file read, if and when that client request comes in as predicted.

Summary

Using the transaction accelerator and a transaction predictor, distributed infrastructure can have a performance as if it were centralized, thus allowing key assets to be centralized rather than being duplicated at multiple distributed sites. One advantage of this is that systems that assume that they are local resources, and behave accordingly on a network, can be implemented remotely while maintaining the performance of local access.

Transaction prediction processes take advantage of the highly predictable nature of most applications and can pipeline multiple transaction requests into single transactions whenever possible. Notably, transaction prediction also works where some transactions are not predictable and others are partially predictable. Transaction prediction might result in a synthetic transaction request being generated in advance of the actual request, with the results of the synthetic transaction being held until the predicted transaction actually occurs.

In addition to better supporting systems that expect local access levels of performance, transaction accelerator is as described herein can enable new services that are otherwise impractical, such as remote branch office database backups.

The transaction accelerator can be implemented without client or server changes and can thus be entirely transparent. Furthermore, with the automatic proxy discovery mechanisms and techniques described in McCanne IV, accelerators can pair up to provide improved network performance without the clients or servers even needing to be aware of the presence of the transaction accelerators.

The transaction accelerators need not be tied to any particular protocol or application. Some versions might support a limited set of commonly used protocols (i.e., CIFS, NFS, HTTP, FTP, WebDAV, Remote Backup, etc.), with extensibility over time as users dictate.

Transparent Proxy Pair Auto-Discovery

A general problem when deploying multiple network entities in a cooperative scenario, in which the devices must coordinate and interact with one another, is that of configuration. This problem is especially acute when trying to deploy cooperative transparent proxy functionality that depends on several cooperating network entities, such as where network traffic between a client and a server is to be intercepted by one proxy that in turn communicates with one or more other proxies to process the network traffic. In general, the proxies may modify or otherwise process the client-server traffic using techniques that are incompatible with the original client-server protocol and thus require a proxy at some point to process the data back to a form that is compatible with the original client-server protocol. The conversion of the data back into the compatible form could be a conversion packet to data identical to what was converted, but need not be identical so long as protocol requirements are met.

Devices such as L4 switches can intercept network traffic without explicit client and/or server configuration, but that approach cannot accommodate proxy pairs, where an intercepting device pairs with another intercepting device such that the first device transforms the data and the second device untransforms the data to reconstitute exactly what the first device received or to generate data that is not exactly what the first device received but is in conformance with the protocol. For example, transformation might include the removal of extraneous data and further transformation, while the untransformation does not add back the extraneous data but does an inverse of the further transformation. In such a scenario, a given proxy must still be aware of the existence and network address information of the other cooperating proxies. For example, in a system where two proxies are performing a transport layer compression operation such as the segment cloning described in McCanne I, the two proxies that form a proxy pair need to be aware that there is a corresponding proxy also in the network path to perform the compression operation.

As used herein, "proxy pairing" is a process of associating two proxies. The two proxies are members of a proxy pair and each member of a proxy pair is aware of the other member of the proxy pair and knows its address (or other identifier). A given proxy can be a member of more than one proxy pair. Where a given proxy is a member of a plurality of proxy pairs, the other members of those proxy pairs can be distinct or can be duplicative, i.e., there might be more than one proxy pair that has the same two members. In some cases, a proxy pair might be generalized to a "proxy grouping" of more than two proxies for purposes equivalent to what a proxy pair might do.

Generally, a proxy pair exists in relation to one or more transactions. Thus, proxy A and proxy B might be paired for some transactions and not others. Often, two proxies are paired for all transactions between pairs of particular clients and particular servers. In most instances, a proxy pair comprises a client-side proxy ("CP") and a server-side proxy ("SP") and each member of the proxy pair is aware of which side (client or server) they are on.

The proxies in a proxy pair can become aware of the pair and the other member (and which side they are on) by being explicitly configured as a proxy in a proxy pair, the proxies can become aware based on information provided by a client or a server (which typically requires an appropriately configured client or server), or the proxies can automatically discover possible proxy pairs using techniques described herein. Naturally, if proxies can discover proxy pairs of which they are members without any assistance from a client, a server or a network configuration, in a way that such discovery can have been transparent to clients and servers, operation and maintenance of a proxy pairing system is greatly simplified.

Once the proxies in a proxy pair are aware of the pairing and the other member, the pair can intercept network transactions. Once intercepted, such proxies are able to implement performance-enhancing optimizations to both the transport protocol as well as the application data payloads in a transparent fashion and thus remain backward compatible with existing deployments of clients and servers. With the pairing, the optimizations need not conform to the end-to-end network protocol, as each proxy can undo nonconforming operations of the other proxy.

Connection interception can be done by a number of different devices, which might involve hardware, software, or both. Interception can be done with a computer, computing device, peripheral, electronics, or the like, and/or using an application being executed or controlled by such element. The interception mechanism can be integrated into a network device such as a router or a bridge, such that some of the traffic that flows through the device is altered by the interception mechanism. The interception mechanism may alternatively be integrated into the client and/or the server itself. Thus, when describing herein a client-side proxy and/or server-side proxy, those terms need not necessarily refer to separate physical hosts or computing entities, but may be logical entities that are part of the client, the server, and/or any other routers, devices or hosts along the network path between the client and server.

The general term "proxy device" is used to refer to a proxy that could be a client-side proxy, a server-side proxy, or both (client-side proxy for some pairs/transactions, server-side proxy for other pairs/transactions). The functionality described herein as the CP and the functionality described herein as the SP can exist in one proxy device, such that the proxy device functions as both an SP and a CP, simultaneously, for different client-server connections.

It should be understood that while clients, servers and proxy devices are shown herein in various places as stand-alone boxes, clients, servers and proxies can be implemented as discrete hardware elements, software elements running on a programmable computing element (desktop computer, handheld device, router, switch, embedded logic device, etc.), firmware, or some combination, running as distinct elements or integrated with other elements. For example, a router might include software to implement a proxy device ("PD") that might be a CP or an SP for some transactions, with that CP or SP functionality entirely implemented as part of the router.

Figure 27:
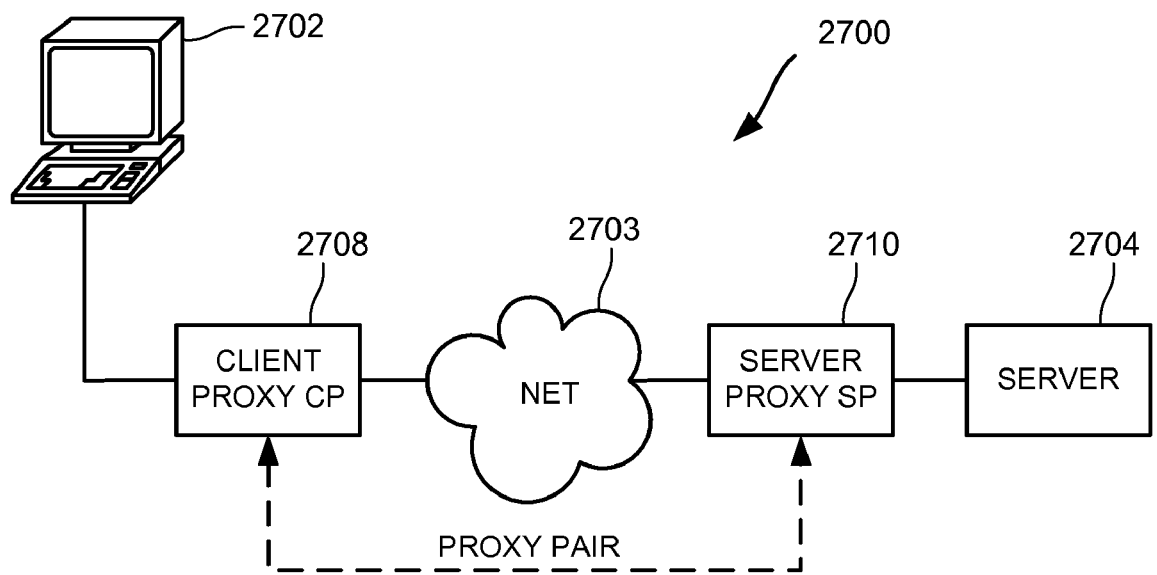
FIG. 27 is a block diagram of a networked system where a client-side proxy and a server-side proxy are interposed in a network path between a client and a server.

FIG. 27 illustrates a simple example of a networking configuration wherein a proxy pair is interposed in a network path between a client and a server. As shown there, system 2700 can be used for communications between a client 2702 and a server 2704 across a network 2703. In a number of examples, network 2703 is a WAN, but this description is not so limited. A proxy pair comprises a client-proxy CP 2708 and a server-proxy SP 2710. CP 2708 is interposed between client 2702 and network 2703, while SP 2710 is interposed between network 2703 and a server 2704.

For the sake of clarity and simplicity, client 2702, server 2704, CP 2708, and SP 2710 are shown as separate computing entities, but that need not be the case. Most of the description below assumes that CP 2708 and the SP are "in-path" between client 2702 and server 2704 such that all network packets sent from client 2702 to server 2704 pass through CP 2708, then SP 2710, then reach server 2704, and vice versa, but other paths are possible. There may be any number of other hosts and/or network devices (not shown), comprising a routed data network, between client 2702 and CP 2708 and SP 2710 and server 2704.

Later discussion describes elements of relevant systems with respect to the topology of FIG. 27, however other more complex topologies are possible. For example, FIG. 28 shows how multiple devices can be present in a networked environment.

Figure 28:
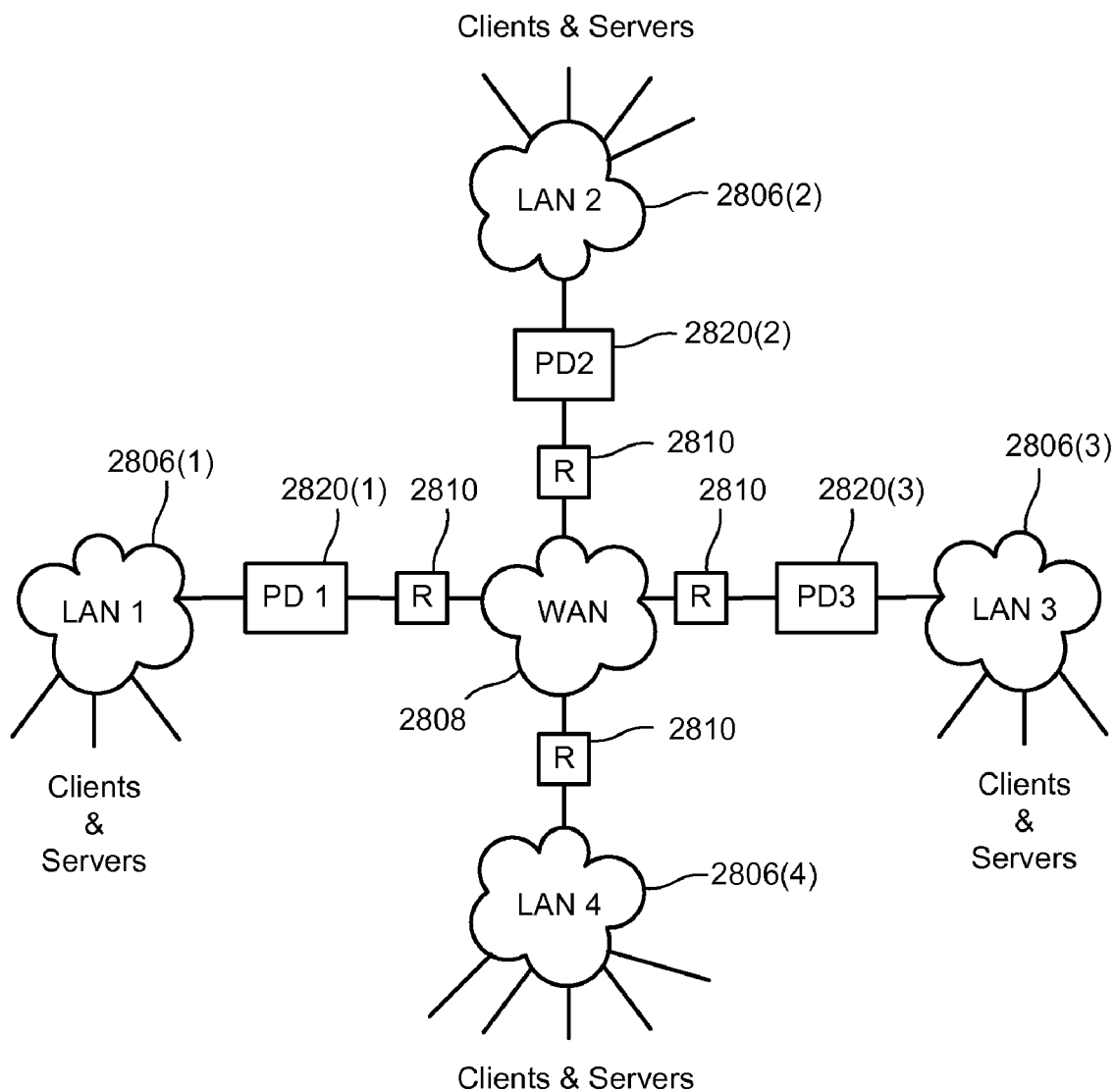
FIG. 28 is a block diagram of a networked system wherein various LANs are coupled to a WAN, some of which include proxy devices and some of which do not.

In the topology of FIG. 28, four LANs 2806 are coupled in an internetwork including a WAN 2808, which interfaces to each of the LANs in this example via one of a plurality of routers 2810, as might be conventionally used. Some LANs 2806 are coupled to their respective routers 2810 directly (e.g., LAN 4), while others are coupled via a proxy device PD 2820 (e.g., LAN 1, LAN 2, LAN 3). Note that each LAN 2806 might support both clients and servers, each of which might use the services of their proxy device and possibly other proxy devices.

As an example of a client-server connection, a client on LAN 1 might initiate a connection to a server on LAN 2. The connection could be proxied through PD 1 and PD 2 to enhance performance. Similarly, a client communicating from LAN 3 to a server on LAN 1 might benefit if the connection were proxied by PD 3 and PD 1. However, if a client on LAN 1 were to communicate with a server on LAN 4, no such paired proxying should occur because there is no proxy device present for LAN 4. Proxies are preferably able to automatically determine where and when other pairable proxies are present on paths between a client and a server so that connections are not intercepted at either end unless a proxy pair is present. Preferably, connection interception between pairs of cooperating proxies is transparent to communication between the client and server. Transparency results when a client can act as if it is communicating directly with the server and the server can act as if it is communication directly with the client or when conditions are such that modifications or configuration are not required at the client or the server to accommodate the use of proxy pairs.

The proxy pairs are not limited to a homogeneous enterprise network, and can be used and deployed in configurations where administrative boundaries are traversed. One advantage of this approach allows auto-discovery of such device relationships without requiring any explicit configuration to interconnect devices in distinct administrative domains. For example, proxy devices could be placed within the data centers of one or more popular Web sites and within the access networks of one or more Internet service providers. In this way, connections from clients attached to the enabled service-provider network to enabled Web sites are intercepted and processed by the SP (in the Web site data center) and the CP (in the access network). Likewise, if two or more enterprises deployed these devices in their network infrastructure, then client-server connections traversing extranets of two enterprises that were enabled with such devices would have such connections proxied and processed. In both cases, when the client-server connection does not terminate at a proxy-enabled site (or originate from a proxy-enabled site), then the traffic would not be processed and would not be in any way adversely impacted.

Figure 29:
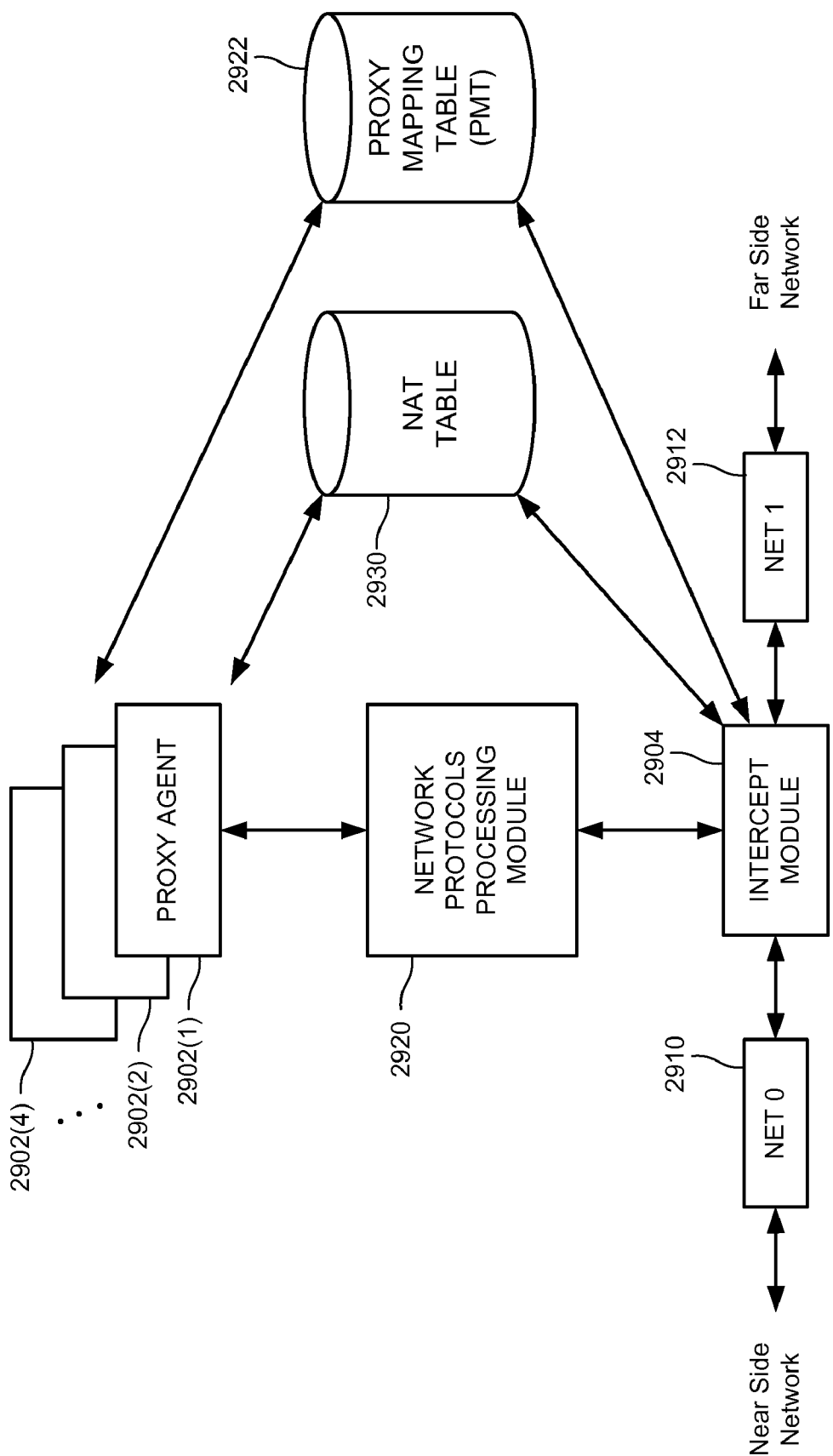
FIG. 29 is a schematic diagram of the proxy device shown in FIG. 4, in terms of modules and storage components.

FIG. 29 is a schematic diagram of proxy device 2820 shown in terms of modules and storage components. In a typical embodiment, the modules and agents might be implemented a using code from program code 410 and storage components might be implemented as data structures in RAM 412. In the example shown, proxy device 2820 functions as a Layer 2 relay. FIG. 29 shows a set of proxy agents 2902, an intercept module 1406, a network protocol processing module, and network ports 2910, 2912. Optional failover components might be present, but are not shown in the figure. Among the data storage structures illustrated, a proxy mapping table ("PMT") 2922 and a NAT table 2930 are shown. The network protocols processing module 2920 implements the end-host versions of traditional network and transport protocols like the IP, TCP, UDP, and so forth.

The two network interfaces 2910, 2912 cooperate through the intercept module. Intercept module 2904 performs an operation akin to that of a two-port bridge-packets that arrive on one interface are forwarded out the other interface. Unlike many bridge devices however, proxy device 2820 is configured with a network address and as such, has a presence on the network and can be communicated with directly. Network interfaces 2910 and 2912, on the other hand, are not assigned network-level addresses but, as usual, are assigned link-level addresses for sending and receiving packets over the attached LAN. When a packet arrives on either of the two network interfaces, if the packets are addressed to the proxy device 2820—i.e., the address assigned to proxy device 2820 is the same as the destination address of the arriving packet—then intercept module 2904 directs the packets to the network protocol processing module 2920. Packets that originate from within a process or module inside proxy device 2820 are transmitted out one or both of the network interfaces. In addition, intercept module 2904 may alter the normal packet processing to cause traffic to be intercepted and delivered to a local proxy agent, when in fact, the traffic was originally addressed to some other end host.

A proxy agent 2902 is instantiated as the terminus point for the client and server connections that are intercepted by proxy device 2820. Alternatively, one global proxy agent might handle all proxy agent functions regardless of the number of connections handled. While exceptions might be possible, it is expected that one proxy agent would be instantiated for each proxy pair of which proxy device 2820 is a member and there is a one-to-one correspondence between proxy pairs and connections handled. Intercept module 2904 includes logic to divert some network traffic to one of the proxy agents, which may in turn make additional network connections to other hosts to handle the network traffic. Intercept module 2904 may also modify packets and forward those packets out the host, as described below. When a proxy agent makes additional network connections to other hosts or other proxy devices, it may consult PMT 2922, which maps server addresses to one or more nearby proxy addresses. This allows the proxy agent 2902 to determine the server-side proxy to communicate with for the client-server session that it processes. Proxy agent 2902 might also consult NAT table 2930 to determine the original destination or source address of packets (or of the connection end-points that carry the packets) if they had been rewritten.

The entries in PMT 2922 could be manually populated by an operator using explicit knowledge of the deployment. However, while such manual configuration provides a great deal of flexibility, it also burdens the operator not only with a fairly complicated setup process, but also requires constant maintenance of these tables as the server and network infrastructure evolve. A better approach is to automatically discover the mapping as described herein. Performing such automatic discovery can be done without introducing any extra connection setup delay (for both intercepted as well as non-intercepted traffic). Thus, the entries in PMT 2922 may be populated by intercept module 2904 using methods described later.

Intercept module 2904 manages and utilizes NAT table 2930, which contains network address translation rules that are used to modify packets accordingly.

In one embodiment of a proxy device, the proxy device is realized from a general-purpose computer running a standard operating system such as the Linux™ or Microsoft Windows® operating systems with extensions. As a standard computing host, the proxy device's operating system kernel might implement a standard network stack, with intercept module 2904 added as extensions to the kernel environment. The proxy agents might run as user processes, with intercept module 2904 using techniques described herein to divert client and/or server connections to a proxy process.

Figure 30:
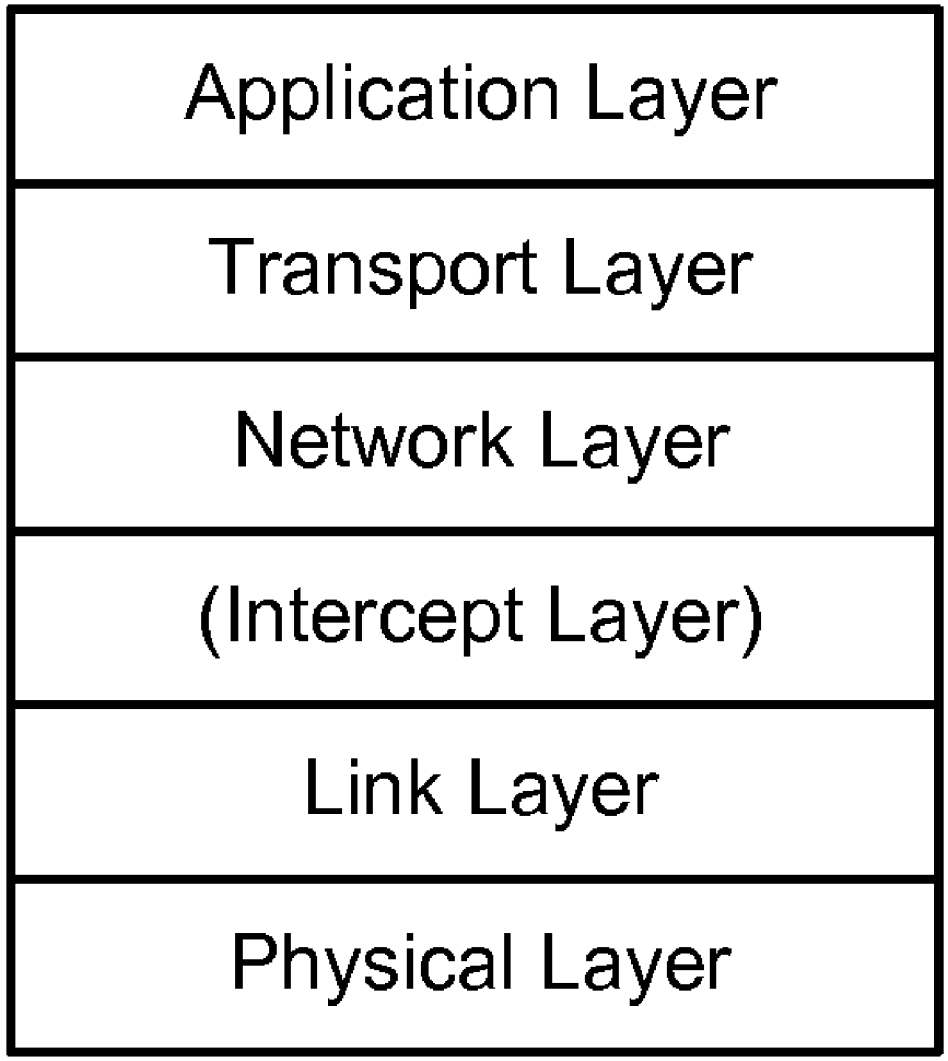
FIG. 30 is a layer diagram illustrating a position of an intercept layer.

FIG. 30 is a layer diagram illustrating a position of an intercept layer in a network stack that could be implemented in the client and server end hosts. In this case, the only packets that are processed by the host are those that are addressed to it. This particular example shows the intercept module as a part of the network stack integrated between the link layer and the network layer. Thus, much as in the deployment described in FIG. 28, the intercept module has the opportunity to examine and potentially modify packets before they are processed by the network layer. This deployment scenario assumes that the client and/or the server would be configured with whatever functionality a proxy would be performing. As such, the proxy agent is not a separate process but is shown as a part of the client/server process running as an application on the host. Furthermore, the end-host implementation could be combined with the network device implementation in a hybrid configuration.

Probe Query

Figure 31:
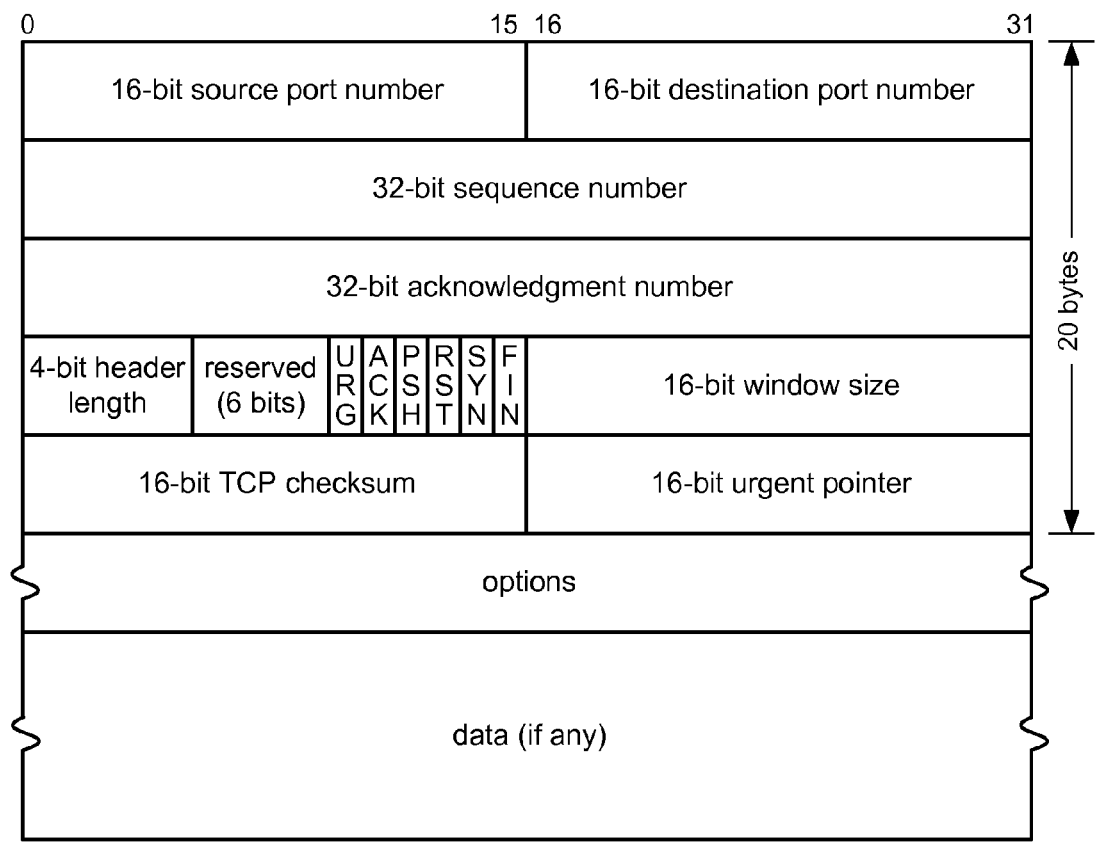
FIG. 31 is a schematic diagram of a packet including optional fields for signaling, and proxy devices.

FIG. 31 is a schematic diagram of a packet including optional fields for signaling, and proxy devices as might be used for probe queries and probe responses. Probe queries as described herein are one method or apparatus for signaling the presence of a proxy to other proxies. Probe responses as described herein are one method or apparatus for return proxy signaling in response to proxy signaling.

As shown in FIG. 29, a proxy device includes two network ports (and might have more, unshown ports). For a transaction, one network port is associated with a client direction while the other network port is associated with a server direction. The proxy device treats the first network port as the source of packets from the client and treats the second network port as the source of packets from the server. For sending packets towards the client, the proxy device uses the first network port and for sending packets towards the server, the proxy device uses the second network port. While a particular network port might be towards a client for one transaction and towards a server for another transaction, the term "client port" used with reference to a connection or transaction refers to whichever port is being used to interface, directly or indirectly, towards the client and the term "server port" refers to the other port that is being used to interface, directly or indirectly, towards the server. Also, when and if the proxy device does not know the port that is toward the client or toward the server, it may send a copy of the packet out both ports.

Upon receipt of a packet from the client port where the proxy device is a CP for the transaction associated with the received packet, the intercept module determines what actions to take on the received packet. If the PMT does not have an entry for a destination server associated with the destination found in the received packet, the intercept module attempts to learn whether or not a corresponding SP exists on the network path, and if so, its network address.

To detect and identify an SP, the CP's intercept module constructs a probe query packet and transmits that packet towards the server. The CP can then determine, based on the events that occur after sending the probe query packet, whether or not there is an SP on the network path. Likewise, even if the PMT has a mapping for a particular destination server available and a connection request for that server is received, the CP intercept module optionally generates a probe query packet to refresh the mapping. Optionally, as described later herein, the intercept module may decide to handle the connection in other ways, rather than probe for a server side proxy, based on user configuration.

In preferred implementations in particular networks, the CP constructs a probe query packet by attaching a probe query option to the network or transport layer options portion of the connection request packet as illustrated in FIG. 31. This allows optional messages to be piggybacked on an existing packet. Often, these optional messages are simply called "options". The CP makes use of options data by attaching a new option to the list of options that is already present in the packet, thereby advertising its own existence on behalf of the client. The option code is an assigned number that uniquely identifies the option as being a probe query. The CP may store some state in the PMT indicating that a probe has already been sent for the given server.

After appending the option code, the probe query packet is forwarded along the network path towards the server by the normal network delivery process. If an SP exists along this path, it detects the presence of a probe query option in the packet. The detecting SP then transmits a probe response back towards the client, expecting that this probe response will be detected by the CP. By sending this probe response, the SP informs the CP of its own existence, including related contact information (e.g., its network address and a transport port). In addition, after sending the probe response, the SP might not forward the connection request packet towards the server, instead dealing with it locally. Because the SP knows that a proxy pair can be formed with it and the signaling CP, the SP expects that the CP, upon receiving the probe response packet, will intercept and proxy the connection. With the CP proxying the connection, the client's connection request packet should not be forwarded to the server, which would respond by establishing a connection with the client. Instead, the SP will establish a connection to the server as needed.

One advantage to this approach is that if there is no SP on the path between the CP and the server, the modified connection request packet (i.e., the original packet with the appended probe query option) is received by the server host. According to the network and transport protocol specifications, unrecognized options are ignored by participating hosts. Thus, when a server receives a modified connection request from a client, the probe query option is ignored and a connection response packet is sent to the client, establishing a network session with the client exactly as if no probe option were present in the connection request. Additionally, when the server sends a connection response packet along the network path towards the client, the response passes through the CP. The CP can thereby implicitly detect that there is no SP on the path towards that particular server and can act accordingly. For example, the CP can just forward traffic or take other actions that do not require a proxy pair, or other actions as described herein.

Other embodiments of the probe query mechanism may be realized as well. When the CP intercepts a connection request packet, instead of modifying the packet and appending a new option code, it could stall the packet and instead send a probe query packet of any form towards the server. For example, this alternative probe query could simply be a new TCP connection request packet on a well known port that is intercepted by all SP agents. The CP then waits for a certain amount of time, expecting to receive an acknowledgment of whether or not there is an SP in the transport path towards the server. If an SP responds to this connection request, the CP knows that it can intercept the connection, and as such, forwards the stalled connection request packet to the NAT system and then to the local agent process. If the CP receives a negative acknowledgement, or does not receive an acknowledgment by a certain time threshold, it concludes that there is no SP in the path, and the stalled connection request packet is forwarded to the server unmodified.

In another embodiment, the CP sends the original connection request in parallel with a new query packet. This has the benefit that no connection requests are ever delayed as a result of the probing operation, yet also means that a connection request may pass through two proxies without being intercepted. However, the results of the probe query process could be used for future connection requests, so only the first connection attempt ends up being passed through unmodified.

Probe Response

As described above, if there is an SP in the path from the client to the server, then that SP should intercept probe query packets coming from the CP and send a probe response of some form, indicating to the CP its own existence and contact information. In the preferred embodiment, the probe response packet is constructed as a modified connection response packet that corresponds to the modified connection request packet. The SP also makes use of the options portion of the packet header, adding a probe response option conveying its network address and transport port information in the option data.

As the probe response packet is a simulated connection response packet, it is sent on the network with a source address corresponding to the server and a destination address corresponding to the client. The packet is then sent on the reverse path (i.e., towards the client) in lieu of sending the connection request to the server. Assuming the network paths are symmetric, the client-side proxy detects this response packet and acts on it. In other embodiments, the probe response is a special response packet sent from the SP to the CP communicating the SP's contact information as well as whatever other information might be helpful in allowing the proxies to coordinate and cooperate with one another. For example, the SP may include a list of addresses of other candidate server-side proxy devices to clustering and/or load balancing, as described later.

The CP acts on a response packet by updating the PMT with a new map entry indicating that for the given destination server (and possibly port), there is an SP in the path. The SP contact information is extracted from the probe response and installed in a mapping entry. In addition, the CP installs an entry in the NAT table that rewrites the IP destination address with the local proxy IP address for all packets corresponding to the client-server session in question.

In the first embodiment above, when receiving a probe response packet, the CP reconstructs the original connection request packet from the probe response packet that was derived from the probe query packet. Then, because a NAT table entry now exists for the client-server connection in question, the original connection request is then forwarded to the local proxy agent. As described below in more detail, the CP communicates with the SP to establish a proxied connection between the client and the server, making use of NAT tables to operate transparently.

If the CP observes a connection response coming from the server without the SP signaling for a connection that the CP signaled towards the server, the CP can conclude that there is no SP in the path. Alternatively, other implicit tests might be employed, such as relying on a timer, waiting for a future connection request from the same client, or other techniques. However, if the CP concludes that a SP is not present, or a previously detected SP is no longer present, the CP updates its PMT with this new information by installing a map entry for the destination server indicating the absence of a proxy (setting the entry to "no-proxy").

The mapping entries that are dynamically added to the PMT may become inaccurate over time. For example, a route in the underlying network might change so that the SP on the path for a particular server S may no longer be present on that path. Likewise, a CP could be installed and enabled before its corresponding SP is installed; then, once the SP is installed, the CP will erroneously assume the SP is not present as an entry indicating so is in the PMT. To handle this consistency problem, some embodiments of proxy devices occasionally (such as periodically according to a timer) refresh map entries in the PMT.

Logically, each map entry might have a refresh timer associated with it. When the timer expires, a probe is proactively sent toward the server in question to determine if the corresponding SP is still present on the path (or if a different SP happens to become present). Alternatively, the mapping entry could be simply removed from the PMT, as a subsequent connection request would simply result in a new probe. This timer based approach could be optionally complemented with a connection driven approach. With a connection driven approach, each time a connection request is processed, a probe is proactively sent toward the server in question to determine if the corresponding SP is still present on the path.

Actions Taken by an Intercept Module

Figure 32:
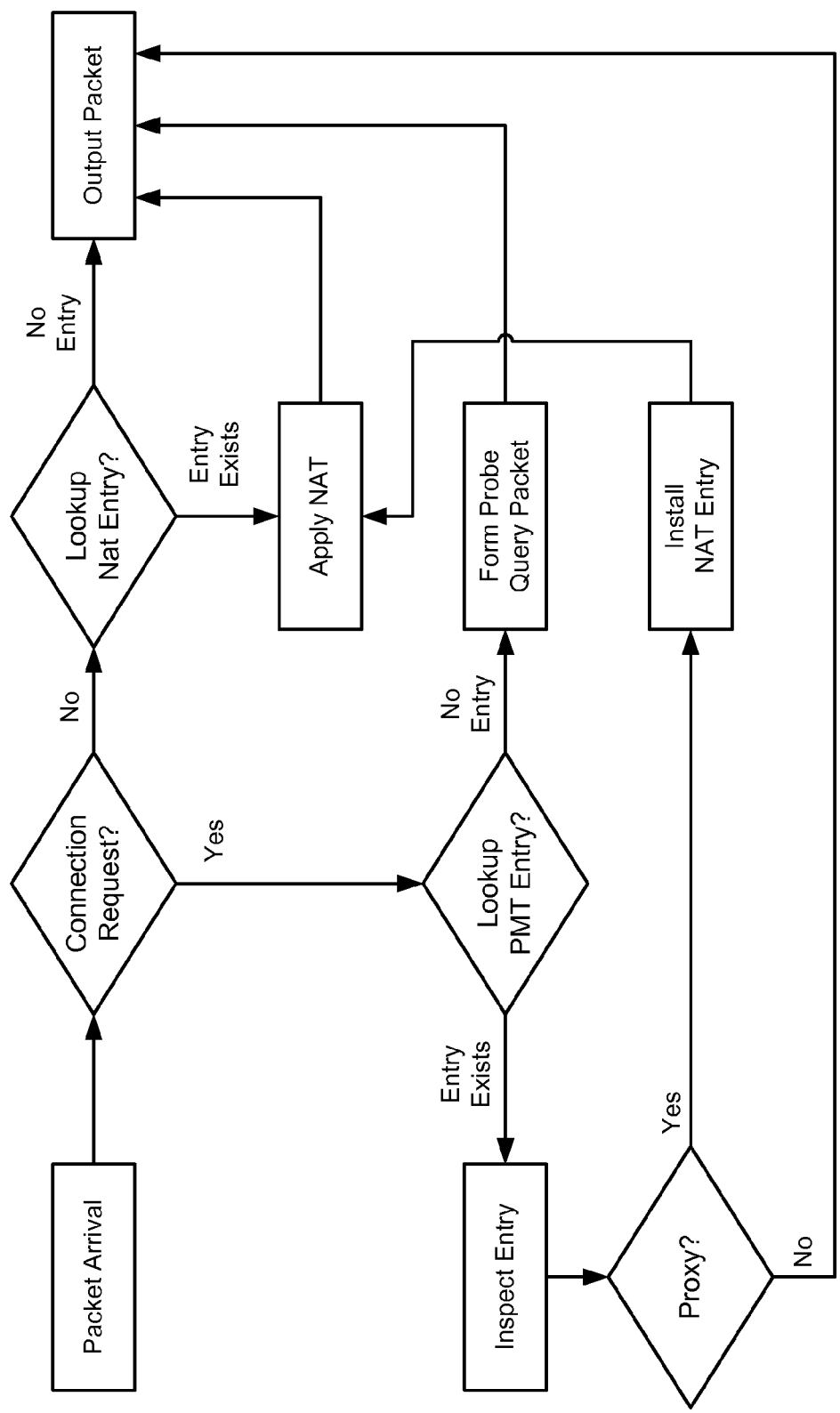
FIG. 32 is a flowchart illustrating actions taken by an intercept module when a packet passes through a proxy device.

FIG. 32 is a flowchart illustrating actions taken by an intercept module when a packet passes through a proxy device. The flowchart elements correspond to major components of an intercept module and the various operations and decisions that are made as a packet traverses through the intercept module. The description immediately below is generally from the point of view of the client-side proxy. The actions of the server-side proxy are described further below. This flowchart is merely illustrative as the functionality embodied herein can be accomplished by variations in these steps whereby such steps might be reordered, processed by different modules, and so forth.

In general, when a packet arrives on one of the proxy device's interfaces, the intercept module examines the packet to determine if it is destined for the local host (i.e., it is addressed to the local proxy device or it is a broadcast or multicast packet). If so, the intercept module passes the packet to the local network stack. Otherwise, the intercept module examines the packet to determine if it is a connection request packet. The exact semantics of what determines a connection request packet depend on the network and application protocols that are being proxied.

For example, in TCP, a connection request is noted by the presence of the "SYN" bit in the flags field of the TCP protocol header. Other applications may use a protocol such as UDP, which does not define specific connection semantics. In this case, the first packet of a UDP flow can heuristically define the start of a connection, where a UDP flow may be defined as all packets with a common source network address, destination network address, source UDP port, and destination UDP port. Likewise, the end of a connection can be implied by the absence of packets from a flow for a certain amount of time.

For connection request packets, the intercept module determines whether and through where the connection should be proxied. To do so, the intercept module builds and maintains the proxy mapping table (PMT). This table tracks the network addresses of proxies that are situated on the path to a particular connection destination (i.e., server). That is, in order to proxy a connection for a particular server S from the CP through an SP to S, the proxy agent in the CP maps the address of S to the address of SP, and the PMT provides this capability.

Each packet is also checked against the NAT table 2930 to determine if the network addresses and/or transport ports of the packet should be rewritten. NAT protocols and processes are described in Request for Comments (RFC) 1631, which is generally available and is incorporated herein by reference for all purposes, though NAT is employed herein to facilitate connection interception rather than providing address-translation between private and public networks. The entries in the NAT table match the endpoints of an established network connection, i.e., they specify the transport protocol, the source address/port and the destination address/port. If the packet's address and port information match an entry in the NAT table, then the destination address of the packet is rewritten to be the target address listed in the table, which in the case of input packets, is the local address of the proxy host, and the packet is forwarded to the local network stack, where it is intended to be received by a local proxy agent. Because the address has been rewritten and the proxy agent does not have access to the old address (but may require it to perform its function), the proxy agent can query the NAT table to determine the original destination of the packet (i.e., the destination address of the packet before its destination address was rewritten). This mechanism causes the client to believe that it has a connection established with the original server even though the connection is terminated at the local proxy agent in the CP.

The intercept module also receives each packet that is sent from a proxy agent on the local host and NAT table 2930 is similarly consulted when packets are sent from the proxy host towards the client or server. In other words, packets that originate from a local proxy agent are checked against the NAT table to determine if the network addresses and/or transport ports of the packet should be rewritten. Unlike prior art methods for proxying transport connections, this mechanism causes the server to believe that it has a connection established with and addressed to the original client even though the connection is terminated at the local proxy agent in the SP. This contrasts with a Web proxy, for example, where the proxy creates a connection with the server and the server terminates a connection from that proxy and the proxied client address or addresses are ultimately invisible to the server.

Through the use of NAT in this fashion, the CP proxy agent establishes a network connection with the client such that the client believes it is communicating with the server, and correspondingly, the SP proxy agent establishes a connection with the server such that the server believes it is communicating with the client, where belief is sometimes represented simply as acting as if that were the case and having operations proceed normally as they would if the believed fact were true.

A packet that is not a connection request and that does not match an entry in the NAT table is simply forwarded unmodified to the interface opposite of where the packet originally arrived, thus providing a transparent relaying function for traffic that is not to be proxied. This traffic includes packets such as link-level broadcast or multicast packets, as well as packets that are not to be proxied because the probe mechanism described herein did not discover a second proxy device on the path to the server.

Given the PMT and a new connection request, the intercept module looks up the destination address of the connection request in the PMT. If the PMT indicates that there is a corresponding proxy on the network path, the intercept module proxies the connection to the local proxy agent by installing a new NAT rule for the connection in the NAT table. This ensures that future packets that are part of the connection are forwarded to the local proxy agent. The connection request packet itself is then sent through the NAT operation and thereby forwarded to the local proxy agent, which establishes a new connection with the client. Because of the NAT operation, the CP establishing this connection with the client appears to the client as if it were the server.

In the above-described example, because the connection is terminated at the local proxy agent, there is a chance the connection is set up successfully even though the server may have crashed or otherwise would refuse the connection from that particular client. To deal with that condition, the CP might delay the establishment of the client-to-CP connection until the SP-to-server connection has succeeded. This can be accomplished by having the CP delay the acknowledgement of the connection request (e.g., in TCP, by delaying the transmission of the SYN-ACK packet) until a message is received from the server or SP indicating that the SP-to-server connection has been successfully established. If the SP-to-server connection fails for some reason, the SP notifies the CP and the CP then resets the pending connection (e.g., in TCP, by sending a reset packet back to the client).

If a probe attempt determined that there is no SP on the path to the server, the PMT stores a "no-proxy" map entry indicating that this probe attempt failed. When a connection request for the server is looked up, the no-proxy disposition informs the proxy device to avoid proxying the connection and instead, the connection request packet is simply forwarded unmodified towards the server. Because no NAT is configured for this connection, all remaining packets for this connection are bridged without modification.

Connection Interception

As mentioned above, when a connection request packet arrives at a CP and the PMT has a map entry corresponding to the destination server in the connection request packet, then the connection request packet is forwarded to the local proxy agent on the CP. Due to the NAT table in the CP, the proxy agent establishes a connection with the client such that the client believes it is communicating with the server. The CP proxy agent then establishes a connection of some form with the SP, which is identified by consulting the PMT using the server destination address of the original client connection. This may be a new network connection from the CP to the SP, or a new virtual channel representing the client-server connection multiplexed over an existing network connection between CP and SP. In the virtual channel case, messages from various client-server sessions between common CP/SP pairs can be multiplexed onto a single transport connection or virtual channel. Each message includes a header that identifies the client-server session. When a message is received at the CP, the header and the message are transmitted over the virtual channel to the SP, which decodes the header, reads the message, and forwards it onto the appropriate server connection.

When the SP receives the new connection (or virtual connection) from the CP representing the client-server connection, the CP sends the SP a message informing the SP as to which server and port the original client connection should be sent. The SP, in turn, installs an entry in the NAT table that maps the source address of the forthcoming SP-to-server connections to the original client address. Then, the SP initiates a connection to the target server and port, and by virtue of the NAT, a connection is established between the server and the SP such that the server believes it is communicating directly with the original client.

Figure 33:
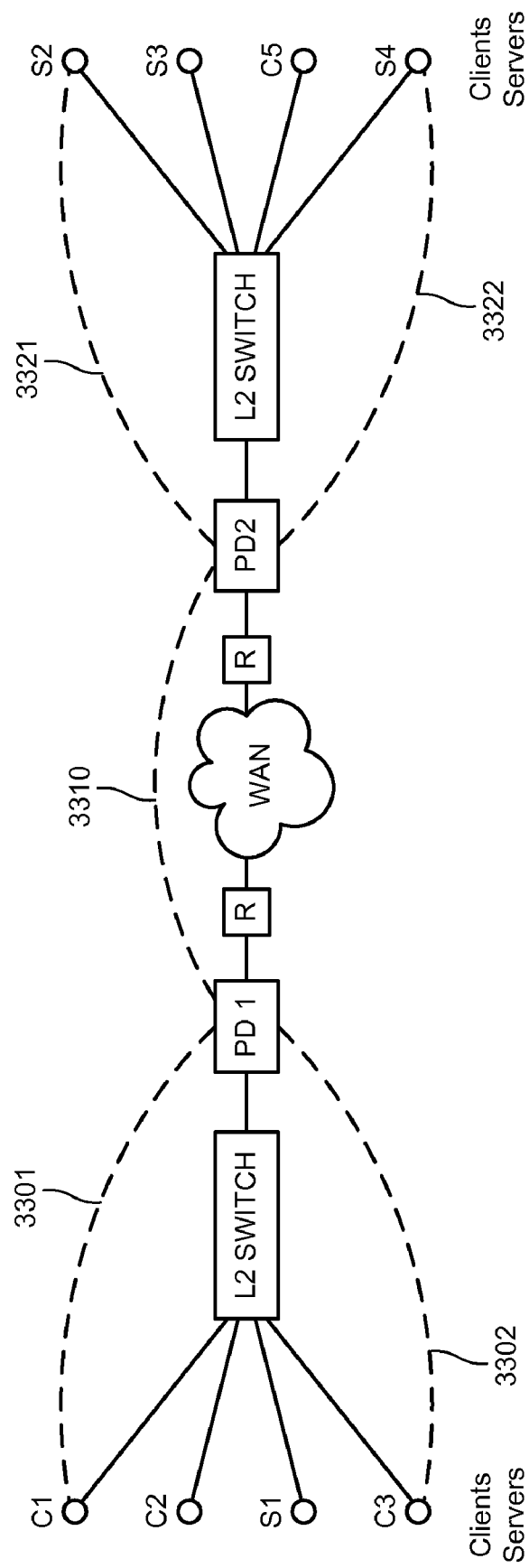
FIG. 33 is a diagram illustrating multiple connections used for interactions between clients and servers over a WAN.

FIG. 33 is a diagram illustrating this multi-connection approach used for interactions between clients and servers. As shown there, several clients and/or servers are coupled to and L2 switch that is in turn coupled to a first proxy device PD 1. Proxy device PD 1 is coupled, via routers and a WAN, to a second proxy device PD 2. Proxy device PD 2 is in turn coupled to a second L2 switch that serves another set of several clients and/or servers. Proxy device PD 1 is a CP and proxy device PD 2 is an SP for the example transactions shown, but it should be understood that a proxy device could be a CP and an SP at the same time for different transactions. The proxy devices might execute the auto-discovery protocols described herein, or are otherwise configured to be aware of each other.

Various network connections are illustrated by dashed lines. Suppose client C1 desires a connection to server S2. The connection is transparently intercepted such that client C1 ends up with a transport connection 1801 terminated at the CP, but because of NAT, client C1 cannot tell that it is not in fact communicating directly with server S2. Likewise, as part of the process, the CP establishes a different transport connection 3310 between itself and the SP.

In turn, the SP establishes a transport connection 3321 that corresponds directly to the client's transport connection 3301. Because of NAT, server S2 cannot tell that it is not communicating directly with client C1.

Then, whenever client C1 sends a message over connection 3301, the CP relays it over connection 3310 to the SP, which relays it over connection 3321 to server S2. Likewise, whenever server S2 sends a message over connection 3321, the SP relays it over connection 3310 to the CP, which relays it over connection 3301 to client C1.

If another client, C3, initiates a transport connection to another server, S4, the connection is transparently intercepted such that client C3 ends up with a transport connection 3302 terminated at the CP. Because of NAT, client C3 believes it is communicating directly with server S4. Likewise, as part of this process, the CP can reuse the transport connection 3310 between itself and the SP to handle messages between client C3 and server S4. In turn, the SP establishes a transport connection 3322 corresponding directly to the client connection 3302, and because of NAT, server S4 believes it is communicating directly with client C3.

Following that setup, whenever client C3 sends a message over connection 3302, the CP relays it over connection 3310 to the SP, which relays it over connection 3322 to server S4. Likewise, whenever server S4 sends a message over connection 3322, the SP relays it over connection 3310 to the CP, which relays it over connection 3302 to client C3.

Because connection 3310 is used by both the C1/S2 session as well as the C3/S4 session, a method for associating data transmitted over that connection to the appropriate session must be employed. As described earlier, this can be accomplished by including a header with each transmitted message that indicates the client-server session associated with the transmitted message.

Transparent interception is described above. Proxy devices might also use nontransparent interception. In nontransparent interception, the addresses of the proxy devices are exposed to the end devices. Thus, the address of the CP might be exposed to the client and the address of the SP might be exposed to the server, with each end device configured to talk directly with its corresponding proxy device client.

Certain protocols like CIFS, NFS, and HTTP are amenable to nontransparent operation as those protocols allow the client to communicate directly with an intermediary that has a different address from the origin of the communication. This architecture is feasible, but it can be challenging to deploy. There are many different approaches to solving the integration challenges of nontransparent configuration, but they typically require hard to maintain (either manually or automatically) mapping tables in the proxy devices. That is, in order for a client side proxy device to know what server side proxy device to connect to, it must somehow learn what server the client actually wants to communicate with (via protocol specific knowledge or some protocol specific mapping model), and in turn, must learn what server side proxy device is near the server in question. This is in general complex and cumbersome, except for protocols like HTTP that were explicitly designed to allow a client to connect explicitly to a proxy and have the client include the server's name in every header of every request message. Thus, where there is some advantage to nontransparent operation and it is feasible, it can be used instead of the transparent interception described herein.

In other cases, a hybrid configuration is desirable, where transparency is used at the CP but not at the SP. In this configuration, the server side NAT is not employed alleviating the requirement that the server side proxy be in the direct network path. This is a benefit in the data center, where very high bit rates might be concentrated onto one or two primary network links.

Transport Optimization

Once a proxy pair is established, there are number of possible actions that the proxy pair could take. Some of those actions might involve optimizing the transport. While there are a great many optimizations that may be carried out with a proxy pair, one particular mechanism involves transport protocol optimization whereby the client and servers implement legacy transport protocols while CP-to-SP connections are supported with more modern or otherwise optimized transport protocols. In this fashion, the client and server may implement legacy versions of transport protocols across a LAN, where protocol performance is not necessarily crucial, while enjoying the protocol enhancements of a different transport protocol between and among proxy agents.

In one embodiment, this transport protocol translation is applied to TCP, wherein two TCP end points believe they are speaking to one another by virtue of the transparent interception. The CP-to-SP protocol can be virtually any protocol mechanism that allows the proxies at both ends to emulate the reliable, in-sequence delivery semantics of TCP. One such approach is to implement a modified form of TCP for the CP-to-SP protocol that implements the reliability semantics of TCP but enjoys different congestion control dynamics. Congestion control refers to methods that networks use for discrete network connections to parcel the available network bandwidth on a shared network link. One aspect of TCP's congestion control algorithm is the notion of "slow start", whereby a TCP connection slowly increases the amount of bandwidth available to an application to avoid flooding a potentially constrained link with data. The main drawback to a slow start TCP connection is that an application that has a short lived connection may never reach the full link capacity since the slow start mechanism does not complete its ramp up before the connection is no longer needed.

With a pair of proxies in the network path, it is possible to intercept a number of TCP connections and multiplex them over a single long-lived connection between the two proxies. This long-lived connection would be able to avoid the problems of slow start, even if each individual connection is short lived. In addition, it is possible for the two proxy hosts to employ more sophisticated congestion control algorithms for the multiplexed connection channel, which can result in better performance for the set of proxied connections.

Other enhancements can be made to the congestion control algorithm in the CP-to-SP connection, such as those described in Floyd, S., "High-Speed TCP for Large Congestion Windows", IETF Internet Draft draft-floyd-tcp-highspeed-02.txt (Feb. 20, 2003) [available at http://www.ietf.org/internet-drafts/draft-floyd-tcp-highspeed-02.txt] (hereinafter "Floyd"). Techniques described in Floyd change the TCP congestion control dynamics to provide significant performance enhancements in high-latency environments and have a number of other benefits.

Multi-Hop Automatic Proxy Path Discovery

Figure 34:
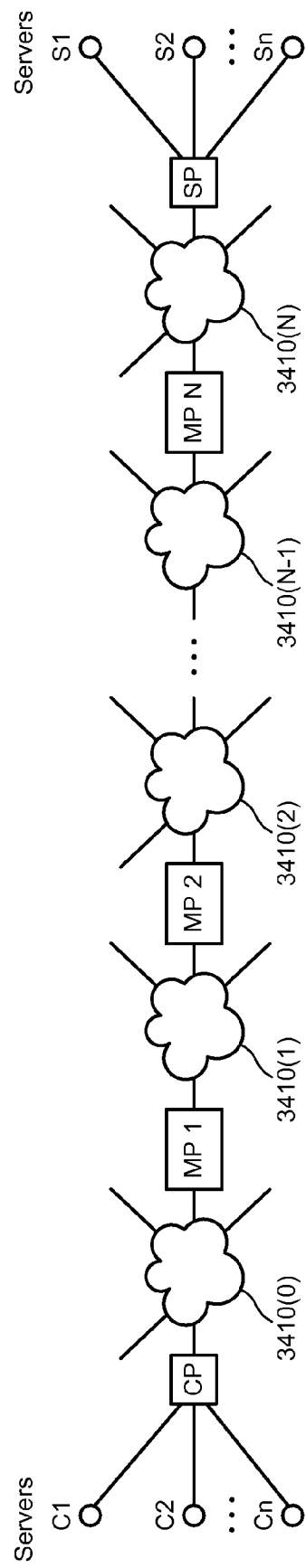
FIG. 34 is a diagram illustrating the use of more than two proxy devices in a network path, including a client-side proxy, one or more middle proxies, and a server-side proxy.

FIG. 34 is a diagram illustrating the use of more than two proxy devices in a network path, including a client-side proxy, one or more middle proxies, and a server-side proxy. While most of the examples used so far presume a configuration comprising a pair of exactly two proxies (one named "CP" near the client and one named "SP" near the server) and three transport connections (i.e., one between the client and CP, one between the CP and the SP, and one between the SP and the server), the present invention also encompasses topologies containing more than two proxies and more than three transport connections.

As shown in FIG. 34, a client-server connection may be transparently intercepted, processed and proxied via a sequence of more than two proxy devices. As shown there, a client communicates with a server via a connection to a client-side proxy CP, which in turn communicates through a network 3410(0) with a first middle proxy MP 1, which in turn communicates through a network 3410(1) with a second middle proxy MP 2, and so on to an N-th middle proxy MP N, which in turn communicates through a network 3410(N) with a server-side proxy SP, which ultimately communicates with the server. In this example, multiple clients and multiple servers are shown. As explained above, it need not be the case that the clients are all at one end and the servers are all at the other end. Thus, the CP might be a proxy device that also is an SP for other connections and the SP might be a proxy device that is also a CP for other connections. As illustrated, networks 3410 include other connections and branches.

In this embodiment wherein more than two proxy devices are in the network path and are to be active for a client-server connection, a proxy device discovers whether it is acting as a client-side proxy by, among other techniques, detecting the absence of proxy signals or probes and discovers whether it is acting as a middle proxy or a server-side proxy by forwarding probe packets on to the server while simultaneously sending a probe responses to the CP (or a downstream middle proxy). As a result, each proxy device will either see a connection request acknowledgement returned from the original server or a probe response packet coming from another proxy upstream on the path toward the server. In the former case, the proxy determines that it is an SP and acts accordingly (e.g., installing the server side NAT state and so forth). In the latter case, it determines it is a middle proxy and acts accordingly (e.g., by relaying messages from the client in question to the upstream proxy in question and vice versa from the server to the client and performing other actions expected of a middle proxy).

Throughout this disclosure, where there are multiple instances of an object and the number of instances is not critical, the instances are numbered from "0" or "1" to "N" with the understanding that the value of "N" need not be identical from use to use. For example, "N" is used as the number of clients, servers, proxies, etc., in various places, but that number might vary from example to example. It should also be understood that nothing here requires that all instances be used. For example, FIG. 34 shows clients C1, C2, . . . , CN, servers S1, S2, . . . , SN, and middle proxies MP 1 through MP N. It should be understood that the number of clients, servers and middle proxies need not be identical and the actual number is not essential to an understanding of what is being shown.

Variations

With a proxy pair in place, a number of advantages accrue and other network improvements are made possible. For example, using techniques described herein, a network administrator can deploy a proxy pair that would transform and proxy all TCP connections using techniques described herein. This can be done without requiring an upgrade of every device, server, and application that uses TCP with modern protocol enhancements to improve performance. WAN performance of all applications can be improved with the simple and straightforward deployment of such devices at appropriate points in a network infrastructure.

In some embodiments, messages are actually modified to provide additional performance benefits. For example, client-server transaction acceleration techniques as described in McCanne I can be implemented to transform network transactions for wide-area bandwidth optimization. Similarly, client-server transaction prediction mechanisms as described in McCanne III can be employed in a pair of proxy agents to mask effects of wide-area latency and thus provide significant reductions overall latency leading to increased client-server performance.

Connection Request Filtering

In some embodiments, the basic proxy discovery and interception mechanisms described herein can be extended with a configuration capability that targets only certain subsets of traffic. For example, a network operator may want to configure the proxy devices to process certain types of client-server connections but to pass through other types of client-server connections unmodified without interception and/or other processing. Specifically, it may be desirable to statically configure some information into the intercept module that alters its behavior based on the protocol or application type of the underlying connections.

One simple addition to the intercept module is the addition of rules that indicate certain actions to take on a class of connections. One type of rule would indicate different actions based on the destination port in the connection request packet. With this addition, the intercept module can choose to ignore connection request for particular configured ports, or alternatively, only act upon connection requests for particular configured ports. More generally, the rule could be a packet filter that is applied to the connection request packet, e.g., specified as a BPF packet filter (McCanne and Jacobson, "The BSD Packet Filter: A New Architecture for User-level Packet Capture", In Proc. of the 1993 Winter USENIX Technical Conference, San Diego, Calif., January 1993). Using the approach described there, whenever the intercept module processes a connection request packet, it could apply one or more packet filters to determine if the connection request should be passed on unmodified, intercepted and processed, or even dropped.

By dropping a connection request packet, the intercept module would implement functionality akin to a firewall, whereby certain connections are allowed to pass through, while others are denied. The fact that the PMT contains dynamic information resulting from the probe operation enables even more sophisticated functionality than available with a simple firewall.

For example, assume two proxies are cooperating to provide security functionality for the network traffic that traverses them, whereby the traffic that is proxied goes through an encryption/decryption process. The intercept module can be configured with a rule that dictates that all traffic should be intercepted if possible to discover whether or not there is a corresponding proxy and any packets destined for servers that do not have a corresponding proxy in path should be dropped instead of forwarded. Using such a rule set, the dynamic mappings resulting from the probe process are used to indicate which connections should be dropped and which should be proxied.

Static Mapping

Static mappings are useful, for example, where the CP is in a network path but the SP is not in the network path. By adding static mappings to the PMT, via a manual network operator process or the like rather than being discovered through the probe process, the SP need not be on the path. The static mapping is marked accordingly so that the intercept module does not attempt to refresh the mapping. A static map entry is similar to a dynamically discovered entry in that it indicates the appropriate SP to use when contacting a particular server. The CP would still intercept network connections, but would not carry out the normal probe process to discover the SP and instead would be directed to the off-path SP (although nothing prevents a network operator from statically mapping an SP that is in the path).

On-the-Fly Connection Interception

Some connections may become established before any proxy could intercept the connection requests. For example, a CP could be powered on and find itself in the path of existing connections. Another possibility is that the network path for a connection could change such that the new path flows through a proxy. It is desirable to intercept these preexisting connections such that they gain all benefits of using the proxy service.

The intercept module can determine whether a packet flowing through it belongs to a pre-existing connection in several ways. One method is by tracking every connection that flows through it. When a connection request packet arrives at the intercept module, it can begin updating or creating state for that connection, including, but not limited to, the existence of that connection, whether the connection request succeeds, and when the connection is terminated. If a packet arrives for a connection for which the intercept module has no state, then it could conclude that this packet is for a pre-existing connection.

Once the intercept module identifies a pre-existing connection, it could further try to identify whether the connection flows through an SP. It could do this in several ways. One way is to examine a table of known destination to SP mappings; the table's entries could come from previous runs of the proxy discovery protocol, or via manual configuration, or via some other method. It could also attempt some form of proxy discovery protocol for the destination of the pre-existing connection.

Once the intercept module has discovered the peer intercept module on the other side of the pre-existing connection, it can take some action to cause the connection to be intercepted. One such action is to tear down the existing connection by injecting one or more "reset" packets into the client-server session. This will cause the connection to fail, and in some cases, the application will simply establish a new connection with the server automatically. When the new connection request flows through the CP, it can then go through the process described in earlier to cause the connection to be intercepted. Other applications may report an error to the user and halt the process when their underlying connection or connections fail. To address this, rather than reset the connection, the CP and SP can intercept the connection on the fly by observing the current protocol parameters in the active session (e.g., sequence numbers, advertised window, and so forth) and recreate the necessary protocol state within the proxy device along with the appropriate NAT rules to cause the connection to be intercepted midstream.

Connection Deflector

Figure 35:
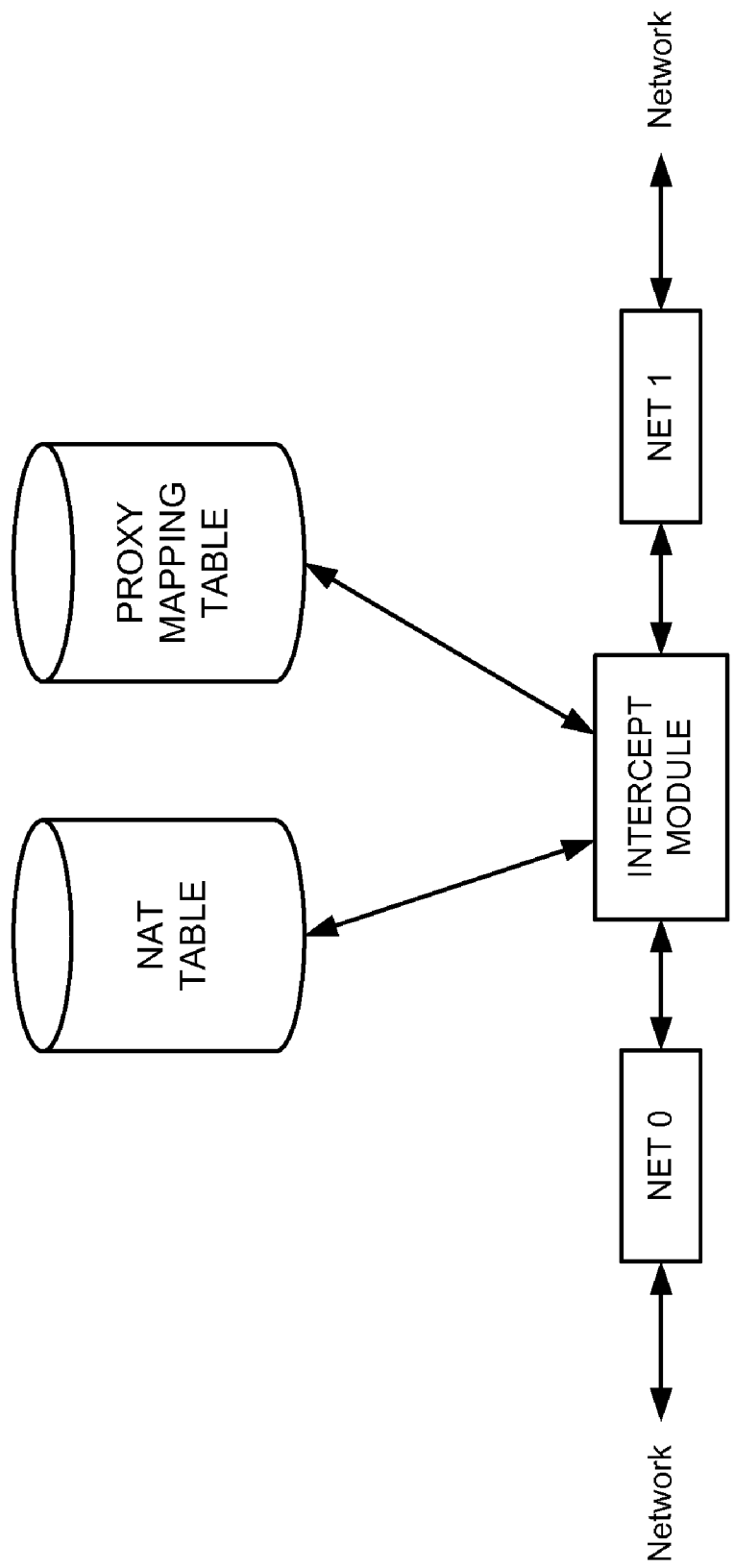
FIG. 35 is a diagram illustrating a connection deflector housing intercept and NAT functions in a stand-alone network device.

In another embodiment of the present invention, the intercept module and NAT and PMT tables are embodied in a network device that is separate from the proxy. FIG. 35 illustrates this arrangement, where the intercept and NAT functions are housed in a stand-alone network device called a "connection deflector". A connection deflector, in this form, is by itself a new type of network device that provides server-side transparency to a proxy configuration without placing the proxy device in the path between the client and server. Instead, the connection deflector is placed in the path and that device NATs packets to one or more proxies that are not in the path.

Figure 36:
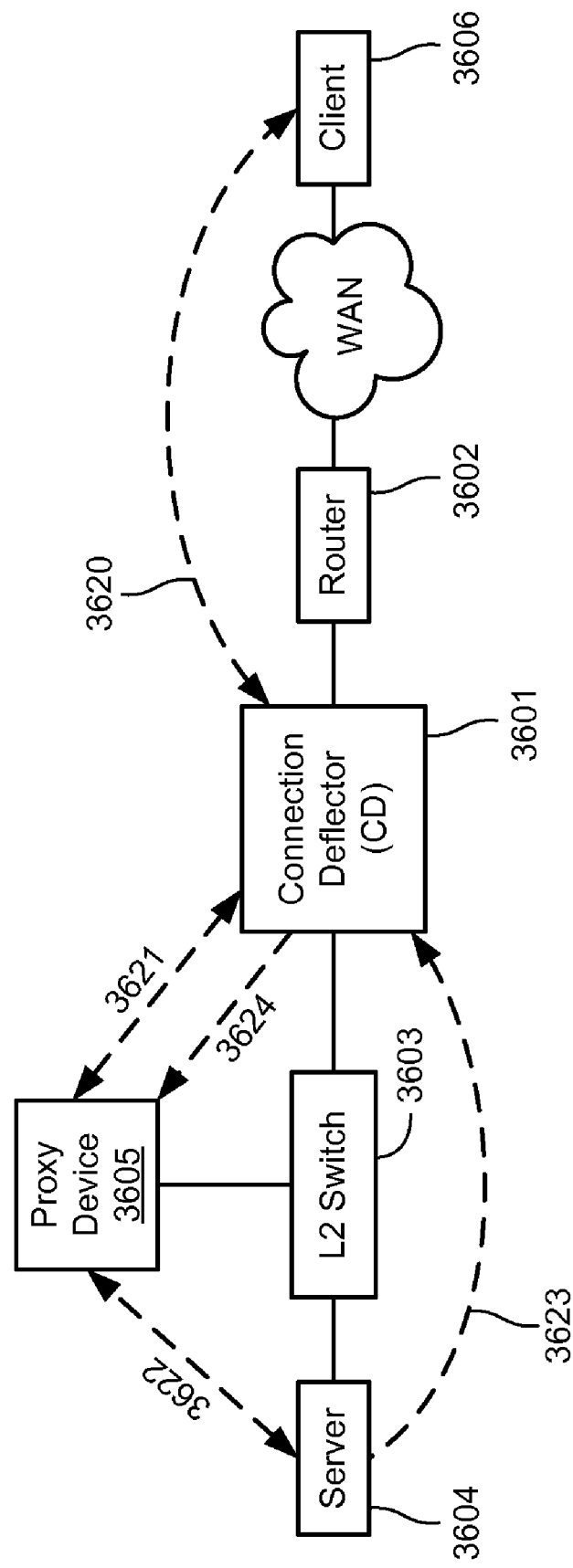
FIG. 36 is a diagram illustrating a connection deflector (CD) deployed to implement proxy interception in a manner that is fully transparent to a server.

A connection deflector may optionally include the logic described earlier for automatically populating entries in the PMT to perform proxy pair auto-discovery, but the device is also useful without this. In this simpler case, the PMT is populated with static entries, e.g., entered via user configuration. FIG. 36 illustrates how a single connection deflector (CD) 3601 is deployed to implement proxy interception in a manner that is fully transparent to the server. To do so, CD 3601 is situated in the path between a router 3602 and a layer-2 switch 3603. Attached to the switch are a proxy 3605 and a server 3604. The intercept module within CD 3601 forwards all packets between the switch and the router. When CD 3601 encounters a connection setup packet (e.g., a TCP SYN packet) from a client 3606 addressed to server 3604, it creates two NAT rules and installs these rules in its NAT table: a first rule causes the client-server flow in question to be directed toward proxy 3605 instead of server 3604, and a second rule causes packets sent from server 3604 to client 3606 on the return port to also be directed to proxy 3605 instead of the client. The proxy address for the NAT rule is determined from the PMT.

Optionally, when CD 3601 forwards the connection setup packet to proxy 3605, CD 3601 appends a message option in the connection setup packet to signal the server address to the proxy, thereby allowing the proxy to know that the client had initiated the connection to go to that particular destination. In turn, proxy 3605 terminates the transport connection from client 3606 and initiates a new transport connection 3622 to server 3604, but NATs the connection so the packets server 3604 receives over connection 3622 appear with a source address that corresponds to client 3606. As a consequence, server 3604 generates return packets addressed to the client rather than proxy 3605 along path 3623. These packets are thus delivered toward the client, through switch 3601 and CD 3605. At this point, the second NAT rule in CD 3601 mentioned above matches the packets and causes them to be transformed by NAT and directed to proxy 3605 along path 3624. Finally, proxy 3605 receives the packets and associates them to connection 3622 and processes them as if they had originated from the server and had originally been addressed to the proxy. Thus, proxy 3605 has successfully intercepted transport connection 3620 from client 3606 to server 3604 in a way that is completely transparent to server 3604.

A connection deflector is not limited to interoperating with a single proxy, single server, and single client as depicted in FIG. 36, but rather generalizes to support an arbitrary number of proxies, servers, and clients. By configuring different NAT rules for different servers and proxy combinations, an arbitrary number of entities are supported. Moreover, the proxies need not attach directly to the layer-2 switch but can be anywhere in the routed network. The only requirement is that the connection deflector be situated in both the forward and backward paths between the client and server so the traffic can be properly NAT'd in both directions.

Figure 37:
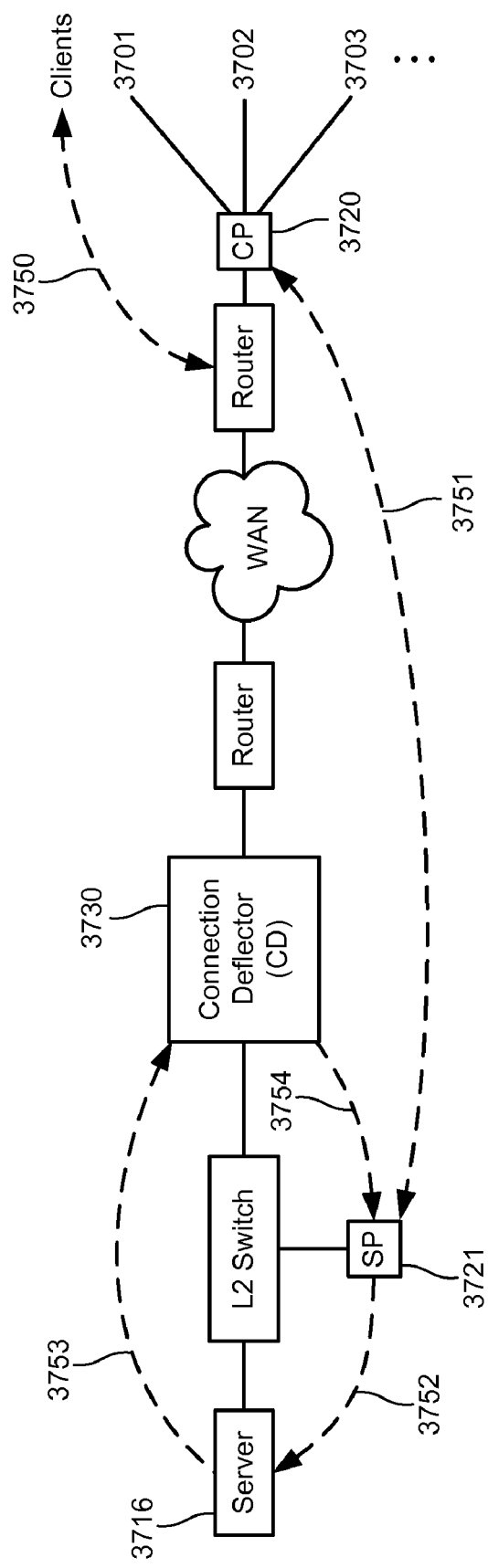
FIG. 37 is a diagram illustrating a client-side proxy (CP) and a server-side proxy (SP) situated with respect to a connection deflector.

In another embodiment, the connection deflector includes probing capabilities in the intercept module to perform proxy pair auto-discovery as described earlier. FIG. 37 shows how the client-side proxy (CP) and server-side proxy (SP) are situated with respect to the connection deflector. Here, CD 3730 is situated in the network data path but SP 3721 is situated out of path attached to a layer-2 switch. This separation is amenable to high performance implementation as it allows simple network functions like packet forwarding, NAT, probe generation and interpretation, and so forth to be implemented in a dedicated network device while higher-level proxy functions can be implemented in a general purpose computing device that is not in the critical path of the network.

In this configuration, the exchange of messages that perform proxy auto-discovery is modified because the CP and SP communicate with a non-transparent connection that does not need to be NAT'd. In fact, only one NAT rule per client-server session need be installed in the CD to handle the return path from the server to the client, as the forward path is transparently intercepted at the CP. Also, the CD and CP perform auto-discovery while the SP does not.

FIG. 37 shows one way to deploy a connection deflector to perform proxy pair auto-discovery. When client 3701 initiates a connection to server 3716, CP 3720 intercepts the connection request packet and appends a probe request option as described earlier. The connection request packet is intercepted by CD 3730, which in turn, responds to the probe providing the address of SP 3721 as the contact point. At the same time, CD 3730 installs a NAT rule that causes traffic sent from server 3716 to client 3701 on the return port of the connection in question to be diverted via NAT to SP 3721. CP 3720 then terminates the client connection 3750, initiates a new connection (or virtual connection) 3751 to SP 3721. Next, SP 3721 initiates a connection 3752 to server 3716 on behalf of client 3720 and NATs the source address so that server 3716 believes the incoming connection is arriving from client 3720 even though the connection originates from SP 3721. Thus, the return packets from server 3716 corresponding to connection 3752 follow path 3753 toward client 3701. When the packets reach CD 3730, the newly installed NAT rule matches the packets and causes them to be NAT'd and diverted back to SP 3721. Thus, the CP, SP, and CD successfully discovered the presence of one another and intercepted the client/server connection, without having the SP in the network path and while maintaining strict transparency for the server.

Clustering and Load Balancing

The configuration of FIG. 37 can be generalized with multiple SPs at the server site to support clustering and load balancing. Suppose there are N SPs instead of just one. Then, CD 3730 could select one of the N and return the address of the selected SP to the CP in a probe response packet. The selection could be based on availability, load, and so forth. Or, preferably, CD 3730 could return a list of available SPs to CP 3720 in the probe response packet. This would allow CP 3720 to store the list in its PMT and select an SP using its own discretion. For example, it might favor one primary device over other secondary devices and only use secondary devices when the primary device is unavailable or near capacity. Depending on the particular functions the proxy performs, such a policy could enhance the performance of proxy pairs since the same pairs will tend to be used consistently over time. Another approach is to have the CP employ a consistent hash (e.g., as a function of the server and client addresses) so that the same client-server sessions are consistently mapped onto the same SP, again enhancing the performance of the proxy end points.

Variations

Figure 38:
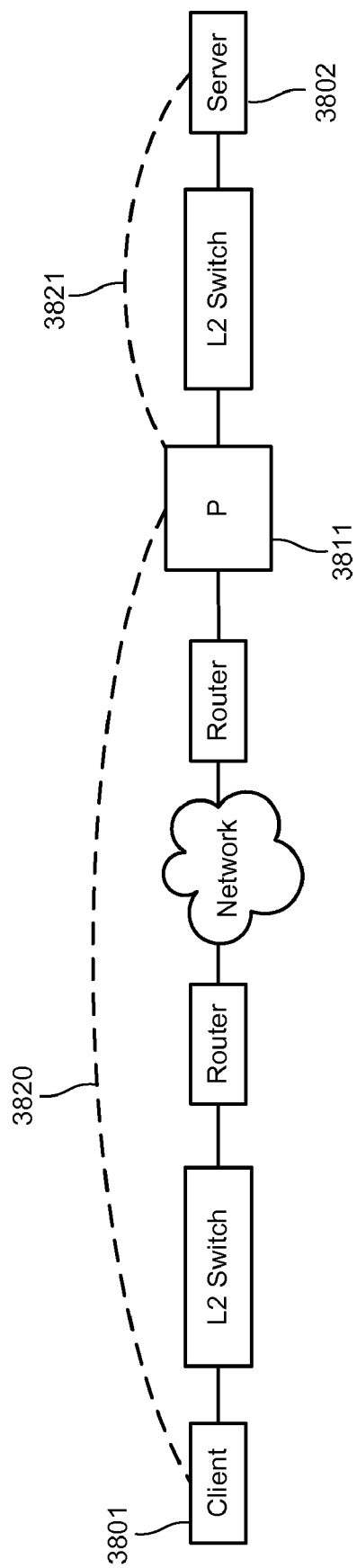
FIG. 38 illustrates a variation of a proxy device, where a single proxy intercepts client connections and server connections, but interacts with each using the other's address.

FIG. 38 illustrates a variation that is useful beyond auto-discovery of proxy pairs and can be used with an unpaired proxy. In this variation, a single proxy 3811 is situated in a path between the client 3801 and the server 3802 such that all traffic along the forward path from client 3801 to server 3802 flows through proxy 3811 and all traffic along the reverse path from server 3802 to client 3801 flows through proxy 3811.

When client 3801 initiates a connection 3820 to server 3802, proxy 3811 intercepts the client packets and terminates the connection within that device even though the packets comprising the connection are addressed to server 3802. In addition, all packets that originate from proxy 3811 as part of connection 3820 are assigned a source address that corresponds to the address of server 3802. Thus, client 3801 appears to itself to be communicating directly with server 3802 even though connection 3820 is terminated at proxy 3811. When proxy 3811 successfully establishes connection 3820, it establishes another connection 3821 with server 3802, whereby it assigns a source address to all packets it originates on connection 3821 with the address of client 3801.

Thus, server 3802 appears to itself to be communicating directly with client 3801 even though connection 3821 is terminated at proxy 3811.

Once the connections have been established, messages can be transmitted between the client and server in either direction through the proxy intermediary, which can perform the arbitrary transformations on the connection data as described herein and elsewhere.

Figure 39:
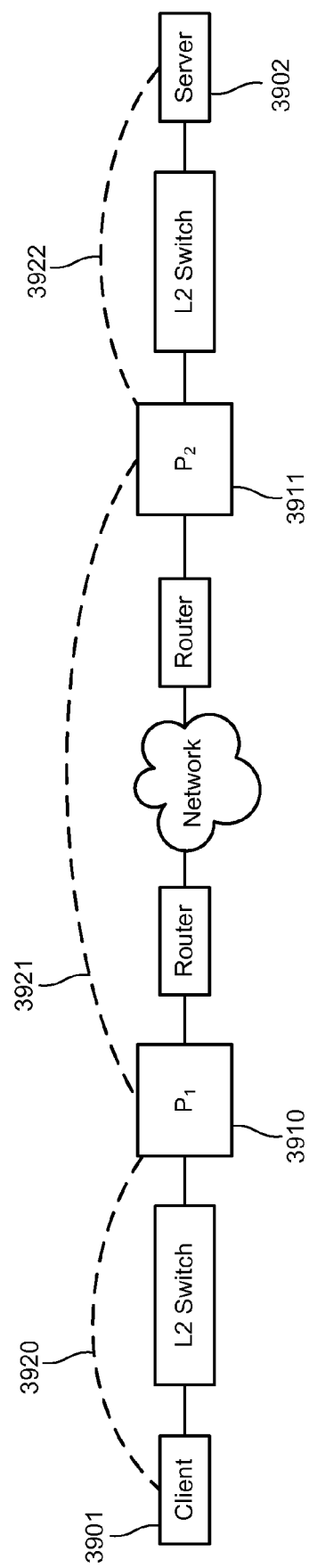
FIG. 39 illustrates another variation, wherein a pair of proxy devices are used as shown in FIG. 38.

FIG. 39 illustrates the variation of FIG. 38 with a pair of proxies instead of a single proxy. In the example shown there, a proxy 3911 and another proxy 3910 are situated in path between the client 3901 and the server 3902 such that all traffic along the forward path from client 3901 to server 3902 flows through proxy 3910 and all traffic along the reverse path from server 3902 toward client 3901 flows through proxy 3911. When client 3901 initiates a connection 3920 to server 3902, proxy 3910 intercepts the client packets and terminates the connection within that device even though the packets comprising said connection are addressed to server 3902. In addition, all packets that originate from proxy 3910 as part of connection 3920 are assigned a source address that corresponds to the address of server 3902. Thus, client 3901 appears to be communicating directly with server 3902 even though connection 3920 is terminated at proxy 3910. Proxy 3910 then opens another connection 3921 to proxy 3911. Alternatively, proxy 3910 could re-use an existing connection between proxy 3910 and proxy 3911 and implement connection multiplexing as described earlier. When proxy 3910 and proxy 3911 successfully establishes connection 3921, proxy 3911 establishes another connection 3922 with server 3902, whereby it assigns a source address to all packets it originates on connection 3922 with the address of client 3901. Thus, server 3902 appears to be communicating directly with client 3901 even though connection 3922 is terminated at proxy 3911.

Once the connections have been established, messages can be transmitted between the client and server in either direction through the proxy intermediaries, which can perform the arbitrary transformations on the connection data as described herein and elsewhere.

The above description is illustrative and not restrictive. Many variations of the invention will become apparent to those of skill in the art upon review of this disclosure. The scope of the invention should, therefore, be determined not with reference to the above description, but instead should be determined with reference to the appended claims along with their full scope of equivalents.

What is claimed is:

1. A system for optimizing communication between a client and a server across a wide area network (WAN), the system comprising:
    a proxy pair configured to intercept communications between the client and the server and relay the client-server communications across the WAN between the proxy pair;
    wherein as part of a bandwidth reduction mechanism, the proxy pair is configured to substitute data patterns in the client-server communications with references for transmission across the WAN;
    wherein as part of an application protocol optimization mechanism, the proxy pair is configured to modify an application protocol of the client-server communications; and
    wherein the proxy pair comprises a first proxy and a second proxy, wherein the first and second proxies are configured to:
        store data patterns in respective first and second data stores; and
        replace references with associated data patterns obtained from their respective data stores.

2. The system of claim 1, wherein the first proxy is configured to send a reference resolution request to the second proxy for an associated data pattern not found in the first data store.

3. The system of claim 1, wherein as part of the application protocol optimization mechanism, the first proxy, in proximity to the client, is configured to:
    observe one or more application protocol messages transmitted by the client to the server for determining a pattern of client activity; and
    based on the observed pattern, synthesize and issue one or more requests to the server.

4. The system of claim 1, wherein as part of the application protocol optimization mechanism:
    the second proxy, in proximity to the server, is configured to:
    observe one or more application protocol messages transmitted by the client to the server for determining a pattern of client activity; and
    based on the observed pattern, synthesize and issue one or more requests to the server.

5. A method for optimizing communication between a client and a server across a wide area network (WAN), the method comprising:
    intercepting communications between the client and the server;
    relaying the client-server communications across the WAN between a proxy pair;
    substituting, by the proxy pair as part of a bandwidth reduction mechanism, data patterns in the client-server communications with references for transmission across the WAN;
    modifying, by the proxy pair as part of an application protocol optimization mechanism, an application protocol of the client-server communications; and
    wherein the proxy pair comprises a first proxy and a second proxy, the method further comprising:
        storing, by the first and second proxies, data patterns in respective first and second data stores; and
        replacing, by the first and second proxies, references with associated data patterns obtained from their respective data stores.

6. The method of claim 5, further comprising:
    sending, by the first proxy, a reference resolution request to the second proxy for an associated data pattern not found in the first data store.

7. The method of claim 5, wherein the first proxy is in proximity to the client, the method further comprising:
    observing, by the first proxy as part of the application protocol optimization mechanism, one or more application protocol messages transmitted by the client to the server for determining a pattern of client activity; and
    synthesizing and issuing, by the first proxy, one or more requests to the server based on the observed pattern.

8. The method of claim 5, wherein the second proxy is in proximity to the server, the method further comprising:
    observing, by the second proxy as part of the application protocol optimization mechanism, one or more application protocol messages transmitted by the client to the server for determining a pattern of client activity; and
    synthesizing and issuing, by the second proxy, one or more requests to the server based on the observed pattern.

* * * * *